(12) United States Patent
Yu et al.

(10) Patent No.: US 9,548,108 B2
(45) Date of Patent: Jan. 17, 2017

(54) VIRTUAL MEMORY DEVICE (VMD) APPLICATION/DRIVER FOR ENHANCED FLASH ENDURANCE

(71) Applicant: Super Talent Technology Corp., San Jose, CA (US)

(72) Inventors: Frank Yu, Palo Alto, CA (US); Abraham C. Ma, Fremont, CA (US); Shimon Chen, Los Gatos, CA (US); Yi Syu Yan, Bade (TW)

(73) Assignee: Super Talent Technology, Corp., San Jose, CA (US)

( * ) Notice: Subject to any disclaimer, the term of this patent is extended or adjusted under 35 U.S.C. 154(b) by 78 days.

(21) Appl. No.: 14/575,943

(22) Filed: Dec. 18, 2014

(65) Prior Publication Data

US 2015/0106557 A1    Apr. 16, 2015

Related U.S. Application Data

(60) Continuation-in-part of application No. 12/475,457, filed on May 29, 2009, now Pat. No. 8,266,367, and
(Continued)

(51) Int. Cl.
*G06F 12/00*    (2006.01)
*G06F 13/00*    (2006.01)
(Continued)

(52) U.S. Cl.
CPC ....... *G11C 11/5678* (2013.01); *G06F 12/0246* (2013.01); *G11C 13/0004* (2013.01);
(Continued)

(58) Field of Classification Search
CPC .................... G06F 12/0246; G06F 2212/7203; G06F 2212/7208; G06F 13/4282; G06F 2212/7211; G06F 3/0604; G06F 3/0608; G06F 3/0631; G06F 3/064; G06F 3/0643; G06F 3/0647; G06F 3/0685; G06F 3/0688
(Continued)

(56) References Cited

U.S. PATENT DOCUMENTS

| 5,519,831 A | * | 5/1996 | Holzhammer | G06F 11/1441 365/228 |
| 5,774,133 A | * | 6/1998 | Neave | G06T 17/00 345/441 |

(Continued)

*Primary Examiner* — Sheng-Jen Tsai
(74) *Attorney, Agent, or Firm* — gPatent LLC; Stuart T. Auvinen

(57) ABSTRACT

A Virtual-Memory Device (VMD) driver and application execute on a host to increase endurance of flash memory attached to a Super Enhanced Endurance Device (SEED) or Solid-State Drive (SSD). Host accesses to flash are intercepted by the VMD driver using upper and lower-level filter drivers and categorized as data types of paging files, temporary files, meta-data, and user data files, using address ranges and file extensions read from meta-data tables. Paging files and temporary files are optionally written to flash. Full-page and partial-page data are grouped into multi-page meta-pages by data type before storage by the SSD. Ramdisks and caches for storing each data type in the host DRAM are managed and flushed to the SSD by the VMD driver. Write dates are stored for pages or blocks for management functions. A spare/swap area in DRAM reduces flash wear. Reference voltages are adjusted when error correction fails.

4 Claims, 56 Drawing Sheets

Related U.S. Application Data a continuation-in-part of application No. 12/347,306, filed on Dec. 31, 2008, now Pat. No. 8,112,574, and a continuation-in-part of application No. 12/141,879, filed on Jun. 18, 2008, now abandoned, and a continuation-in-part of application No. 13/540,569, filed on Jul. 2, 2012, now Pat. No. 8,959,280, and a division of application No. 13/730,797, filed on Dec. 28, 2012, now Pat. No. 8,954,654.

(51) Int. Cl.

| | | |
|---|---|---|
| *G06F 13/28* | (2006.01) | |
| *G11C 11/56* | (2006.01) | |
| *G06F 12/02* | (2006.01) | |
| *G11C 13/00* | (2006.01) | |
| *G11C 16/34* | (2006.01) | |
| *G11C 29/00* | (2006.01) | |

(52) U.S. Cl.
CPC .. *G11C 16/3431* (2013.01); *G06F 2212/7203* (2013.01); *G06F 2212/7208* (2013.01); *G06F 2212/7211* (2013.01); *G11C 29/765* (2013.01)

(58) Field of Classification Search
USPC .......................................................... 711/103
See application file for complete search history.

(56) References Cited

U.S. PATENT DOCUMENTS

| | | | | | |
|---|---|---|---|---|---|
| 6,000,006 | A * | 12/1999 | Bruce | ................. | G06F 11/1068 711/103 |
| 6,121,903 | A * | 9/2000 | Kalkstein | ............ | H03M 7/3086 341/106 |
| 6,141,238 | A * | 10/2000 | Forbes | ................. | G11C 11/005 257/E27.104 |
| 6,411,302 | B1 * | 6/2002 | Chiraz | ................. | G06F 3/1431 345/531 |
| 6,434,685 | B1 * | 8/2002 | Sexton | ................... | G06F 12/10 711/206 |
| 7,185,017 | B1 * | 2/2007 | Cauvin | ............ | G06F 17/30569 |
| 7,190,617 | B1 * | 3/2007 | Harari | ................... | G06F 3/0614 365/185.11 |
| 8,555,022 | B1 * | 10/2013 | Edwards | ............... | G06F 3/0607 711/114 |
| 8,631,181 | B2 * | 1/2014 | Feehrer | ................... | G06F 13/24 710/260 |
| 2002/0184559 | A1 * | 12/2002 | Qin | ..................... | G06F 11/1458 714/13 |
| 2004/0123282 | A1 * | 6/2004 | Rao | ......... | G06F 8/665 717/168 |
| 2005/0066130 | A1 * | 3/2005 | Rudelic | ............... | G06F 12/0646 711/117 |
| 2007/0033341 | A1 * | 2/2007 | Hashimoto | ........... | G06F 12/084 711/113 |
| 2007/0112812 | A1 * | 5/2007 | Harvey | ............... | H04L 61/1517 |
| 2007/0150791 | A1 * | 6/2007 | Gross | ................... | G06F 11/1044 714/763 |
| 2007/0180328 | A1 * | 8/2007 | Cornwell | .............. | G06F 11/073 714/42 |
| 2008/0037332 | A1 * | 2/2008 | Ohta | ................... | G11C 16/0441 365/185.23 |
| 2008/0195801 | A1 * | 8/2008 | Cheon | ................. | G06F 12/0246 711/103 |
| 2008/0243966 | A1 * | 10/2008 | Croisettier | ........ | G06F 17/30315 |
| 2009/0150599 | A1 * | 6/2009 | Bennett | ............... | G06F 11/1441 711/103 |
| 2009/0235181 | A1 * | 9/2009 | Saliba | .................... | G06Q 10/10 715/753 |
| 2009/0248957 | A1 * | 10/2009 | Tzeng | ................. | G06F 13/4239 711/103 |
| 2009/0248958 | A1 * | 10/2009 | Tzeng | ..................... | G06F 12/08 711/103 |
| 2009/0248959 | A1 * | 10/2009 | Tzeng | ..................... | G06F 12/08 711/103 |
| 2009/0249015 | A1 * | 10/2009 | Tzeng | ..................... | G06F 12/0866 711/165 |
| 2011/0299317 | A1 * | 12/2011 | Shaeffer | ............. | G11C 13/0002 365/106 |
| 2012/0063191 | A1 * | 3/2012 | Norman | .................. | G06F 3/061 365/100 |
| 2012/0096233 | A1 * | 4/2012 | Chen | ................... | G06F 12/0292 711/165 |
| 2012/0284587 | A1 * | 11/2012 | Yu | ......................... | G06F 3/0608 714/773 |
| 2013/0145085 | A1 * | 6/2013 | Yu | ....................... | G06F 12/0246 711/103 |
| 2014/0281151 | A1 * | 9/2014 | Yu | ............................. | G06F 1/30 711/103 |
| 2014/0310574 | A1 * | 10/2014 | Yu | ....................... | G06F 11/1072 714/773 |
| 2015/0106557 | A1 * | 4/2015 | Yu | ....................... | G06F 12/0246 711/103 |

\* cited by examiner

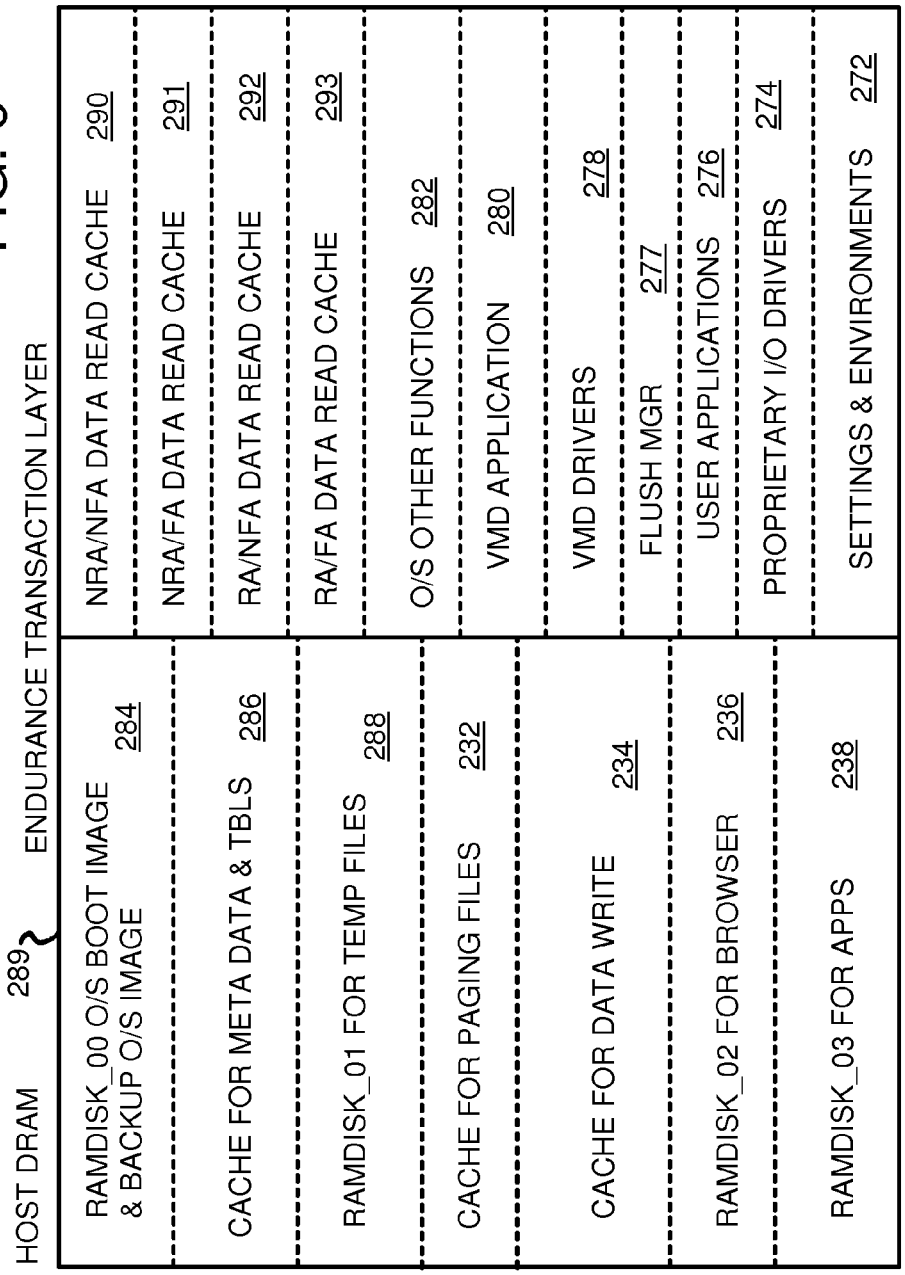

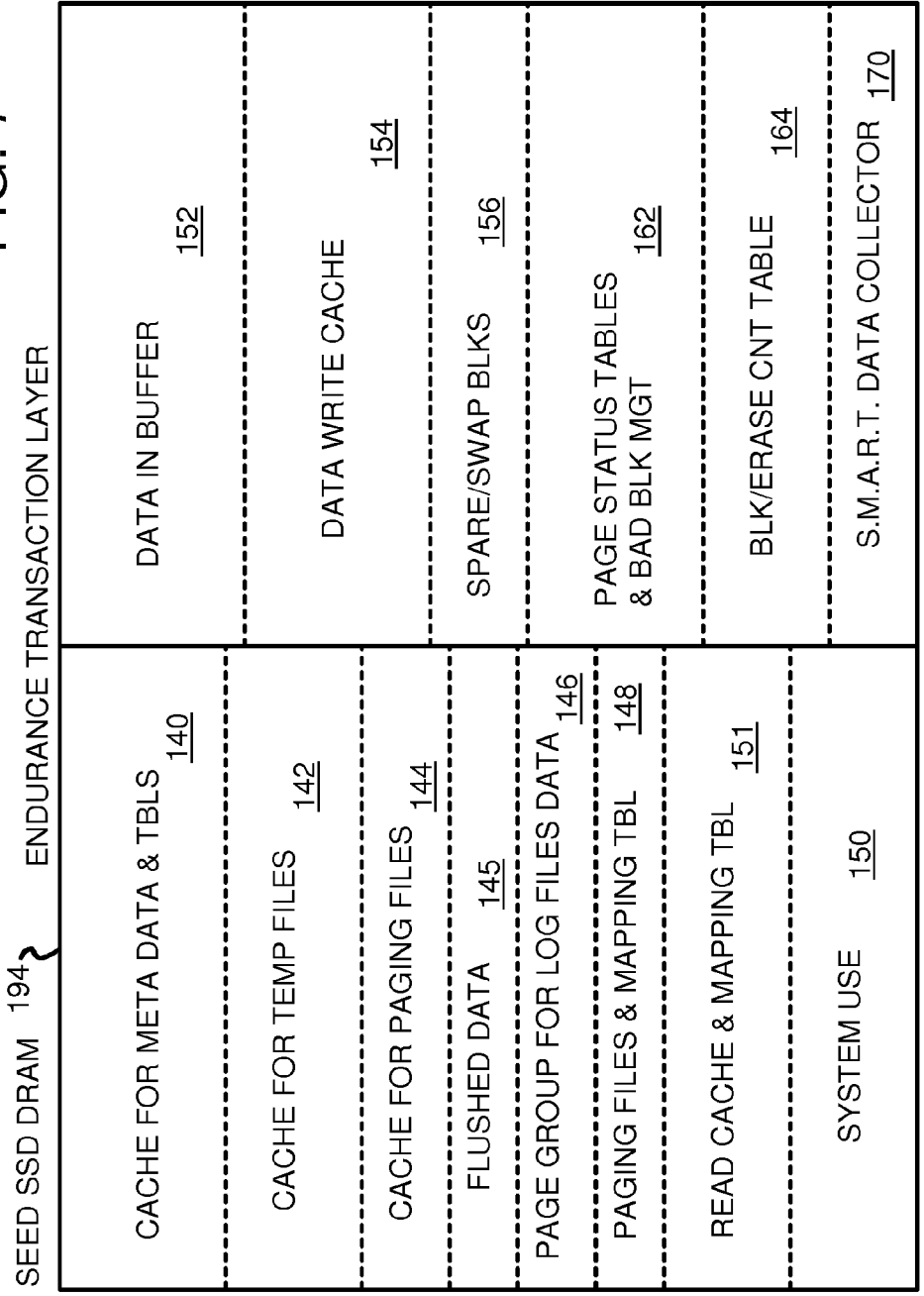

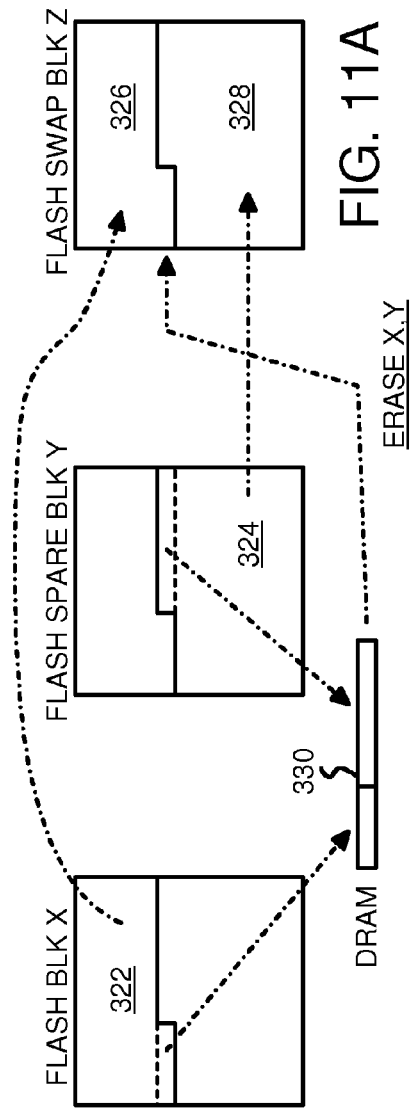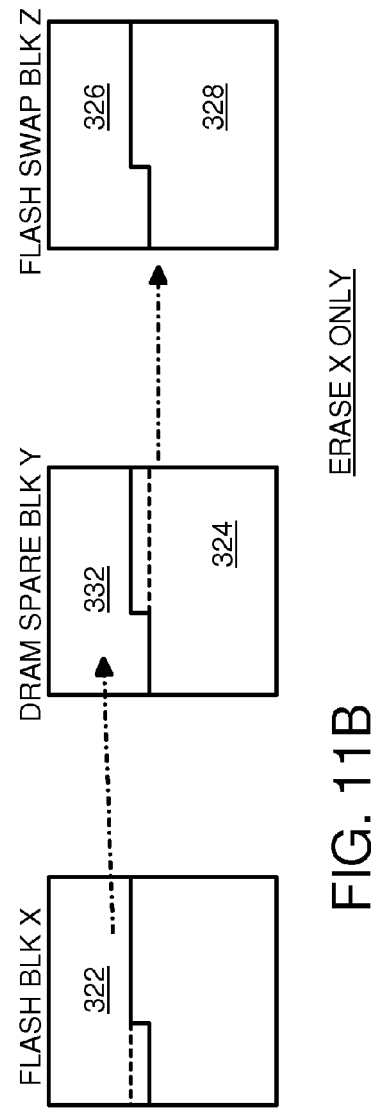

FIG. 13A

BLK WRITE DATE STORED

BLOCK STATUS

000 EMPTY BLK
001 USED BLK
010 BLK WITH GARBAGE
011 WHOLE BLK BAD
100 EMPTY BLK, BAD PAGES
101 USED BLK, BAD PAGES
110 BLK WITH GARBAGE, BAD PAGES
111 FACTORY BAD BLK

PAGE STATUS

000 EMPTY PAGE
001 EMPTY PAGE +PROTECT
010 USED PAGE
011 USED PAGE +PROTECT
100 GARBAGE PAGE
101 GARBAGE PAGE +PROTECT
11X BAD PAGE

| $3^b$ | $13^b$ | $16^b$ |
|---|---|---|
| BLK STATUS | ERASE CNT | WR DATE |

471

BAD BLK/ERASE CNT TABLE

| $3^b$ |
|---|
| PG STATUS |

473

PAGE STATUS TABLE

FIG. 13B

PAGE WRITE DATE STORED

| BLK STATUS | ERASE CNT |
|---|---|
| 3$^b$ | 13$^b$ |

471'

BAD BLK/ERASE CNT TABLE

| PG STATUS | WR DATE |
|---|---|
| 3$^b$ | 16$^b$ |

473'

PAGE STATUS TABLE

BLOCK STATUS

000  EMPTY BLK
001  USED BLK
010  BLK WITH GARBAGE
011  WHOLE BLK BAD
100  EMPTY BLK, BAD PAGES
101  USED BLK, BAD PAGES
110  BLK WITH GARBAGE, BAD PAGES
111  FACTORY BAD BLK

PAGE STATUS

000  EMPTY PAGE
001  EMPTY PAGE +PROTECT
010  USED PAGE
011  USED PAGE +PROTECT
100  GARBAGE PAGE
101  GARBAGE PAGE +PROTECT
11X  BAD PAGE

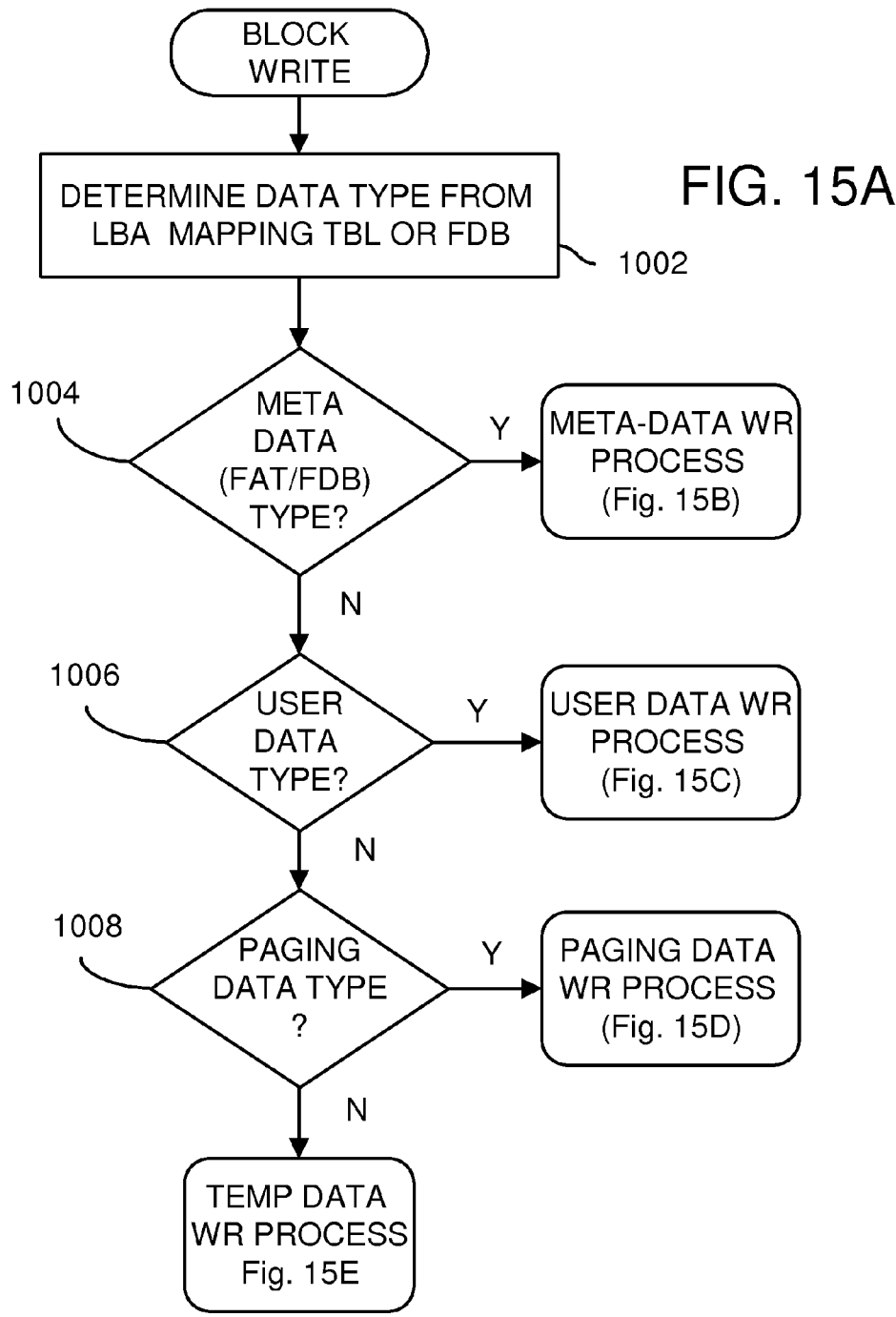

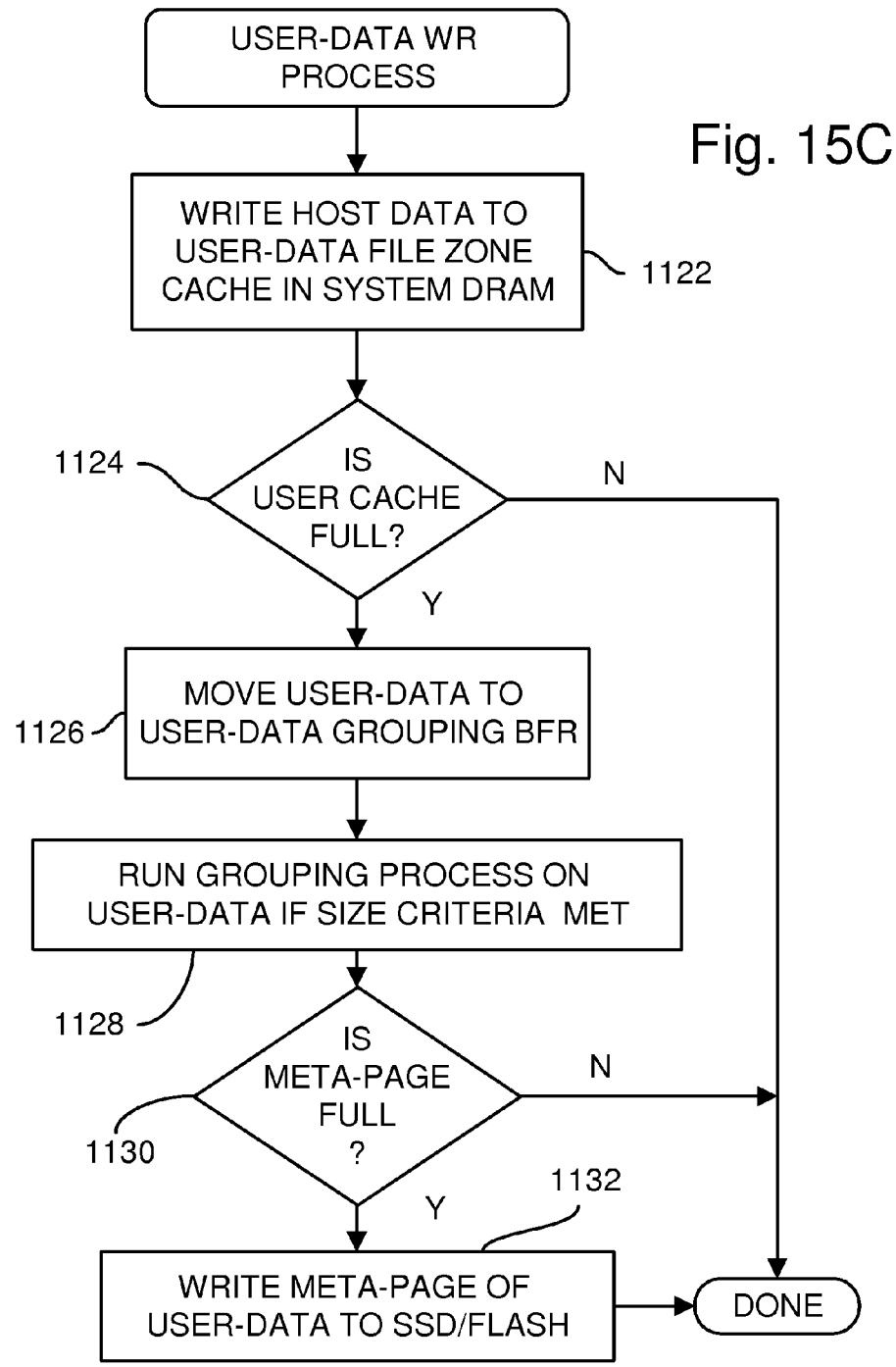

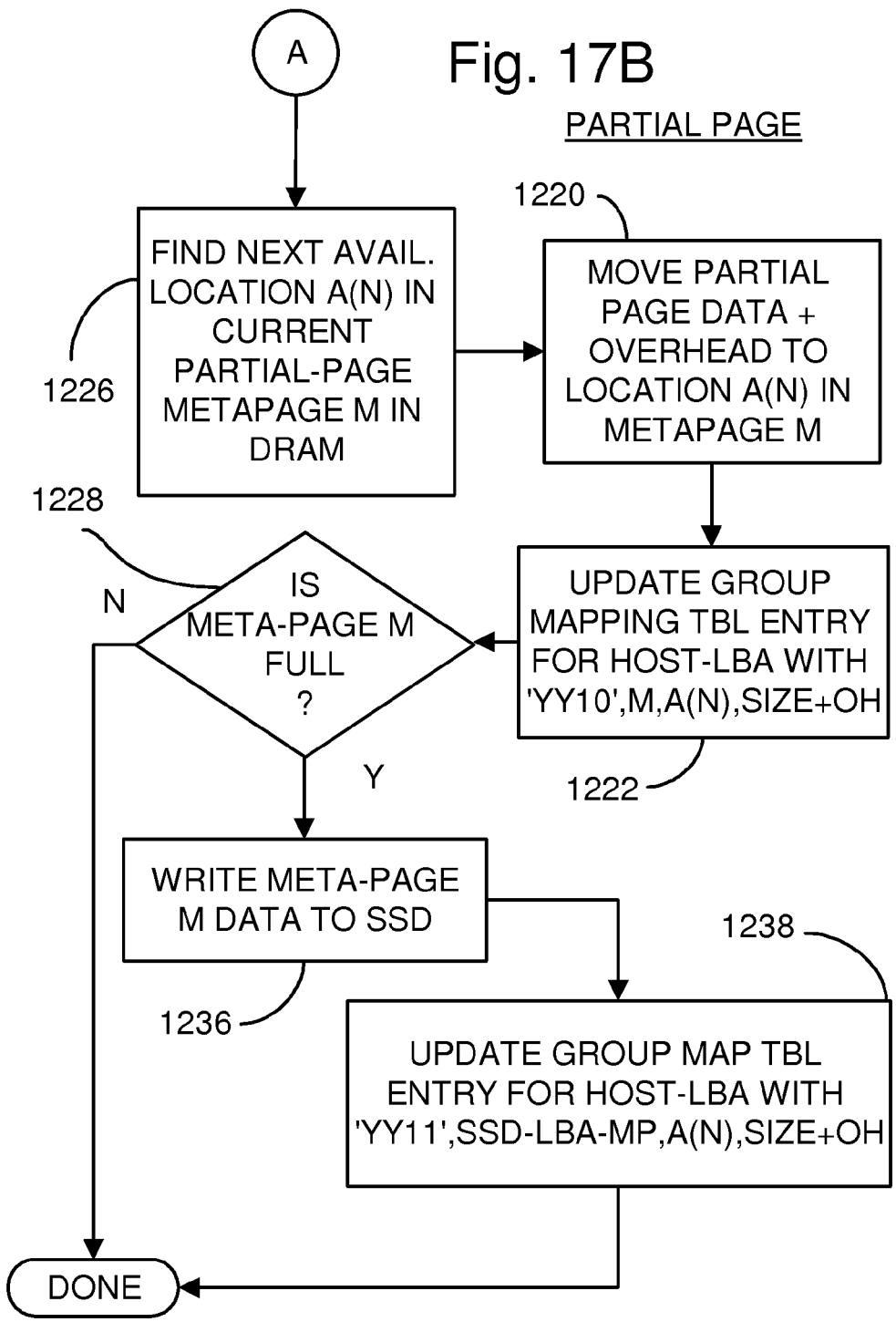

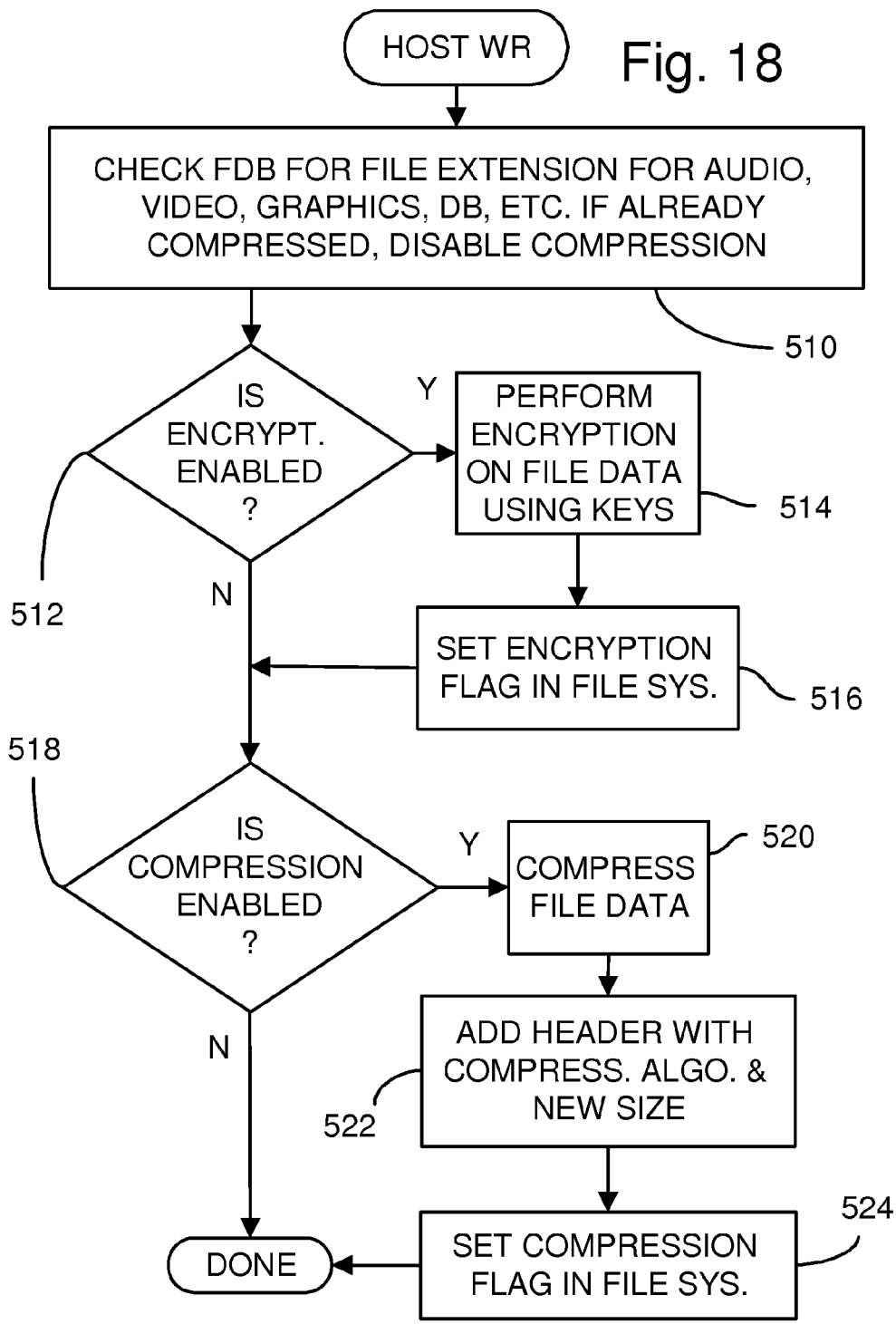

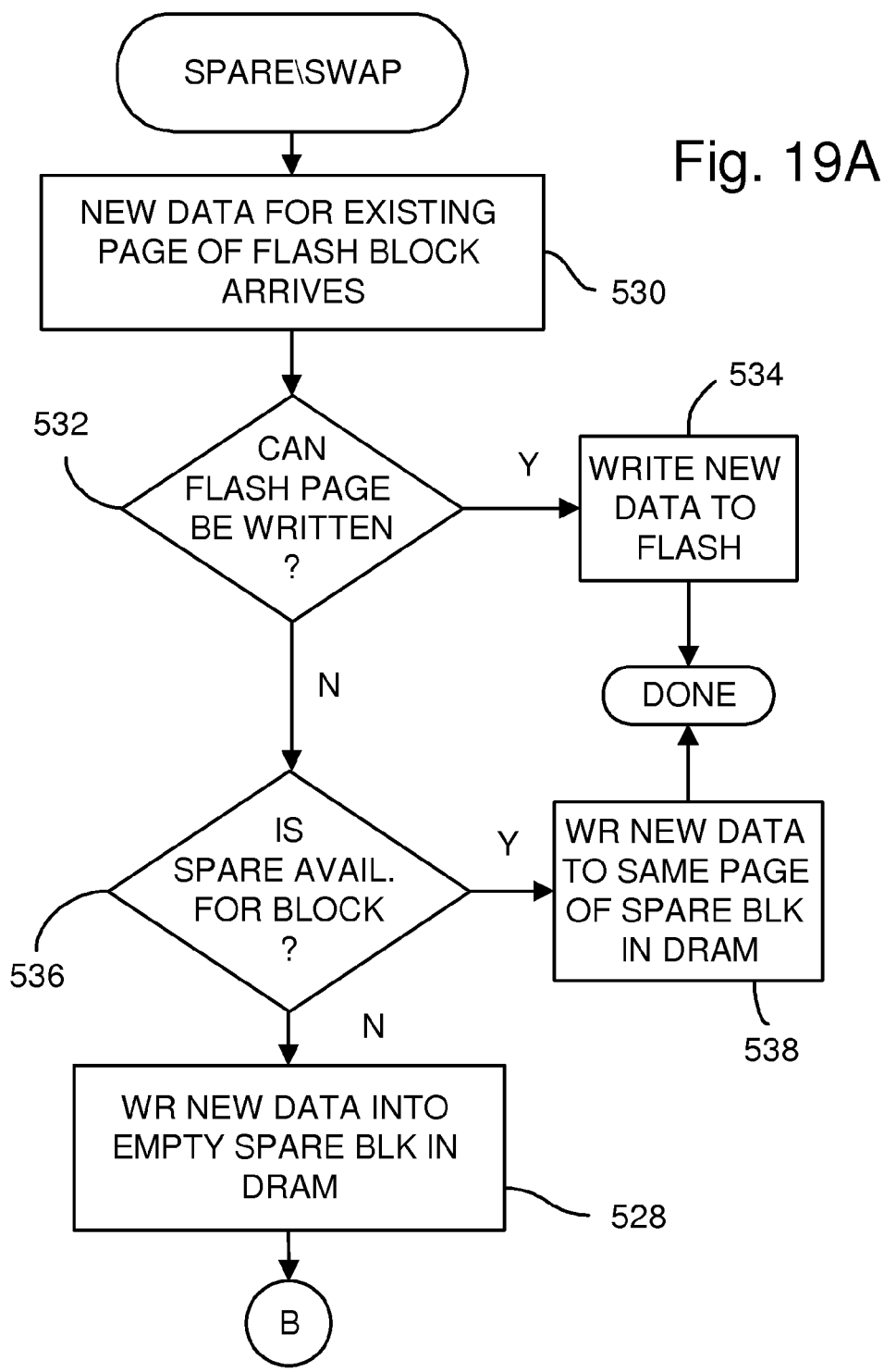

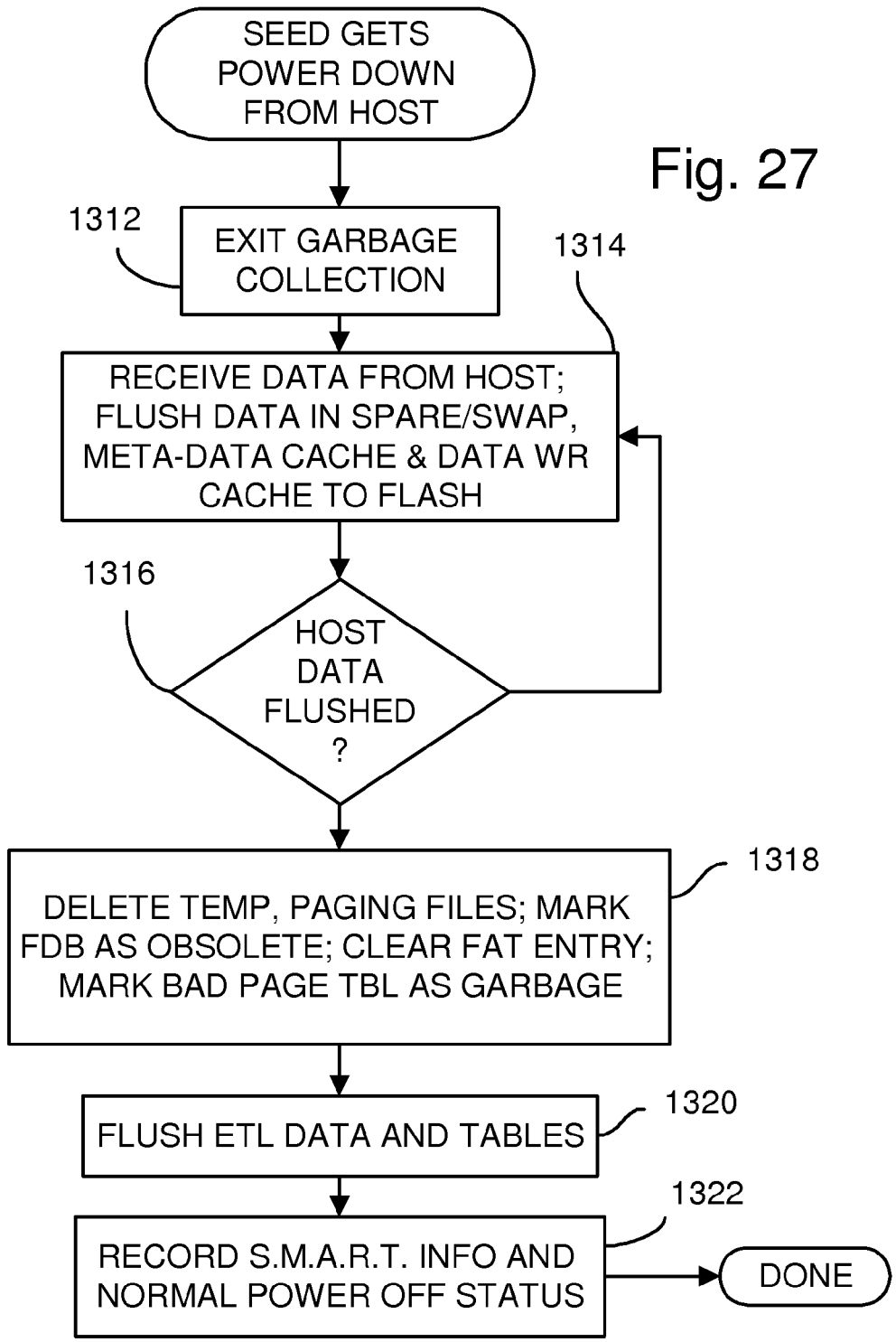

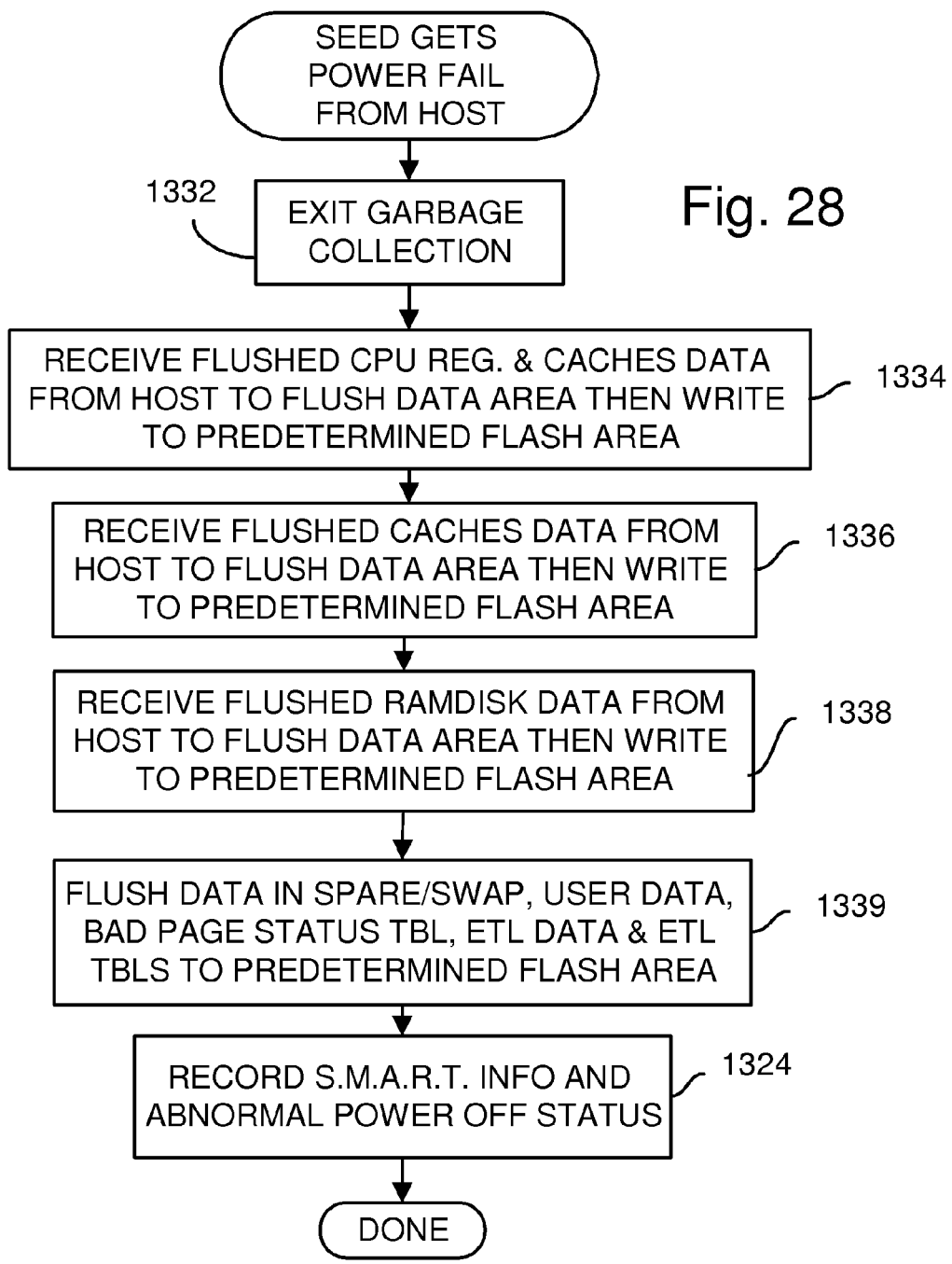

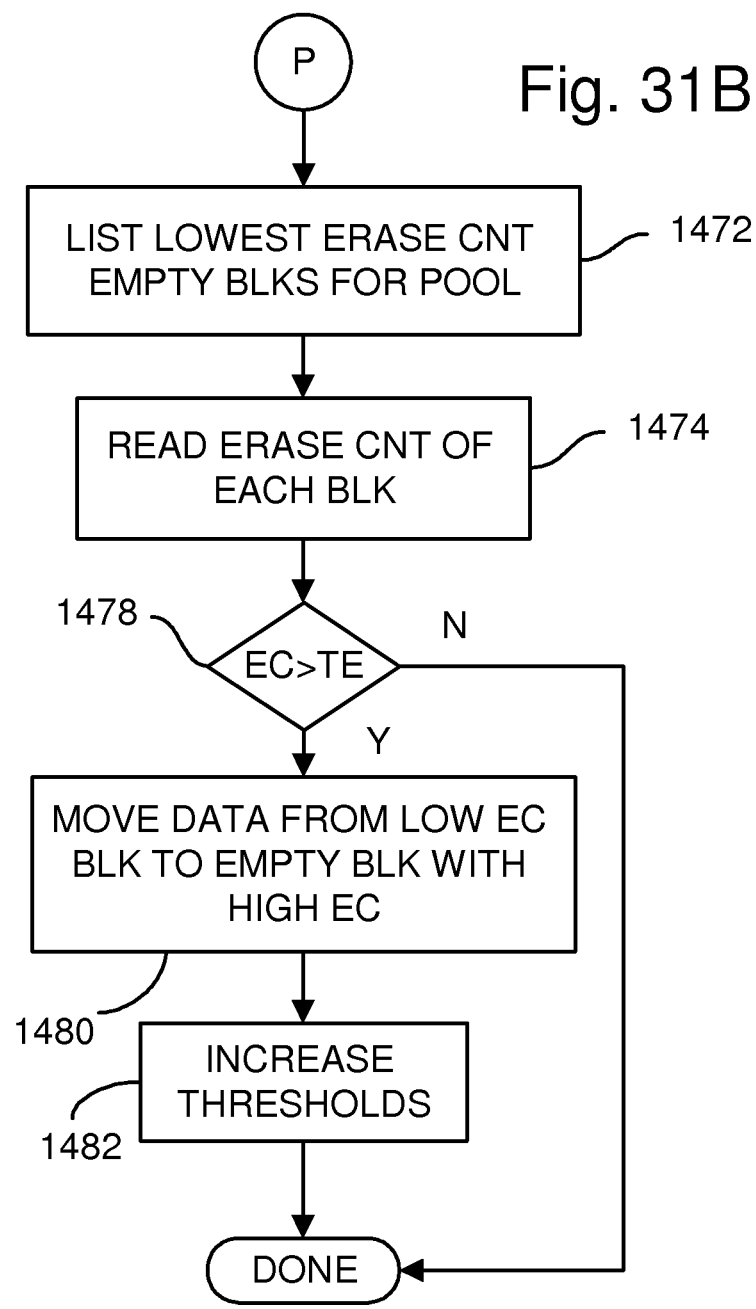

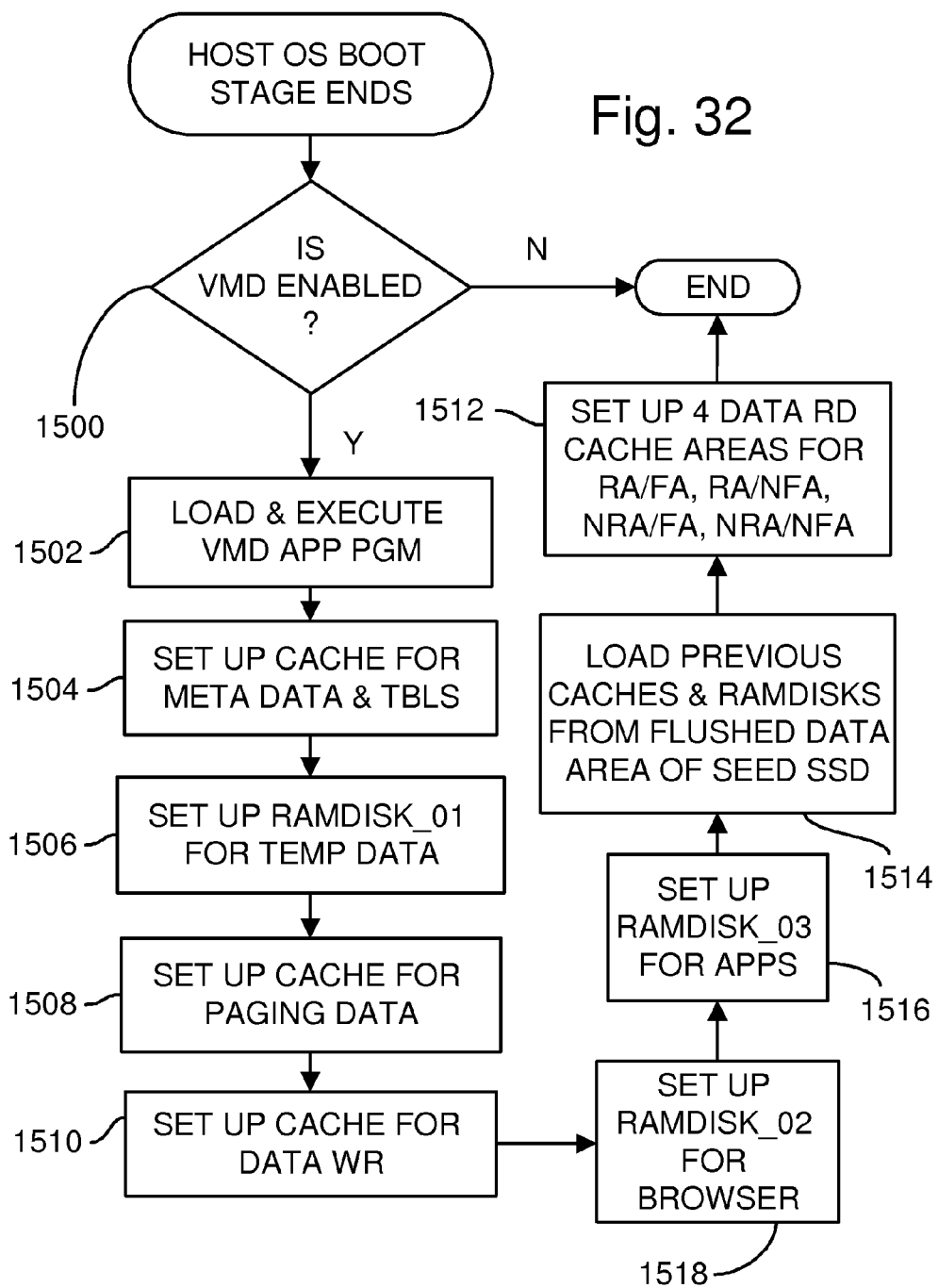

VIRTUAL MEMORY DEVICE (VMD) APPLICATION/DRIVER FOR ENHANCED FLASH ENDURANCE

RELATED APPLICATION

This application is a divisional of U.S. Ser. No. 13/730, 797, filed Dec. 28, 2012, now U.S. Pat. No. 8,954,654.

This application is a continuation-in-part (CIP) of "Super-Endurance Solid-State Drive with Endurance Translation Layer (ETL) and Diversion of Temp Files for Reduced Flash Wear", U.S. Ser. No. 13/540,569, filed on Jul. 2, 2012.

This application is a continuation-in-part (CIP) of "Multi-Level Striping and Truncation Channel-Equalization for Flash-Memory System", U.S. Ser. No. 12/475,457, filed on May 29, 2009.

This application is a continuation-in-part of "Swappable Sets of Partial-Mapping Tables in a Flash-Memory System With A Command Queue for Combining Flash Writes", Ser. No. 12/347,306, filed on Dec. 31, 2008, now U.S. Pat. No. 8,112,574.

This application is a continuation-in-part of "High Performance and Endurance Non-volatile Memory Based Storage Systems", U.S. Ser. No. 12/141,879, filed Jun. 18, 2008.

This application is related to "High Endurance Non-volatile Memory Devices", U.S. Pat. No. 7,953,931, Filed on Feb. 21, 2008.

This application is related to "Cell-Downgrading and Reference-Voltage Adjustment for a Multi-Bit-Cell Flash Memory", U.S. Pat. No. 7,333,364, Filed on Apr. 19, 2007.

FIELD OF THE INVENTION

This invention relates to flash-memory systems, and more particularly to increased-endurance and longevity of flash memory drives.

BACKGROUND OF THE INVENTION

Flash memory is widely used for peripheral storage in computer systems, and for primary storage in portable devices. NAND flash memory, invented by Dr. Fujio Masuoka of Toshiba in 1987, uses electrically-erasable programmable read-only memory (EEPROM) cells that store charge on a floating gate. Cells are typically programmed by an avalanche current, and then erased using quantum-mechanical tunneling through a thin oxide. Unfortunately, some electrons may be trapped in the thin oxide during program or erase. These trapped electrons reduce the charge stored in the cell on subsequent program cycles, assuming a constant programming voltage. Often the programming voltage is raised to compensate for trapped electrons.

As the density and size of flash memory has increased, the cell size has been shrunk. The thickness of oxides including the tunneling oxide has also been reduced. The thinner oxides are more susceptible to trapped charges and sometimes fail more easily. The floating gate of NAND flash is used to trap electrons. The number of electrons in the floating gate can affect the voltage level of the output. The different level of voltage is achieved by controlling the number of electrons trapped in the depletion layer during the write process. The ever smaller floating gate area often limits the maximum number of electrons that can be trapped (now just several hundred electrons). Due to program/read interference the electrons can leak or trap into the floating gate. This electron number change will affect the voltage output level change and change the read result.

The number of program-erase cycles that a flash memory is guaranteed to be able to withstand was around 100,000 cycles, which allowed for a lengthy lifetime under normal read-write conditions. However, the smaller flash cells have experienced a disturbingly higher wear and newer flash memories may be spec'ed at less than 10,000 program-erase cycles for two-level cells and about 600 for Triple-Level Cells (TLC). If current trends continue, future flash memories may only allow for 300 program-erase cycles. Such a low endurance could severely limit the applications that flash memory could be used for, and have severe impacts for Solid-State-Disk (SSD) applications.

One method to increase the density of flash memory is to store more than one bit per memory cell. Different voltage levels of the cell are assigned to different multi-bit values, such as four voltage ranges for a two-bit cell. However, the noise margins are reduced for the multi-level-cell (MLC) and TLC flash technologies and endurance problems are exacerbated.

It is likely that the underlying flash technology will have lower endurance in the future. Flash drives may compensate for the lower wear tolerance of the underlying flash memories by a variety of techniques. For example, a DRAM buffer on the flash drive may act as a write back cache, reducing the number of writes to the underlying flash memories when the host performs writes to the same data location.

What is desired is a host software drivers and controllers for a flash drive that compensate for lower wear tolerances of the underlying flash memory devices. A Virtual-Memory Device (VMD) application and driver for a host connected to a standard Solid-State Drive (SSD) or a Super-Endurance flash drive is desired that uses a barrage of advanced management techniques that together reduce the number of writes to flash, hence reducing program-erase cycles on the underlying flash memory. A VMD application and driver on the host that operates a super-endurance flash drive constructed from low-endurance flash memory is desired.

BRIEF DESCRIPTION OF THE DRAWINGS

FIG. 6 shows a memory map of an Endurance Transaction Layer (ETL) in the host DRAM.

FIG. 7 shows a memory map of an Endurance Transaction Layer (ETL) in the SEED SSD DRAM.

FIGS. 11A-B show spare and swap operations.

FIGS. 13A-B show bad block/erase count tables and page status tables.

FIGS. 15A-E show the VMD driver on the host processing a host write command.

FIGS. 17A-B show a grouping process into meta-pages.

FIG. 18 shows encryption and compression processing by the VMD driver.

FIGS. 19A-B show spare/swap processing in the SEED.

FIG. 27 is a flowchart of power down processing on the SEED.

FIG. 28 is a flowchart of power failure processing on the SEED.

FIGS. 31A-B show a background garbage collection process.

FIG. 32 is a flowchart of host VMD initialization.

DETAILED DESCRIPTION

Figure 1:
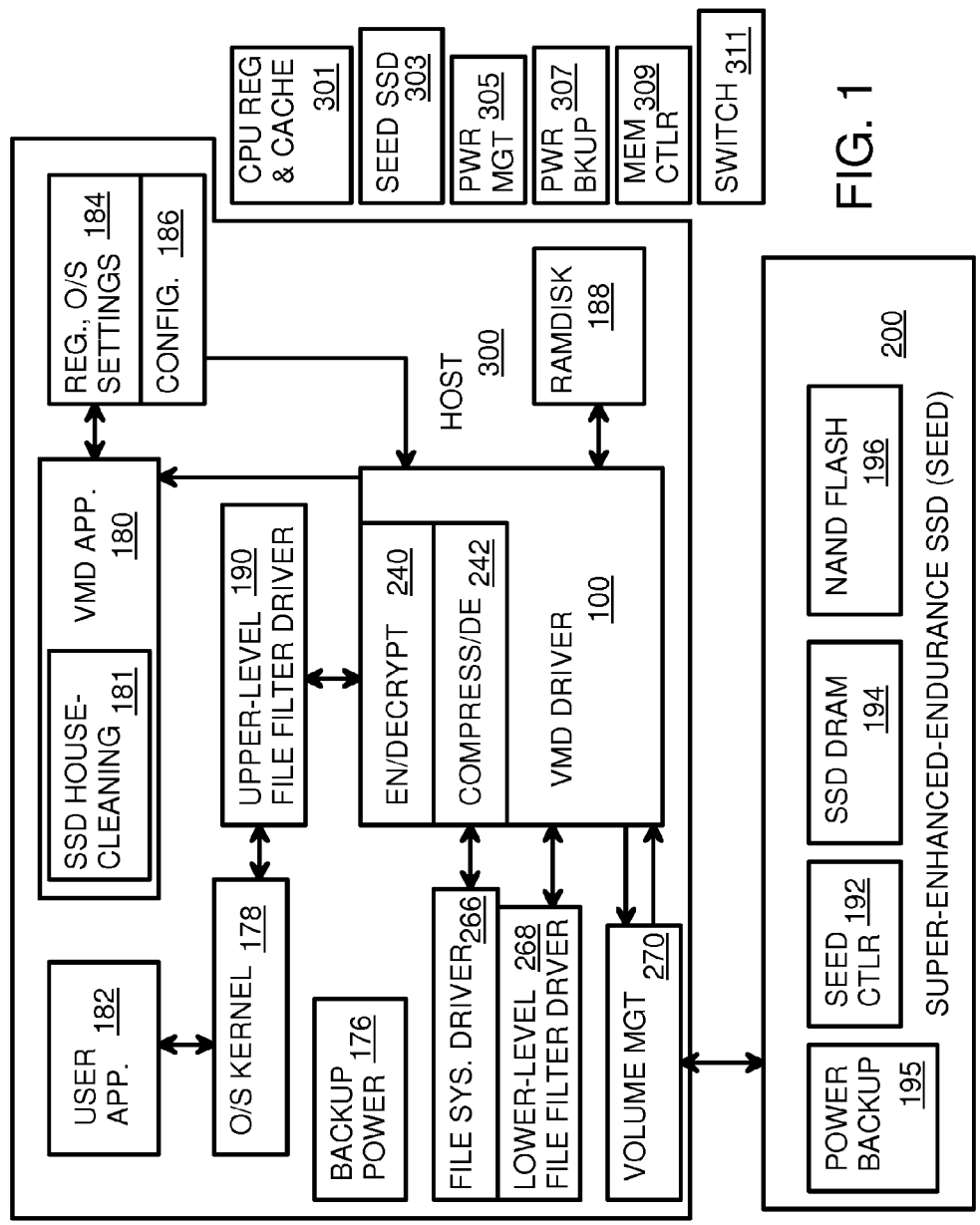
FIG. 1 is a block diagram of a Virtual-Memory Device (VMD) application and driver on the host that creates and manages multiple caches and ramdisks on both the host and on a super-endurance flash drive that has low-endurance flash memory.

The present invention relates to an improvement in high-endurance flash-memory drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The wear on underlying flash devices may be reduced by blocking unnecessary writes to the flash memory. A Virtual-Memory Device (VMD) application and driver executing on a host may block or combine writes before they reach the flash memory, thus reducing the write frequency to the flash memory. The VMD diverts host writes to caches and ramdisks in the host's DRAM and/or in the SSD DRAM.

DRAM buffers in the host or on the flash drive SSD device can store data that does not need to be stored permanently and thus does not need to be written to flash. The DRAM is not only faster, but also has a much higher endurance since it can be over-written more than one million times. DRAM is a reliable technology, being invented in 1966 by Dr. Robert Dennard at IBM.

A typical host creates many temporary files, such as during Internet browsing, or when running certain bloated application programs, that are not critical. The inventors realize that these files do not need to be written to flash memory, reducing flash wear.

A typical system also frequently over-writes certain kinds of data. Such frequently-over-written data is best stored in a DRAM buffer, either on the host or in the flash drive and copied to the flash memory according to a policy (such as based on time elapsed, capacity allocated, etc.) or upon power down or power failure. Storing such frequently-over-written data to flash only on power down can also significantly reduce the wear of the flash devices. Most of the meta data are small in size and grouped together such as in FAT tables. Every update involves a write to only very small portion of the flash page. Storing the meta-data in the DRAM can over time reduce unnecessary writes to flash.

Such frequently-over-written data may include log files that are frequently updated with new events. The latest copy is examined, usually after a system crash. The File Allocation Table (FAT) is another frequently-over-written location, since it is updated when files are created or expanded. The FAT table is a relatively small portion of memory, but its frequent access can significantly increase wear if every update of the FAT is copied to flash. The File Descriptor Block (FDB) is a similar structure that is frequently over-written, such as over-writing the "Date Accessed" when simply accessing and displaying a file list in windows explorer. FDB/FAT holds the meta data for the file system from the host. The various tables used together with the DRAM buffer have meta data created to store the file system to the DRAM and Flash.

Bad-block tables, erase counters, garbage collection, spare and swap blocks, mapping tables, and other files created by the flash drive need to be stored to flash according to a policy or on power down/failure. The flash system meta files may also be stored in the DRAM buffer and copied to flash according to a policy or on power down/failure to reduce flash wear. The above-mentioned tables and meta files are stored in flash memory at power up. They are loaded into a DRAM buffer at device initialization. Subsequent host data read/writes change the data contents. When power down/failure occurs, dirty tables and meta files need to be written or backed up to flash. Host data in the write cache, FIFO buffers, data-in buffer, endurance spare and swap blocks, and other buffers in the flash drive may also be copied to flash on a power failure to allow for system recovery if an exact recovery point is needed for a particular application.

Paging files that the system uses for memory management, when images of the host's main DRAM memory are traditionally moved to a hard disk, or to a flash drive. Page swapping files are not critical if lost on a power failure, since the system would need to be rebooted anyway, and the memory management and paging systems would be re-initialized, wiping out any stored paging files. These paging files may also be stored in the DRAM buffer, and do not have to be copied to flash on a power down/failure, thus reducing flash wear.

Host requests to a flash drive tend to follow regular sequences of data types. For example, a host may first access the FAT, then the FDB, then read or write a data file. This recurring sequence may assist a super-endurance flash drive to categorize data types. The FAT is always in a pre-determined memory location that depends on the type of OS (Windows, Linux, Apple OS, Android, etc.). Thus an access to this range of address is a FAT type of access. The access after a FAT access is to the FDB. Then the next access is user data. Thus user data can be identified as following the FAT and FDB access. The FDB can be examined by the super-endurance flash drive to find the file extension so that .tmp files can be detected and handled differently than user data files.

Each type of file contributes to flash wear in a typical flash drive that does not distinguish among data types. Such agnostic systems treat all data equally. Everything is written to flash, at least when its entry in the DRAM buffer, if any, is cast out by another piece of data from the host that has the same cache index into the DRAM buffer. Significant reductions of flash writes can be achieved by identifying the data type and its purpose to the host, and then only writing actual user data to the flash during normal operation, and writing only critical data to flash, and then according to a policy on a power failure.

Further reductions in flash wear can be achieved by packing data. For example, data that is less than a whole page in flash (partial-page data) may be stored with other partial-page data in a single page in flash, rather than in many separate pages. A multi-channel system may have larger units such as meta-pages that have one page per channel, or the number of channels times the page size. Flash wear may be further reduced by packing into meta-pages rather than the smaller pages.

In a hostile environment, the DRAM buffer may have software errors. An extra over provisioning DRAM can be used for ECC parity for increased reliability.

While the flash-wear savings from each technique may provide various improvements, these techniques when used together may significantly increase flash endurance. A VMD application and driver may provide higher endurance for the flash drive using these techniques.

FIG. 1 is a block diagram of a Virtual-Memory Device (VMD) application and driver on the host that creates and manages multiple caches and ramdisks on both the host and on a super-endurance flash drive that has low-endurance flash memory. Host 300 has a processor that executes instructions for programs such as user apps 182 and for an operating system (OS) kernel 178 such as Windows, Linux, Apple OS, or Android, etc. Backup power 176 provides power to host 300 when the main power source fails, enabling host 300 to send critical data from ramdisk 188 to Super Enhanced Endurance Device (SEED) 200 for storage in NAND flash memory 196 when power fails. Backup power 176 can use a battery, or an uninterruptible Power Supply (UPS), etc. This gives the host processor time to turn off applications and to properly shut down the attached devices. SEED 200 has its own power backup 195, allowing SEED 200 to write critical data to NAND flash memory 196 when the main power fails. Power backup 195 can utilize capacitors, super-capacitors, or a battery. Alternatively, if backup power 176 has enough power to gracefully turn off the system, power backup 195 in SEED 200 is not needed, such as when host 300 is notebook or Smart Phone.

VMD application 180 is an application executing on host 300. VMD application 180 and VMD driver 100 can be used to ease the loads of SEED 200. VMD application 180 and VMD driver 100 can separate and/or store data such as temporary files, paging files etc., that are not meant to be permanently stored to flash. VMD driver 100 can manage ramdisk 188 to store such temporary data. Ramdisk 188 may be part of the host's DRAM.

VMD driver 100 may use the host CPU to perform tasks such as compression/decompression engine 242, and encryption/decryption engine 240. Data from user apps 182 that is written by OS kernel 178 is intercepted by upper-level file filter driver 190 and passed to VMD driver 100 for compression and/or encryption before being sent to file system driver 266. Then low-level file filter driver 268 again intercepts the data for more processing by VMD driver 100, such as for storage in ramdisk 188.

Data that is finally ready to be written to SEED 200 is sent from VMD driver 100 to volume manager 270, which manages storage volumes such as SEED 200. SEED controller 192 in SEED 200 may store the data in SSD DRAM buffer 194 and then to NAND flash memory 196 on power down or when SSD DRAM buffer 194 is full.

SSD housecleaning 181 in VMD application 180 performs various high-level functions such as garbage collection, removing old unused files. SSD housecleaning 181 may be performed periodically, such as daily, weekly, or when VMD driver 100 manages ramdisk 188. Configuration settings 186 and registry and OS settings 184 may be set by OS kernel 178 or by other programs to define the size of ramdisk 188 or other system variables, and to manage preferred functions of VMD application 180 and VMD driver 100.

Configuration settings 186 and registry and OS settings 184 may have various settings that may improve flash endurance and performance. For example, settings may enable or disable write caching, drive indexing, search indexing, defragmentation, host hibernation, prefetching, superfetching, and windows write cache buffer flushing. Prefetching, indexing, hibernation, and defragmentation may cause additional writes to flash and thus reduce endurance. Write caching and write cache buffer flushing is disabled since the VMD Driver has its own write caching and flushing functions. Thus flash endurance may be improved by disabling these features.

Some optional components shown in FIG. 1 are useful for abnormal power down situations. Power management 305 and power backup 307 (if backup power 176 does not exist in some system environments) store energy when power is on and provide power to host 300 when power fails. CPU registers and cache controller 301 writes the CPU registers and caches to host DRAM and then to SEED 200 when power fails. In another embodiment SEED SSD 303 is another SSD that connects to host 300, such as through a PCIe port, USB port, NVMe port, etc. In yet another embodiment SEED SSD 303 can be located in a DRAM module and controlled by memory controller 309. CPU registers and cache controller 301 writes the CPU registers and caches to host DRAM and then to SEED SSD 200 or SEED SSD 303 when power fails in this alternative. Switch 311, when preset, isolates unnecessary components on host 300 so that they do not receive backup power, thus extending the period of backup power for critical components. Memory controller 309 may be present to transfer data between the host DRAM and SEED SSD 303 during abnormal power off and power restore.

Figure 2:
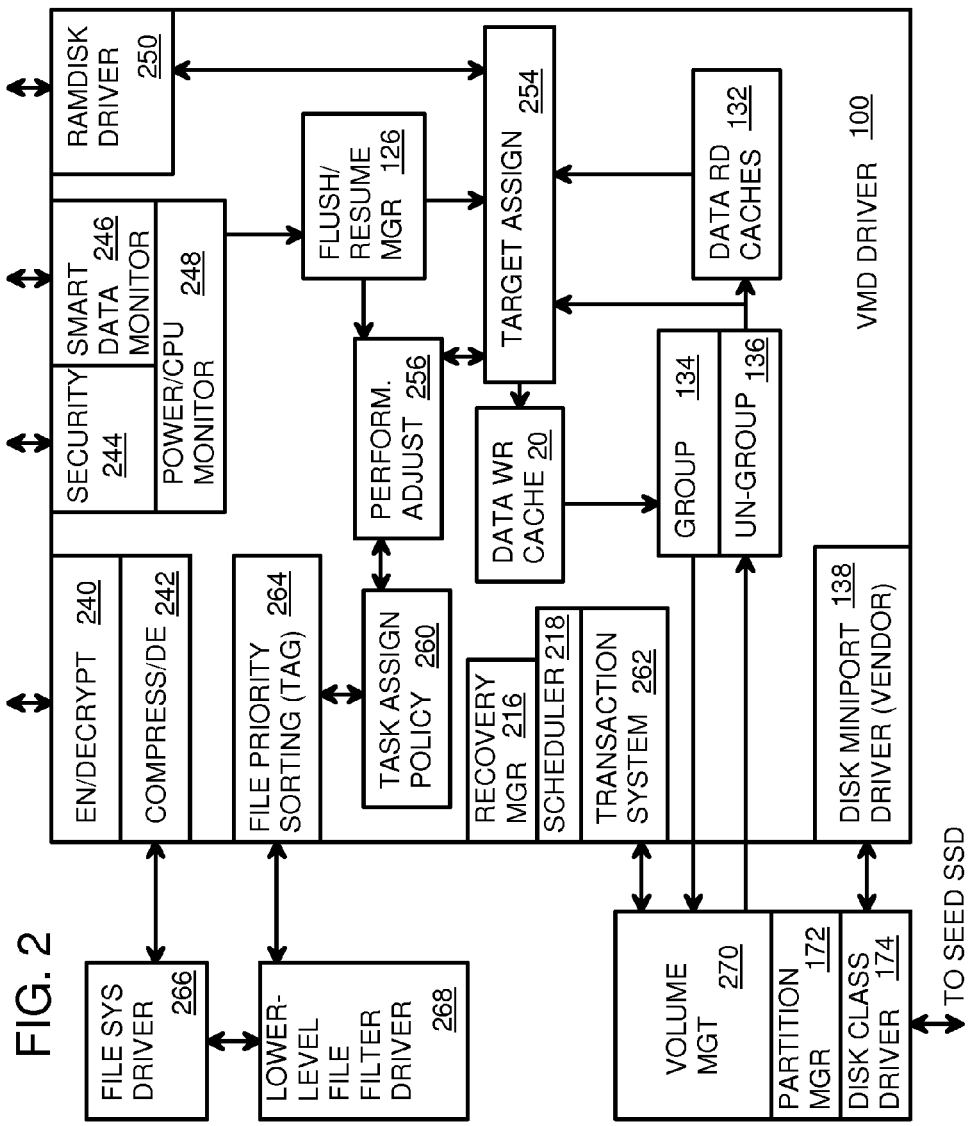
FIG. 2 is a more detailed diagram highlighting the VMD driver on the host.

FIG. 2 is a more detailed diagram highlighting the VMD driver on the host. Host data written by the OS kernel and intercepted by upper-level file filter driver 190 is passed to VMD driver 100 for compression by compression engine 242 and/or encryption by encryption engine 240 before being sent to file system driver 266. Then low-level file filter driver 268 again intercepts the data for more processing by VMD driver 100.

File priority sorting 264 sorts the data based on the data type assigned by low-level file filter driver 268, or indicated by the LBA, such as for meta-data (FAT, FDB), temp files, paging files, or user data. Temp files include windows temporary files, internet browser temporary files, etc. Alternately, this function can be optionally disabled for certain uses such as a server. Operations are given a priority by task priority assignor 260 so that higher priority tasks may be performed ahead of lower-priority tasks. Performance adjustor 256 may periodically adjust these priorities to improve performance. Target assignor 254 then sends the data to ramdisk driver 250 for storage in ramdisk 188, or to data write cache 20, depending on the data type.

Data that is written to SSD may be grouped by grouper 134 before being sent to volume manager 270 and on to SEED 200. Partition manager 172 and disk class driver 174 may route the data to a selected partition or disk. Disk miniport driver 138 manages vendor-specific functions of the attached SSD's. Ungrouper 136 ungroups data that was retrieved from SEED 200 before being transferred to data read caches 132.

Transaction system 262 ensures that data is written completely to SEED 200. Recovery manager 216 determines which write transactions were not completed due to abnormal power off, and helps applications to do the necessary redo or undo to make the data persistent. Scheduler 218 manages transaction system 262 to manage and record write to SSD transactions such as start, abort, and commit.

When power monitor 248 detects a power down or failure, it activates ramdisk flush/resume manager 126 to transfer data from data write cache 20, and ramdisk 188 to SEED 200 for storage in flash memory. When the flush is done, flush/resume manager 126 will issue a vendor command to SEED 200 and backup power supply 176 or power management 305. The backup power supply if present, will turn off power to the system and only provide power to SEED 200. In case power management 305 is used, it will continue to provide power to the DRAM, SEED SSD 303, switch 311, and memory controller 309. Flush/resume manager 126 may periodically flush the contents of data write cache 20, and ramdisk 188 to SEED 200 before power is lost. Security 244 may perform a password verification process before allowing access to SEED 200 or data cached by VMD driver 100. Smart data monitor 246 sends S.M.A.R.T. monitoring information from SEED 200 to VMD application 180. An endurance flash file system has an upper-level file filter driver that executes on a host and intercepts high-level host writes to a flash drive. An encryption/decryption engine receives high-level host writes intercepted by the upper-level file filter driver and generates encrypted data and decrypts encrypted data. A compression/decompression engine also receives high-level host writes from the upper-level file filter driver and generates compressed data and decompresses compressed data. The compressed data and encrypted data are sent to a File System Driver (FSD) executing on the host.

A lower-level file filter driver also executes on the host and intercepts lower-level file system host writes to a flash drive system. A data write cache stores host write data while a data read cache stores data for reading by the host. A grouping engine groups data stored in the data write cache into meta-pages. An un-grouping engine un-groups data in stored in meta-pages into ungrouped data for storage in the data read cache. Meta-pages are sent from the grouping engine to a volume manager for transfer to a flash memory. Also, meta-pages stored in the flash memory are received by the un-grouping engine.

A file priority tag sorter generates a data type for host writes received. A task policy assignor assigns a priority to tasks including writes of host write data by the data type. Priority is a function of the data type from the file priority tag sorter. A performance adjustor adjusts the priority of tasks. A target assignor sorts host write data based on the data type generated by the file priority tag sorter.

A transaction system logs events indicating start and completion of data writes to the flash memory. A flush manager flushes data stored in a host DRAM to a SSD DRAM and then to a flash memory of a flash drive system when power is lost. A resume manager reloader fetches flushed data from the flash memory of the flash drive system and then to the host DRAM when power is restored. A disk miniport driver manages vendor-specific functions of the flash drive system. Smart data monitor 246, power/cpu monitor 248, security 244, and ramdisk driver 250 are optional.

Figure 3:
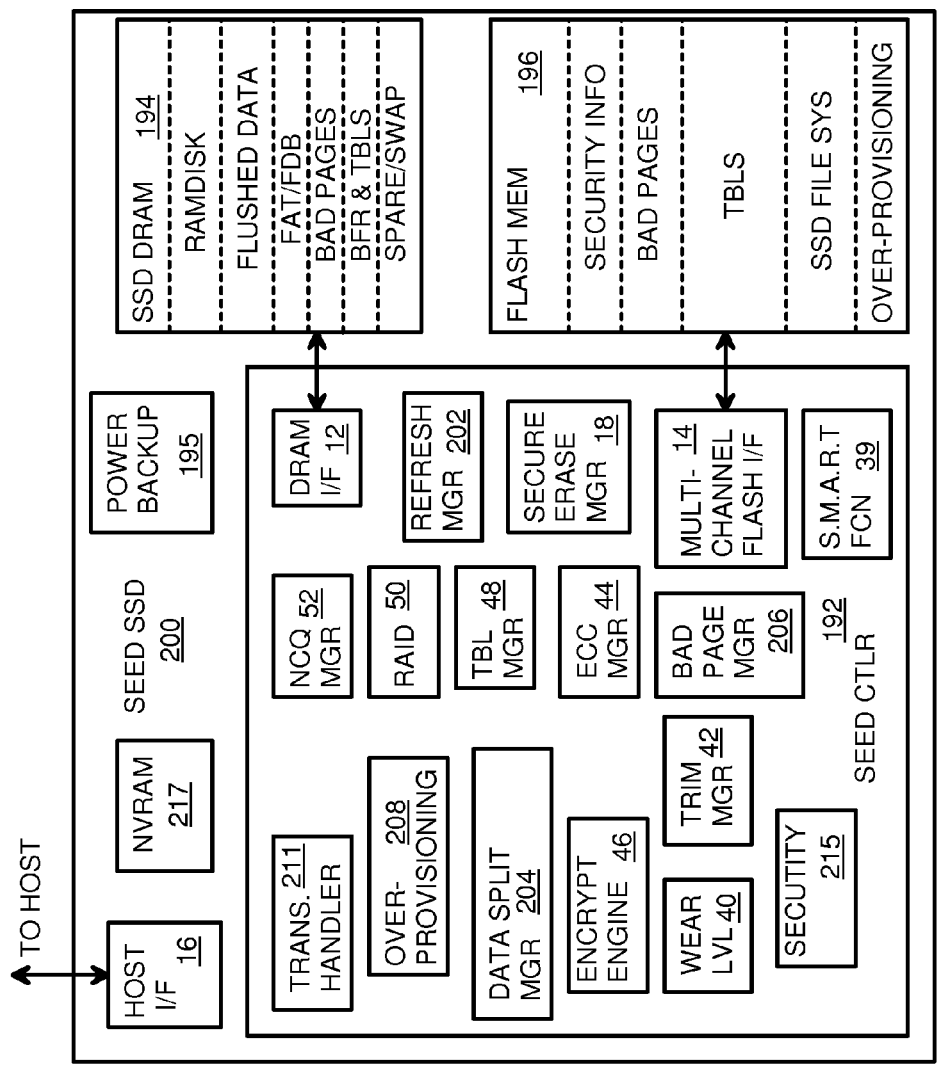
FIG. 3 is a block diagram of a Super Enhanced Endurance Device (SEED).

FIG. 3 is a block diagram of a Super Enhanced Endurance Device (SEED). SEED 200 has host interface 16, which communicates with host 300 (FIG. 1) using a bus such as a PCIe, SATA, or Universal-Serial-Bus (USB), NVMe, Thunderbolt, eMMC, iSSD, etc. Host data from host interface 16 is sent to SEED controller 192. SEED controller 192 performs a variety of functions to reduce the wear of NAND flash memory 196, such as by storing flushed files from VMD driver 100 in host 300 in SSD DRAM buffer 194 and not in NAND flash memory 196.

SSD DRAM buffer 194 may store backups of host ramdisk 188, and other data or tables flushed from VMD 100. It may also store other data including meta-data, spare and swap blocks, tables for bad page management, and other buffers and tables.

NAND flash memory 196 may store security information, tables, the file system for the SSD, and various other tables and buffers, in addition to user data and flushed ramdisk 188. Some areas of NAND flash memory 196 may be reserved for bad blocks or for over-provisioning.

DRAM interface 12 reads and writes data in SSD DRAM buffer 194 while multi-channel flash interface 14 reads pages, programs data pages, and erases blocks in NAND flash memory 196, which may be organized into several channels. Native Command Queue (NCQ) manager 52 may re-order host commands from host 300 and manage a queue of host commands received through host interface 16. The manager loads host commands into a command queue where writes are re-ordered and combined to reduce flash writes.

RAID controller 50 writes new data across several channels of NAND flash memory 196 and may replicate data to provide redundancy and data recovery. ECC manager 44 generates error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Instead of performing EC, ECC manager 44 can be used for LDPC. Bad page manager 206 keeps track of all locations of page status in NAND flash memory 196. This can extend the lifetime of individual blocks, since only one page may be bad in the block, and other pages may continue to be used. More complex bad-block management may reduce the overall wear of the flash drive.

Wear-leveler 40 may provide two methods of wear leveling methods. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in NAND flash memory 196. Updates are made to the logical-to-physical mapping in mapping tables that are managed by table manager 48. Table manager 48 also tracks the type of data that is stored in each logical block or page so that temp files, paging files, FAT, FDB, and user data files are tracked once identified and categorized by data split manager 204. Alternatively, the host can pass the data type information through vendor commands to the SEED SSD so data split manager 204 doesn't duplicate the work done by VMD driver 100. Alternately, this function can be optionally disabled for certain situations.

Encryption engine 46 performs encryption of write data and decrypts read data if the function is not done by VMD driver 100. TRIM manager 42 processes a TRIM command from the file system or OS on host 300. The TRIM command indicates that a sector is no longer needed by the host and can be wiped or erased. The trimmed page is marked in the page status table as a garbage page as '100b' or '101b'. When doing background garbage collection, if that block is identified as an erase candidate, this page is not be copied to a new block. At that time the TRIM command is completed. TRIM manager 42 performs overhead such as keeping track of which sectors and pages in a block are no longer needed. A garbage collector may also be used to track blocks that are ready for erasing. Once an entire block is no longer needed, TRIM manager 42 activates the garbage collector or other erase mechanism to erase the block so that the block may be re-used.

S.M.A.R.T. function 39 processes S.M.A.R.T. commands or vendor commands from host 300, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction manager 211 ensures that data is completely written or transferred to the NAND flash. Over-provisioning 208 sets aside and manages spare blocks in NAND flash memory 196. Security 215 may perform a password verification process before allowing access to the secure partition of NAND flash memory 196. The partition can be the whole drive or a part of the drive. Refresh manager 202 may periodically (such as daily or weekly) refresh data in NAND flash memory 196. Secure erase manager 18 performs a higher-security erase operation such as writing all zeros or all ones to a block to remove data when required.

Power backup 195 provides backup power so that SEED 200 may write data from SSD DRAM buffer 194 to NAND flash memory 196 when power fails. NVRAM 217 provides more non-volatile storage for critical meta data information, such as for transaction logs, meta data, and configuration information.

Figure 4:
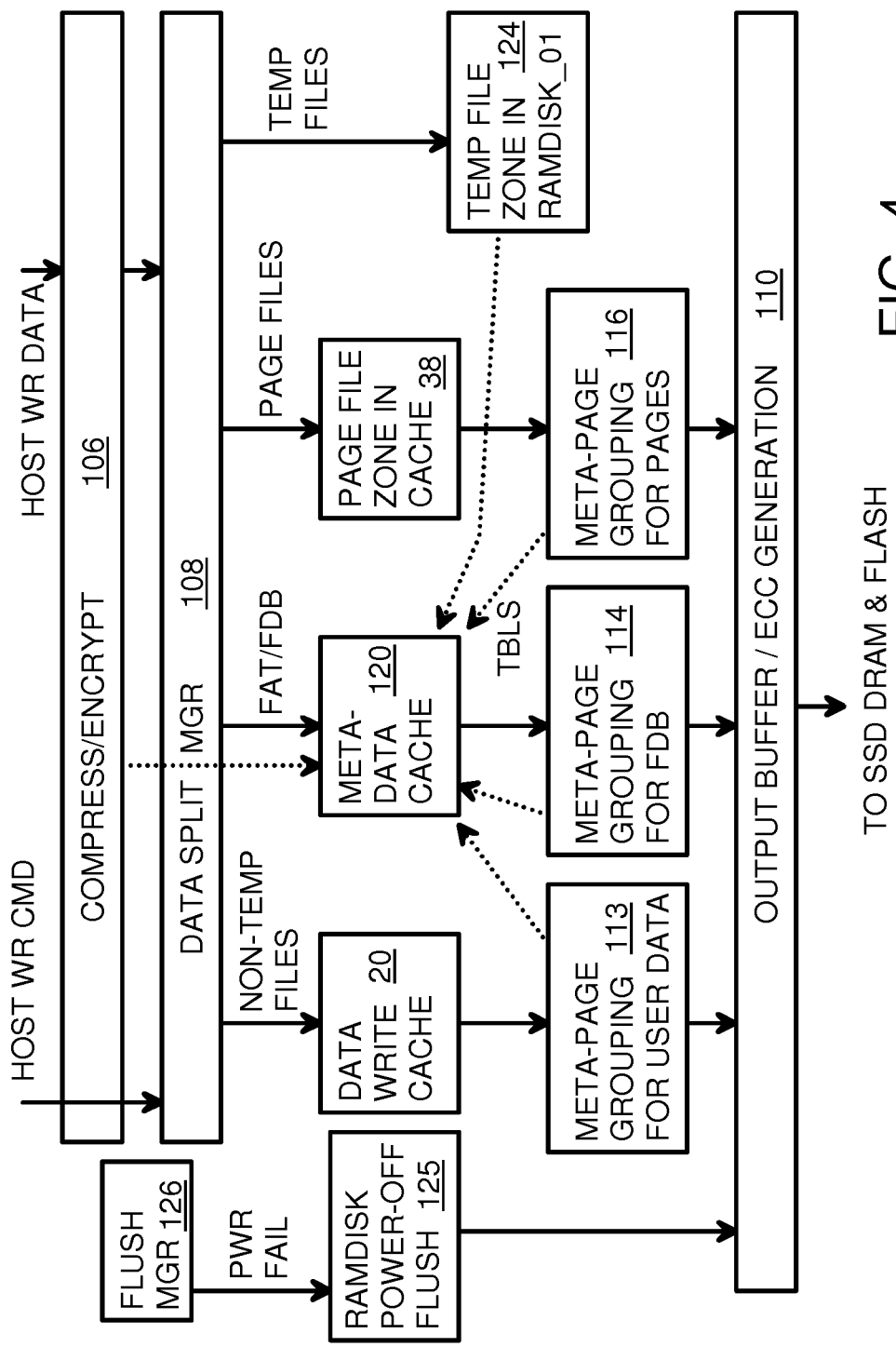
FIG. 4 is a flow diagram showing data splitting and grouping for writes through the VMD driver.

FIG. 4 is a flow diagram showing data splitting and grouping for writes through the VMD driver. The host sends a write command to data split manager 108, which also receives host write data after compression or encryption by compression/encryption engine 106 if enabled. A compression table entry for the encrypted or compressed files may be modified in meta-data cache 120.

Data split manager 108 inside VMD driver 100 (FIG. 2) sorts the host write data by data type, such as by examining the file extension or by parsing the FAT and FDB. Temp files are stored in Temp file zone 124 in ramdisk_01, with a table entry being modified in meta-data cache 120. Temp files are not stored to flash and are lost when power turns off and fails. The temp file zone can be optionally overflowed and grouped to SSD. Alternately, this function can be optionally disabled for certain operations such as server.

Paging files are stored in paging zone 38 in the cache and are grouped with other pages containing the same paging file data type into meta-pages by paging file grouping process 116. The grouped pages are then sent through output buffer 110 to SEED 200 and may be stored in DRAM, then flash memory. ECC code may be generated and attached by output buffer 110. A table entry for the grouped files may be modified in meta-data cache 120.

Meta-data files such as FAT and FDB entries are stored in meta-data cache 120. The FDB may be grouped into meta-pages by FDB meta-page grouping process 114. The grouped pages are then sent through output buffer 110 to SEED 200 and may be stored in DRAM. ECC code may be generated and attached by output buffer 110. A table entry for the grouped meta-data files may be modified in meta-data cache 120.

User files are stored in data write cache 20 and are grouped with other pages containing the same user or non-temporary file data type into meta-pages by meta-page user file grouping process 113. The grouped pages are then sent through output buffer 110 to SEED 200 and may be stored in DRAM, then flash memory. ECC code may be generated and attached by output buffer 110. A grouping table entry for the grouped files may be modified in meta-data cache 120.

When flush/resume manager 126 detects a power failure, ramdisk 188 is flushed by ramdisk power-off flusher 125. The data from ramdisk 188 is sent to output buffer 110 for storage by SEED 200. Alternately, data write cache 20, meta-data cache 120, and paging zone 38 in the cache can be in a ramdisk. Temp file zone 124 in ramdisk_01 can be in a cache.

Figure 5A:
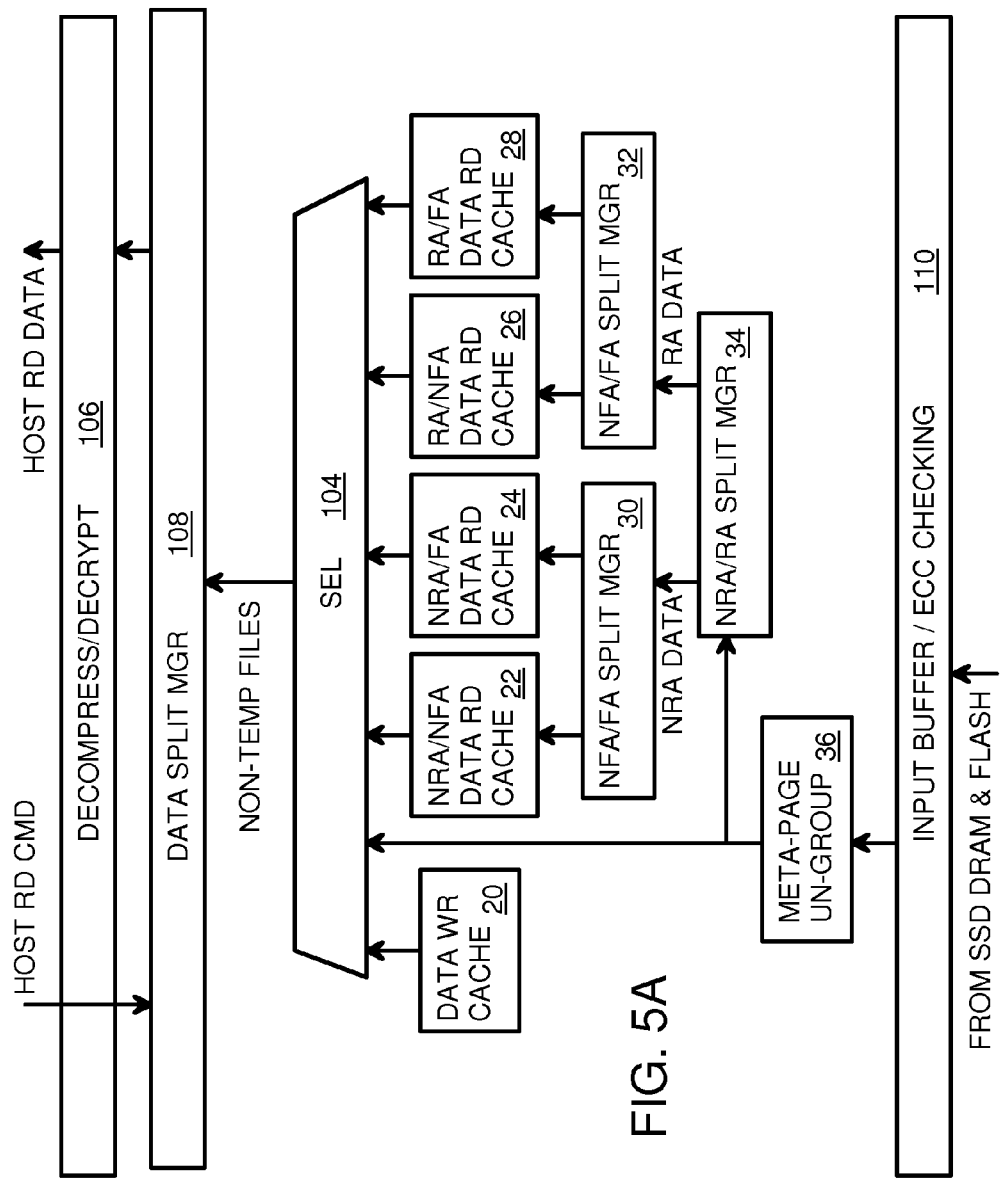
FIGS. 5A-B are a flow diagram showing data sorting and un-grouping for reads through the VMD driver.
Figure 5B:
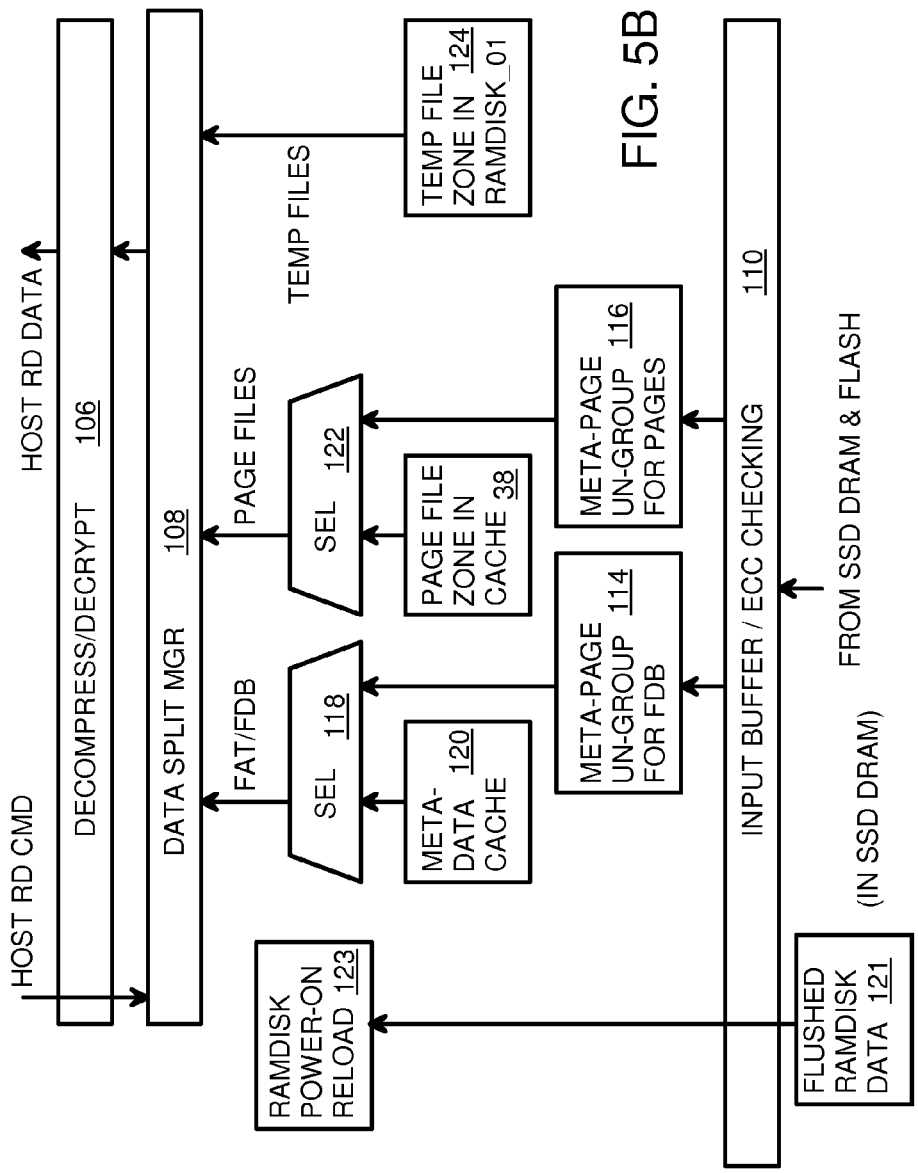

FIGS. 5A-B are a flow diagram showing data sorting and un-grouping for reads through the VMD driver. The host sends a read command to data split manager 108, which also delivers host read data after decompression or decryption by compression/encryption engine 106. Data split manager 108 inside VMD driver 100 (FIG. 2) sorts the host write data by data type and activates selector 104 to select the data based on the data type.

In FIG. 5A, the user data may have recently been written and is still available from data write cache 20. The data may be stored in SEED 200 and must first be received by buffer 110, ungrouped by meta-page ungrouping engine 36 and then selected by selector 104. The data from the ungrouped meta-page is stored in one of four read caches. NRA/RA split manager 34 separates data that is recently accessed from Non-Recently-Accessed (NRA) data. NFA/FA split managers 30, 32 separate data that is more frequently accessed from Non-Frequently-Accessed (NFA) data. Selector 104 selects one of four read caches 22, 24, 26, 28 based on whether the data was identified as recently or frequently accessed or not.

In FIG. 5B, temp files are not stored in flash memory and are only read from Temp file zone 124 in ramdisk_01 by data split manager 108 in response to a host read. Paging files are selected by selector 122 from either paging zone 38 in the cache or from flash after being ungrouped by paging-files meta-page ungrouping process 116. Meta-data such as FAT and FDB entries are selected by selector 118 from either meta-data cache 120 or from flash memory after reading through output buffer 110 and being ungrouped by FAT/FDB meta-page ungrouping engine 114. On power restore, ram-disk power-on reloader 123 is activated to read flushed ramdisk data 121 from the SSD or flash memory.

FIG. 6 shows a memory map of an Endurance Transaction Layer (ETL) in the host DRAM. Memory space 289 contains several ramdisks that may be individually defined for direct-memory access or for a file-system based access. ramdisk_00 284 stores the OS boot image and a backup OS boot image. ramdisk_01 288 stores temp files. ramdisk_02 236 stores browser files, which also can be discarded when power is lost. ramdisk_03 238 stores temporary files used by applications that can also be discarded on power loss. Optionally, data in ramdisk_02 236 and ramdisk_03 238 can be grouped and written to SEED 200.

Cache 286 stores meta data and tables such as FAT, FDB, compression table, grouping tables, and cache mapping tables. Cache 232 stores paging files. Cache 234 stores data writes. These caches are backed up when power fails. Read caches 290, 291, 292, 293 store FA, NFA, RA, and NRA data and may be discard when power fails.

VMD drivers 278 and VMD application 280 are also stored, along with OS functions 282, flush manager 277, user applications 276, proprietary IO drivers 274, and settings and environment parameters 272.

FIG. 7 shows a memory map of an Endurance Transaction Layer (ETL) in the SEED SSD DRAM. The memory space of SSD DRAM buffer 194 contains cache 140 for meta-data, cache 142 for temp files, cache 144 for paging files, flushed data 145, read cache and mapping table 151, data in buffer 152, and data write cache 154. These caches may store overflow data from the caches in memory space 289 from the host DRAM. Paging files and mapping tables 148 and page grouping for log files 146 are also allocated memory space. System use area 150 is reserved. Spare and swap blocks 156 provide blocks for spare and swap operations. Tables 162 store flash page status and bad block information. Block and erase count table 164 stores erase count and block information on a block basis. S.M.A.R.T. data collector 170 collects and stores status information for lower-level flash blocks and controllers that may be read by host software.

Figure 8:
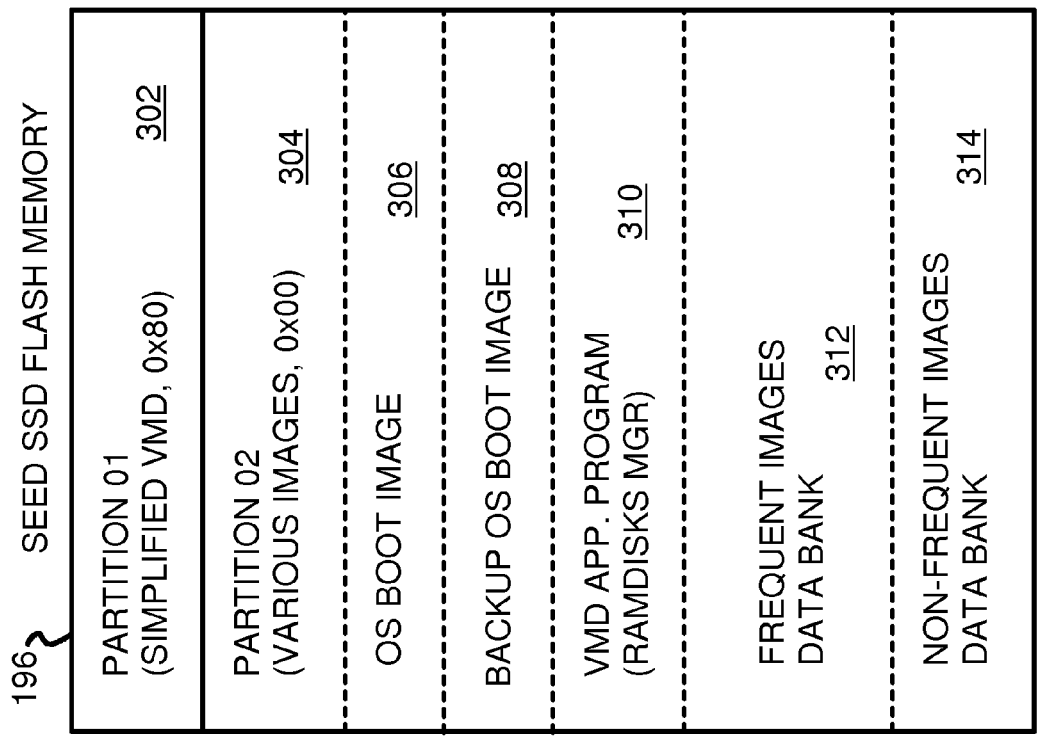
FIG. 8 is a memory map of flash memory.

FIG. 8 is a memory map of flash memory. Flash memory space in NAND flash memory 196 includes partition_01 302, which has the bootable signature 0x80 with a simplified VMD program and encryption/decryption functions. Partition_02 304 has other images such as OS boot image 306 and backup boot image 308 and has a bootable signature of 0x00. VMD application program 310 is stored in flash and acts as the ramdisk manager. Data bank 312 stores frequent images while data bank 314 stores non-frequent images.

Figure 9:
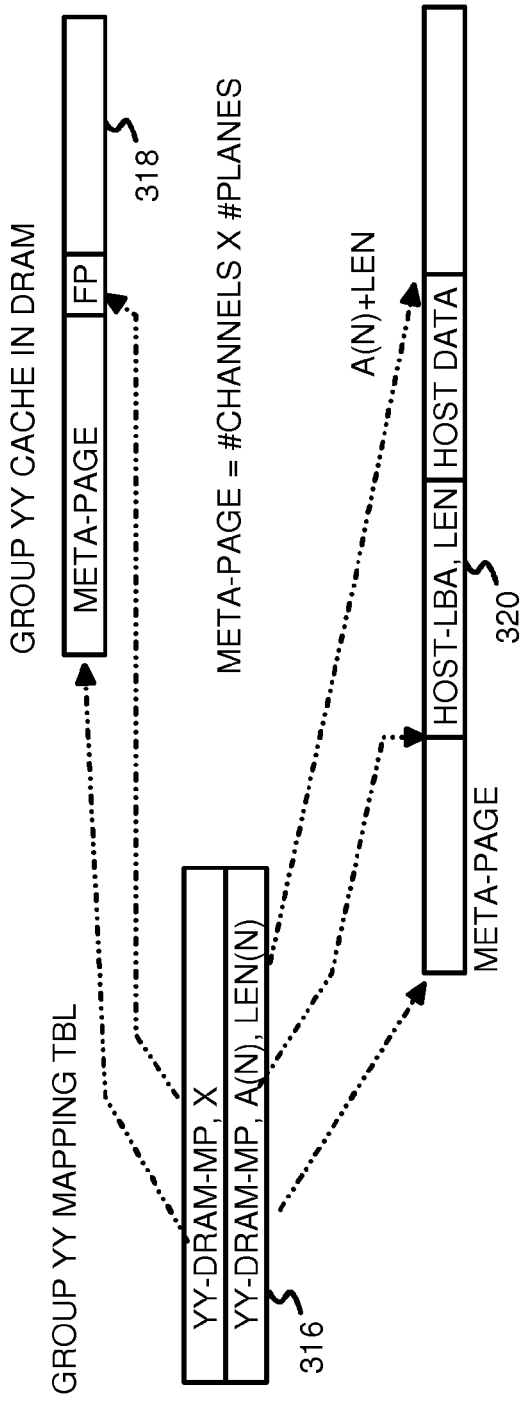
FIG. 9 highlights mapping and grouping of full and partial pages to meta-pages by data type.

FIG. 9 highlights mapping and grouping of full and partial pages to meta-pages by data type. Each data type has its own grouping map table 316, such as for paging files, temp files, meta-data, and normal user data. Only user data is mapped to flash memory in this embodiment, although other embodiments with excess memory may map additional data types to flash.

A meta-page is a larger unit of memory than a flash page. The flash memory may be organized as multiple channels and multiple chips or dies per channel and each die having multiple planes. The meta-page size is the number of channels times the number of planes, times the flash page size. For example, four channels and two planes have a meta-page size of 8 pages.

When a full page (FP) is grouped into FP grouping meta-page 318, the page location X where that page is written to is stored into an entry in grouping map table 316 for that host LBA, along with a pointer to that grouping meta-page 318, YY-DRAM-MP.

When a partial page (PP) is grouped into PP grouping meta-page 320, the starting location A(N) of that partial page, and the length LEN(N) of that partial page is stored into an entry in grouping map table 316 for that host LBA, along with a pointer to that PP grouping meta-page 320, YY-DRAM-MP. The Host LBA and length are attached to the data before stored into PP grouping meta-page 320.

Figure 10:
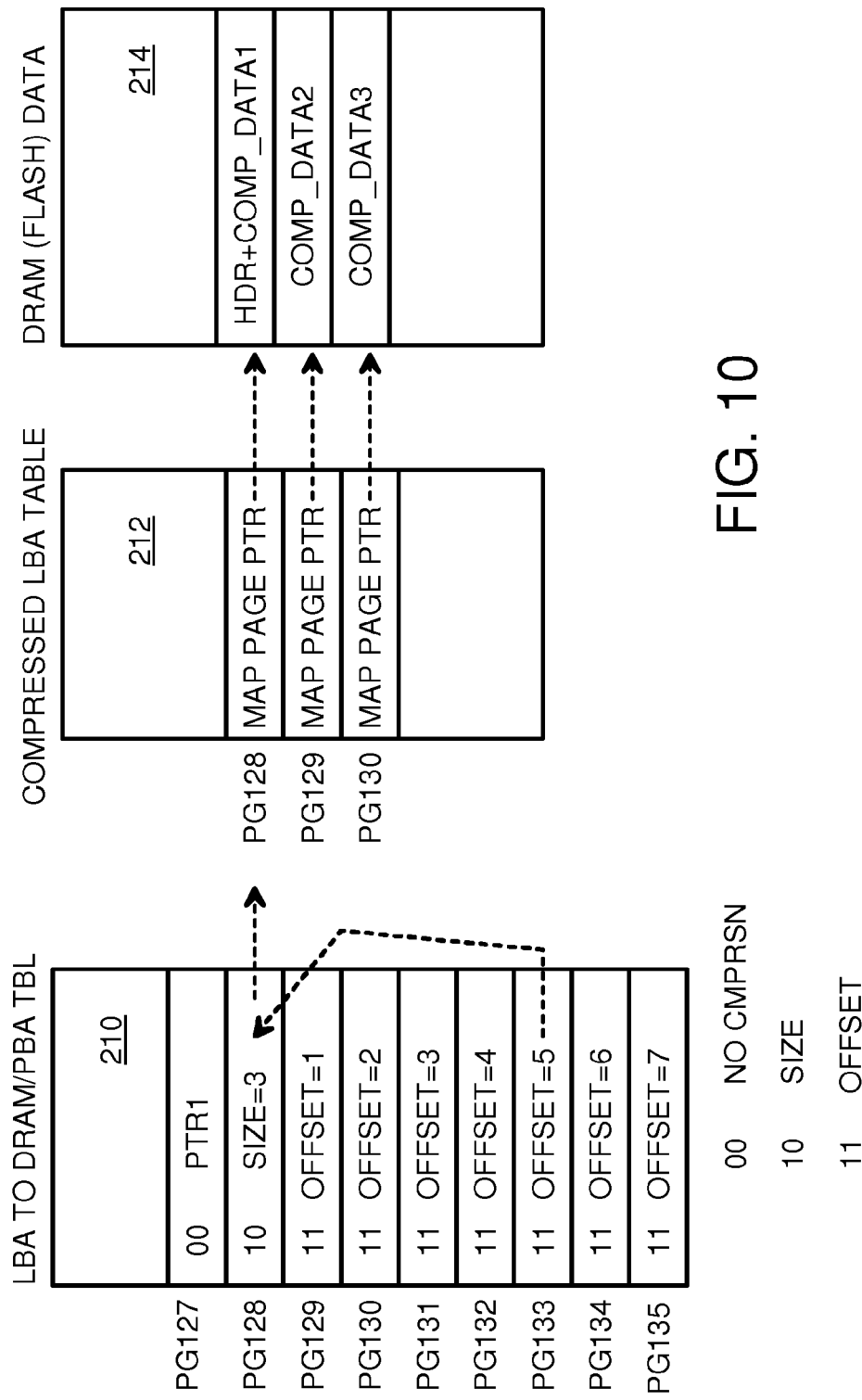
FIG. 10 shows mapping of compressed pages.

FIG. 10 shows mapping of compressed pages. Flash endurance may be increased by storing compressed data in flash pages rather than regular data, since compression reduces the data size and this the storage requirements in flash. Compressed data may be cached in host DRAM or SSD DRAM buffer 194, and backed up to NAND flash memory 196 when the cache is full.

VMD driver 100 may compress some data before storing it in ramdisk 188 or data write cache 20. The host writes several pages of data in the normal fashion, indicating the logical address (LBA) and page numbers and sector counts that indicate the total data length. For example, the host may write DATA1 to LBA 2048, SC=128, which is 8 pages of 16 sectors per page. A compression engine such as encryption/decryption engine 240 in VMD driver 100 (FIG. 1) compresses the 128 sectors of data to 48 sectors of compressed data. These 48 sectors of compressed data include a header and some compressed data stored in a first compressed page, and two more pages of compressed data, for a total of 3 compressed pages. This is a significant reduction from the uncompressed 8 pages.

VMD driver 100 stores these 3 pages of compressed data in ramdisk 188, or data write cache 20 as compressed data 214 at a page pointed to by pointers MAP_PAGE_PTR that are stored in compressed LBA table 212.

VMD driver 100 also creates entries in LBA table 210, which may be part of a unified mapping table or part of meta-data cache 120. However, the entries in LBA table 210 are specially coded for mapping to compressed data.

The mapping entries in LBA table 210 each include first two bits that are compression status bits. The first compression status bit is a 1 for a compression access, and 0 for regular host accesses of uncompressed data. For example, page 127 maps to uncompressed data using PTR1.

When the first compression status bit is a 1, and the second compression status bit is 0, the entry in LBA table 210 contains the total size (number of pages) of the uncompressed data segment. When the first compression status bit is a 1, and the second compression status bit is 1, then the entry in LBA table 210 contains an offset. The offset is and offset to the first entry for this segment of compressed data, the entry that contains the size of the segment.

In the example of the host writing DATA1 to LBA 2048, SC=128, which is 8 pages, there are 8 page entries in LBA table 210 for this segment of DATA1. The LBA of 2048 selects page 128 in LBA table 210. A total of 8 page entries in LBA table 210 are used. The first entry has the total data size and the following 7 entries contain offsets that point back to the first entry.

When the host reads page 133 (LBA=2128, SC=16), the entry in LBA table 210 for page 133 is read. The offset stored in page 133's entry is 5, which points back to the entry for page 128, which contains the total compressed data size of 3 pages. The entry for page 128 is read from compressed LBA table 212, along with the next two entries of compressed LBA table 212, for a total of 3 page entries, which is the size of the compressed data. Each entry points to a page of compressed data in ramdisk 188, SSD DRAM buffer 194, or NAND flash memory 196. All three compressed pages are read and decompressed to recover the original 8-page block of uncompressed data. Then the data the host is reading is extracted from the uncompressed data. The compression can be in-line with a hardware circuit or a firmware controlled algorithm, or software.

FIGS. 11A-B show spare and swap operations. 11A, the spare block is in flash, such as in NAND flash memory 196. Data has been written to flash block X, occupying portion 322 that includes several whole pages and one partial page. Data is also written to spare flash block Y in portion 324, which is also several whole pages and a partial page. The data in blocks X and Y are to be combined to free spare block Y.

The full pages from portion 322 are written to upper portion 326 of swap block Z. Then the partial pages from blocks X and Y are written to DRAM page buffer 330 and combined, then written to a middle page in swap block Z. Next the full pages from portion 324 are written to lower portion 328 of swap block Z. Finally, both blocks X and Y can be erased.

In FIG. 11B, spare block Y is in DRAM, such as in SSD DRAM buffer 194. Data has been written to flash block X, occupying portion 322 that includes several whole pages and one partial page. This data is copied to spare block Y in DRAM, occupying upper portion 332. Data is also written to spare flash block Y in lower portion 324, which is also several whole pages and a partial page. The data in blocks X and Y are to be combined to free spare block Y. Since spare block Y is in DRAM, the partial pages from X and Y can be combined directly. The entire spare block Y is then copied to swap block Z, including upper portion 326 and lower portion 328. Finally, only block is erased, since block Y is in DRAM and does not need an erase operation. Depending on the time required for flash erase operations, having spare block Y in DRAM can improve performance as well as reduce the wear on flash blocks.

Figure 12:
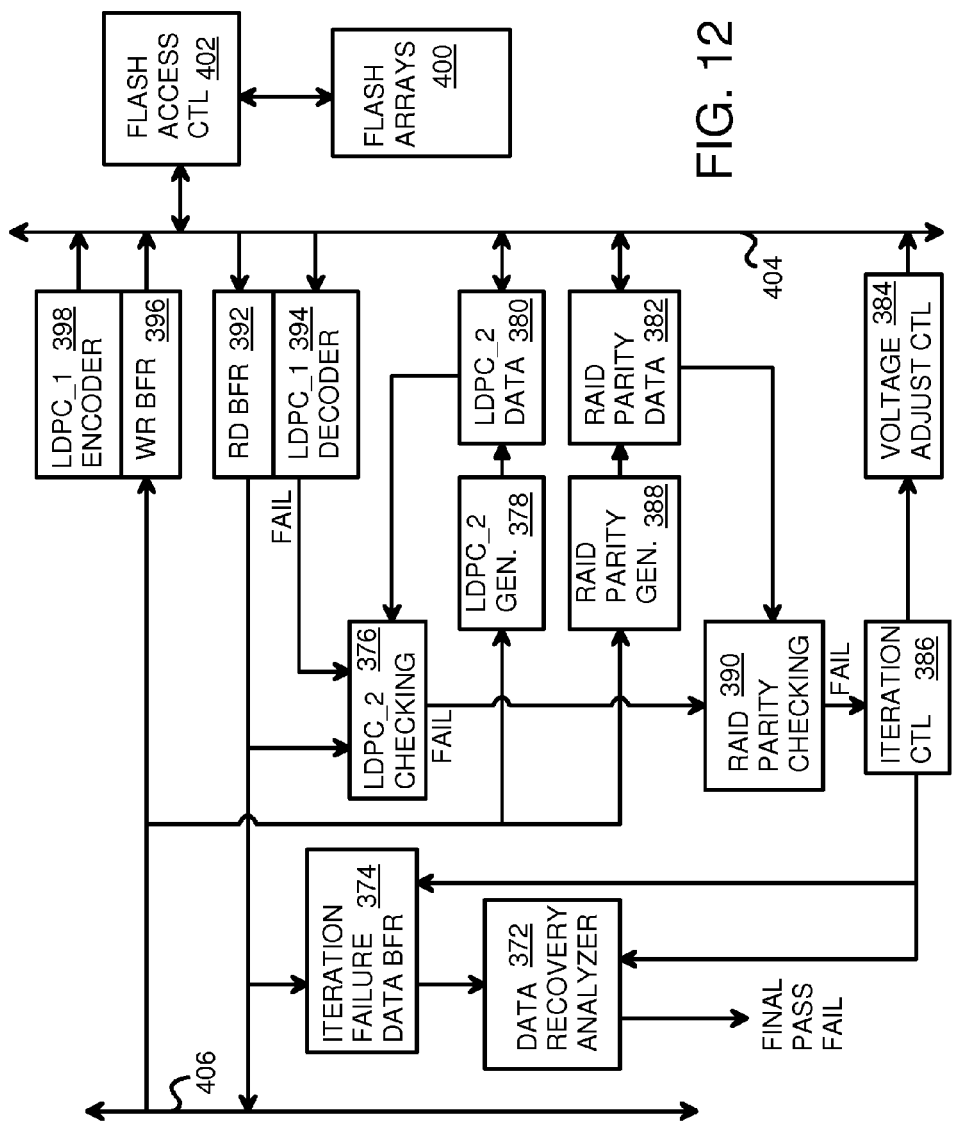
FIG. 12 shows multiple levels of error checking.

FIG. 12 shows multiple levels of error checking. Flash arrays 400 may use multi-level cells that are more prone to bit errors when read by flash access controller 402 onto internal bus 404. Low-Density parity Check (LDPC) code may be generated by encoder 398 and appended as spare bytes to data from write buffer 396 before being written to flash arrays 400. When data is read to read buffer 392 from flash arrays 400, parity decoder 394 checks the stored parity against generated parity to detect and correct read errors. When correction is not possible with the LDPC_1 code, a longer, more complex code, LDPC_2 checking 376 is enabled for the page or block of flash data.

The longer parity code LDPC_2 is generated by LDPC_2 generator 378 and buffered to bus 404 by LDPC_2 write buffer 380. It is generated due to the flash memory page selected needing more protection due to deterioration of the physical cells in its page. LDPC_2 is generated and appended to future data writes to the enabled page or block of flash arrays 400.

When LDPC_2 code fails to correct a read error, RAID parity checking 390 is enabled. The RAID parity may extend across several physical devices of flash memory arrays. The RAID parity code is generated by RAID parity generator 388 and buffered by RAID buffer 382 before being written with the write data on bus 404. It is generated due to the flash memory page selected needing more protection due to deterioration of the physical cells.

When RAID parity code fails to correct a read error, iteration controller 386 is activated to test voltage adjustments. The read data is stored in iteration failure data buffer 374. Voltage adjust control 384 is controlled by the flash controller that writes a specific value to flash memory in order to adjust reference voltages for data being read from flash arrays 400. Data is read back to test if the new set of reference voltages reduces errors. It will go through another round of LDPC_1/LDPC_2/RAID checking. If reading still fails, the read data is stored in iteration failure data buffer 374 and another voltage is selected and another round of read back test performed. When all the voltage iterations are tested and fail, iteration failure data buffer 374 is loaded with the test results, which may be analyzed by data recovery analyzer 372 do determine if the data on internal bus 406 can be used or if a fatal failure occurred. The multiple levels of error correction code and parity checking may improve the lifetime and endurance of flash memory.

FIGS. 13A-B show bad block/erase count tables and page status tables. In FIG. 13A, a write date is stored on a block basis. Bad block/erase count table 471 has entries for blocks of flash memory. Each entry contains a block status field, with 3 bits that indicate if the block is empty (erased), used, a block with some garbage pages, a whole bad block, or a partially bad block with some bad pages and some good pages.

Each block entry also has a 13-bit erase count and a 16-bit write date. The 13-bit erase count starts at 0 when the device is first produced. Every time the block is erased it increments by one. This erase count can be used for wear leveling control and can be analyze by the S.M.A.R.T. for checking the health condition of the device. The write date is the date that the last write to the block occurred. It is used for the purpose of the refresh function. For TLC devices the retention time may be less than 1 year. The write date may be an encoded data (MM-DD-YY), or a number value that refers to the device manufacturing date initialized at manufacture.

Page status table 473 has entries for all pages in a block. Each page has a 3-bit page status field. Since each page entry is only 3 bits long, many page entries may be packed together. The page status indicates an empty, used, or garage page, a bad page, or a page that is protected with a higher level of error correction, such as a longer ECC code than for other pages.

FIG. 13B, a write date is stored on a page basis rather than on a block basis. Bad block/erase count table 471' has entries for blocks of flash memory. Each entry contains a 13-bit erase counter and a block status field, with 3 bits that indicate if the block is empty (erased), used, a block with some garbage pages, a whole bad block, or a partially bad block with some bad pages and some good pages.

The write date is not stored in bad block/erase count table 471'. Instead, the write date is stored in page status table 473'. The write date is the date the page is written for FIG. 13B, but the date the block is written for FIG. 13A. Storing the write data for pages rather than for blocks requires more table storage since each block has many pages, but endurance may be increased. This refresh is for pages, not for the whole block.

Figure 14:
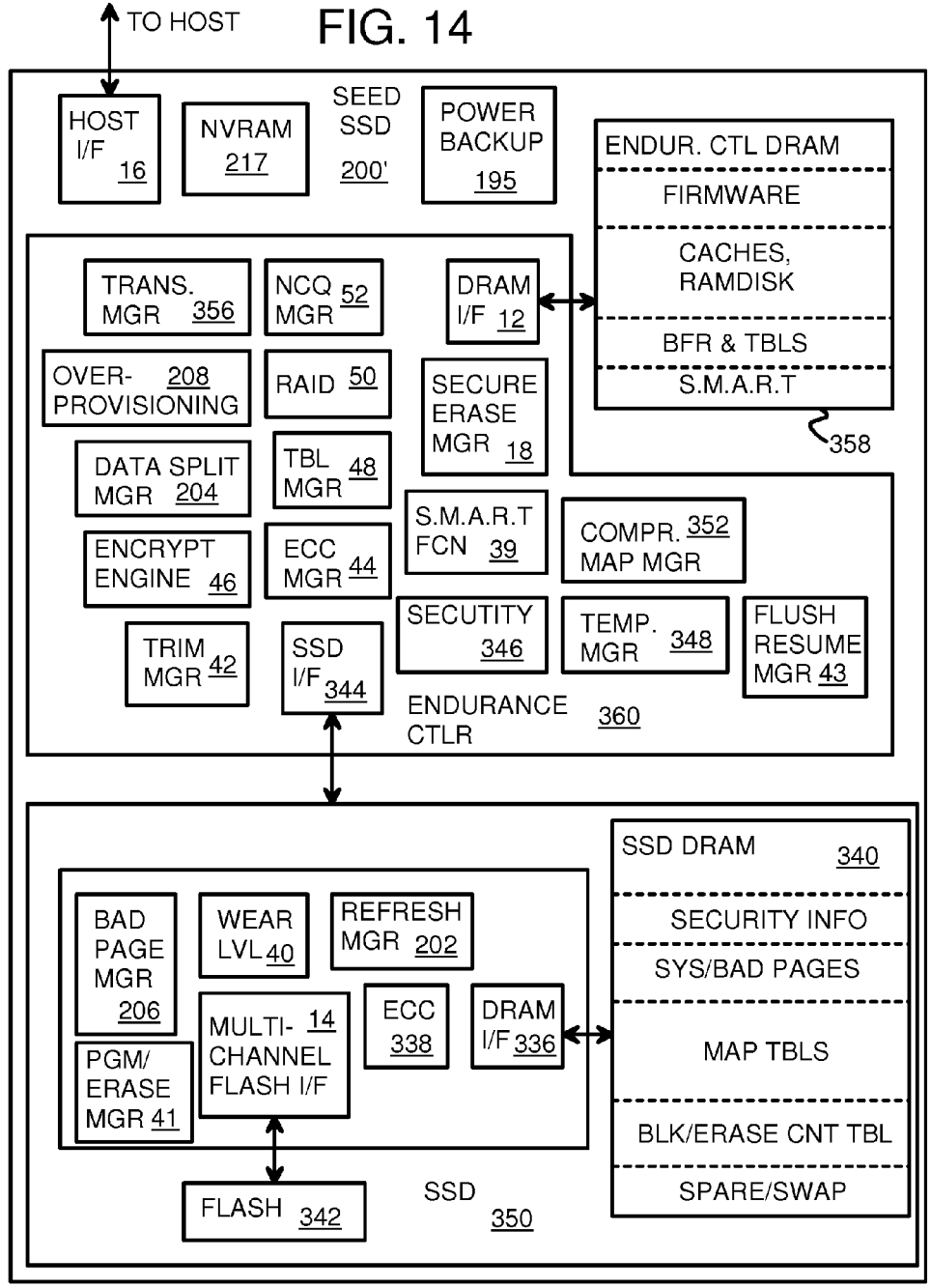
FIG. 14 is a block diagram of a Super Enhanced Endurance Device (SEED) with an endurance controller.

FIG. 14 is a block diagram of a Super Enhanced Endurance Device (SEED) with an endurance controller. In this alternative, SEED 200' interfaces with SSD 350 and then to flash memory 342, rather than directly to NAND flash memory 196 as shown in FIGS. 1, 3. SSD 350 may be integrated with SEED 200'. SEED 200' is meant to work alone without the host VMD driver. Some functions residing in the host VMD driver may be implemented.

SEED 200' has host interface 16, which communicates with host 300 (FIG. 1) using a bus such as a PCIe, SATA, or Universal-Serial-Bus (USB), NVMe, Thunderbolt, eMMC, iSSD, etc. Host data from host interface 16 is sent to endurance controller 360. Endurance controller 360 replaces SEED controller 192 of FIG. 3, and many of the components with the same reference numbers as in FIG. 3 have already been described earlier.

Endurance controller DRAM 358 may store one or more ramdisks, caches, S.M.A.R.T. information, firmware, and other buffers and tables. The lower-level SSD DRAM 340 may store security information, tables for bad page management, mapping tables, erase count tables, spare and swap blocks, and other buffers and tables. Lower-level DRAM interface 336 reads and writes from endurance controller DRAM 358. Refresh manager 202 may periodically refresh data in lower-level SSD flash memory 342. Flush resume manager 43 manages resume operations using flushed data. Temp manager 348 controls temp data, while compression mapping manager 352 manages compression tables. Security 346 manages security functions.

Multi-channel flash interface 14 programs data pages and erases blocks in flash memory 342, which may be organized into several channels. ECC manager 338 generates low-level error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Bad page manager 206 keeps track of locations of bad pages in flash memory 342. This can extend the lifetime of individual blocks, since only one page may be bad in the block, and other pages may continue to be used. More complex bad-block management may reduce the overall wear of the flash drive.

Wear-leveler 40 may provide two methods of wear leveling methods. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in flash memory 342. Endurance controller 360 and SSD 350 controller may be functionally integrated together or may be separate.

FIGS. 15A-E show the VMD driver on the host processing a host write command. The host request includes a logical address such as a LBA that is used as an index into a unified mapping table, step 1002. A matching entry from the unified mapping table is read, or the FAT and FDB entries are parsed for the file to determine the file extension and data type. The first few bits in the matching entry are data-type bits that indicate what kind of data is stored at this logical address. Different processes are dispatched depending on the data-type bits.

When the data-type bits for the matching entry are 10, step 1004, the data is for FAT or FDB entries. The meta-data write process is called, which is detailed in FIG. 15B.

When the data-type bits are 11, step 1006, the user data file process is called. The user data write process is detailed in FIG. 15C. User data files are user and application data that should first be stored in DRAM and later flushed to flash.

When the data-type bits for the matching entry are 001, step 1008, the data is for paging files for swaps to peripheral storage from main memory that is performed by a memory manager on the host. These files do not need to be stored in flash, reducing wear. The paging data write process is called, which is detailed in FIG. 15D.

When the data-type bits for the matching entry are 01 (none of the prior types), step 1008, the data is for temporary files that do not need to be stored in flash memory. The temp data write process is called, which is detailed in FIG. 15E.

Figure 15B:
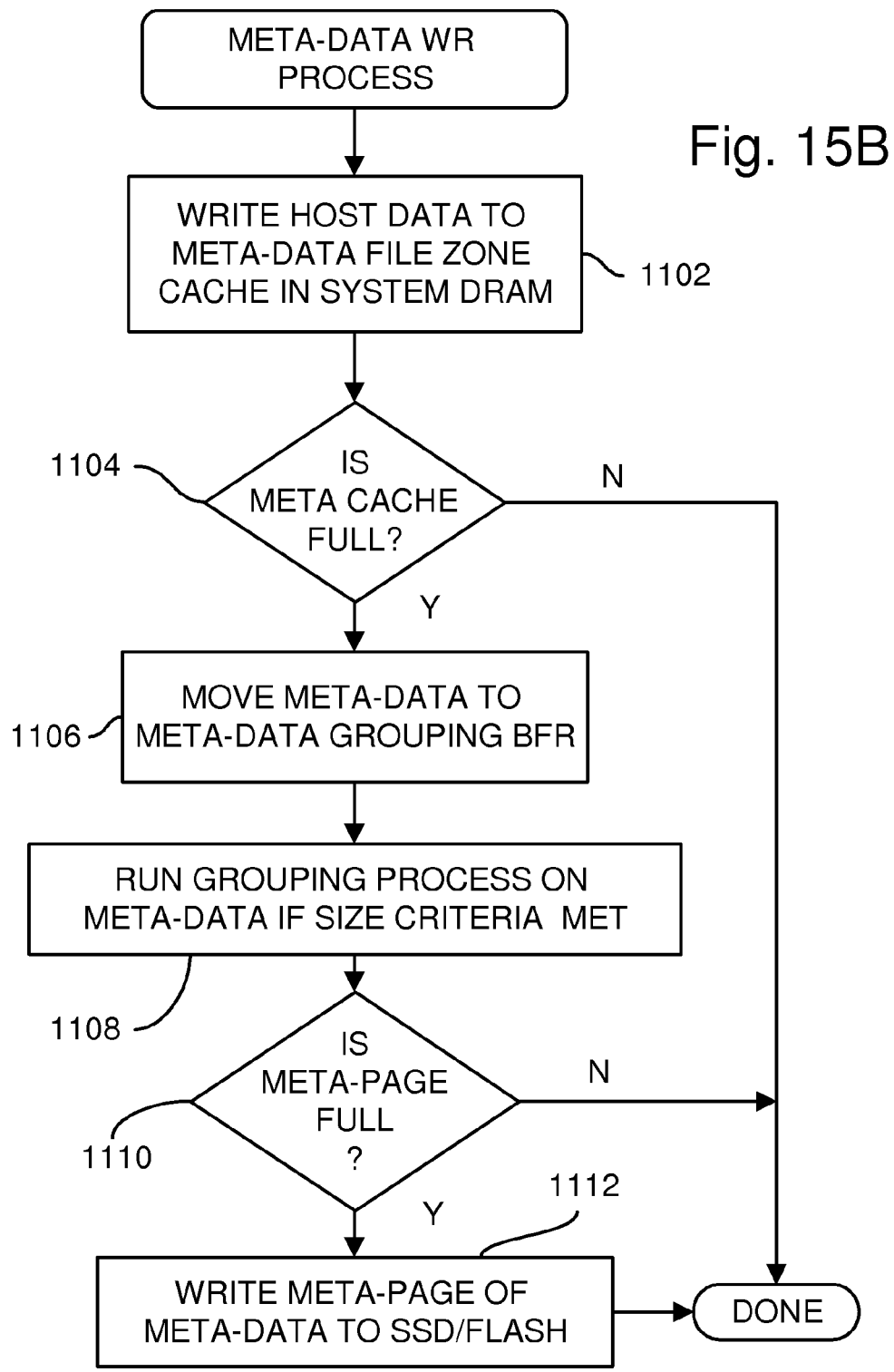

FIG. 15B shows the meta-data write process. The host data is written to the meta-data file zone cache in the host's DRAM, (286 in FIG. 6), step 1102. When the cache is full, step 1104, the meta-data in the cache is moved to the meta-data grouping buffer in DRAM, step 1106. A grouping process is performed on the meta-data in the grouping buffer, step 1108, when size criteria are met or after each data is received.

The grouping process groups meta-data into a meta-page. When the meta-page is full, step 1110, then the full meta-page of meta-data is written to the SEED, SSD, or flash memory, step 1112.

FIG. 15C shows the user-data write process. The host data is written to the user-data file zone cache in the host's DRAM, (234 in FIG. 6), step 1122. When the cache is full, step 1124, the user-data in the cache is moved to the user-data grouping buffer in DRAM, step 1126. A grouping process is performed on the user-data in the grouping buffer, step 1128, when size criteria are met.

The grouping process groups user-data into a meta-page. When the meta-page is full, step 1130, then the full meta-page of user-data is written to the SEED, SSD, or flash memory, step 1132.

Figure 15D:
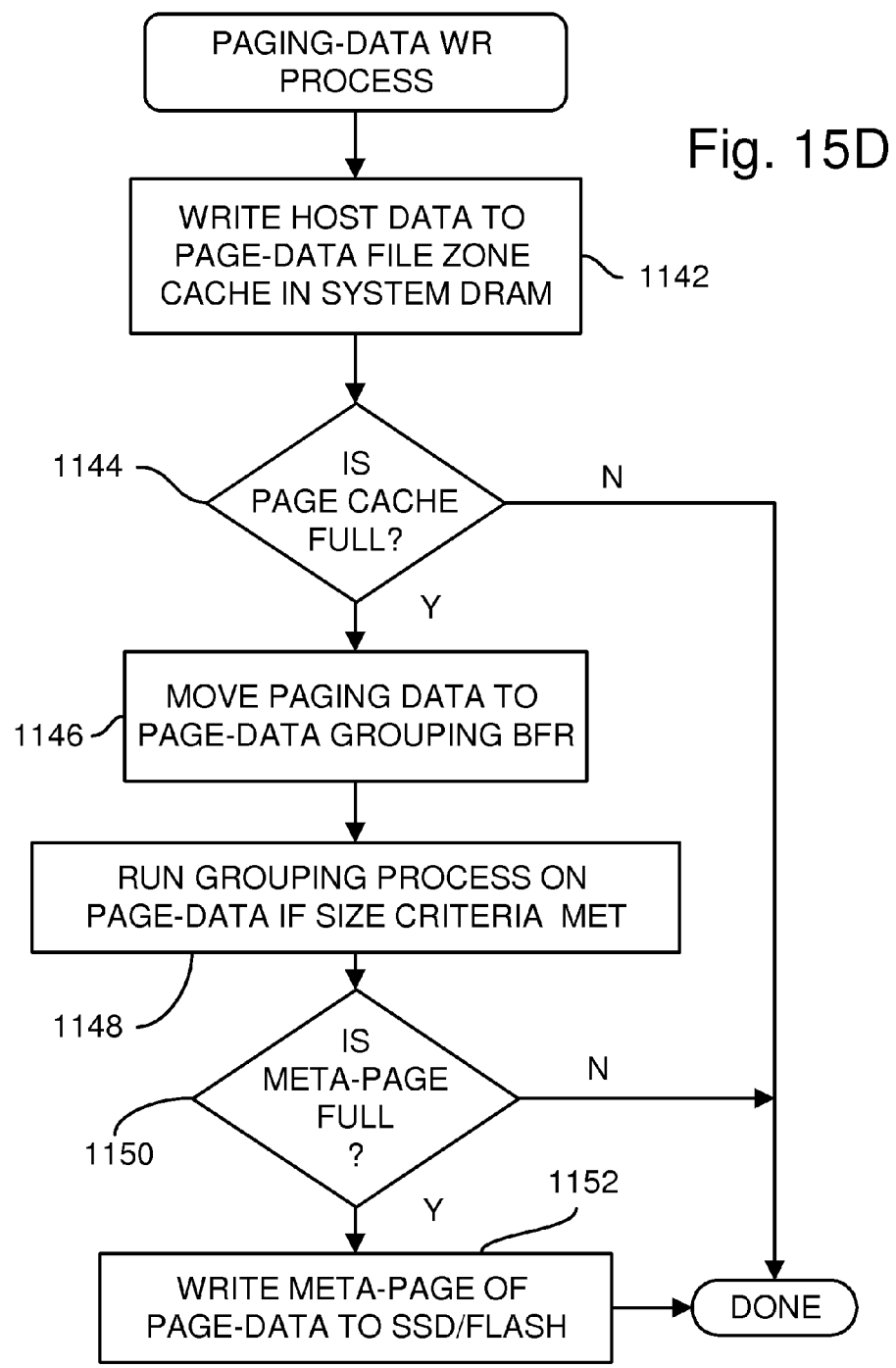

FIG. 15D shows the paging-data write process. The host data is written to the paging-data file zone cache in the host's DRAM, (232 in FIG. 6), step 1142. When the cache is full, step 1144, the paging-data in the cache is moved to the paging-data grouping buffer in DRAM, step 1146. A grouping process is performed on the paging-data in the grouping buffer, step 1148, when size criteria are met.

The grouping process groups paging-data into a meta-page. When the meta-page is full, step 1150, then the full meta-page of paging-data is written to the SEED, SSD, or flash memory, step 1152.

Figure 15E:
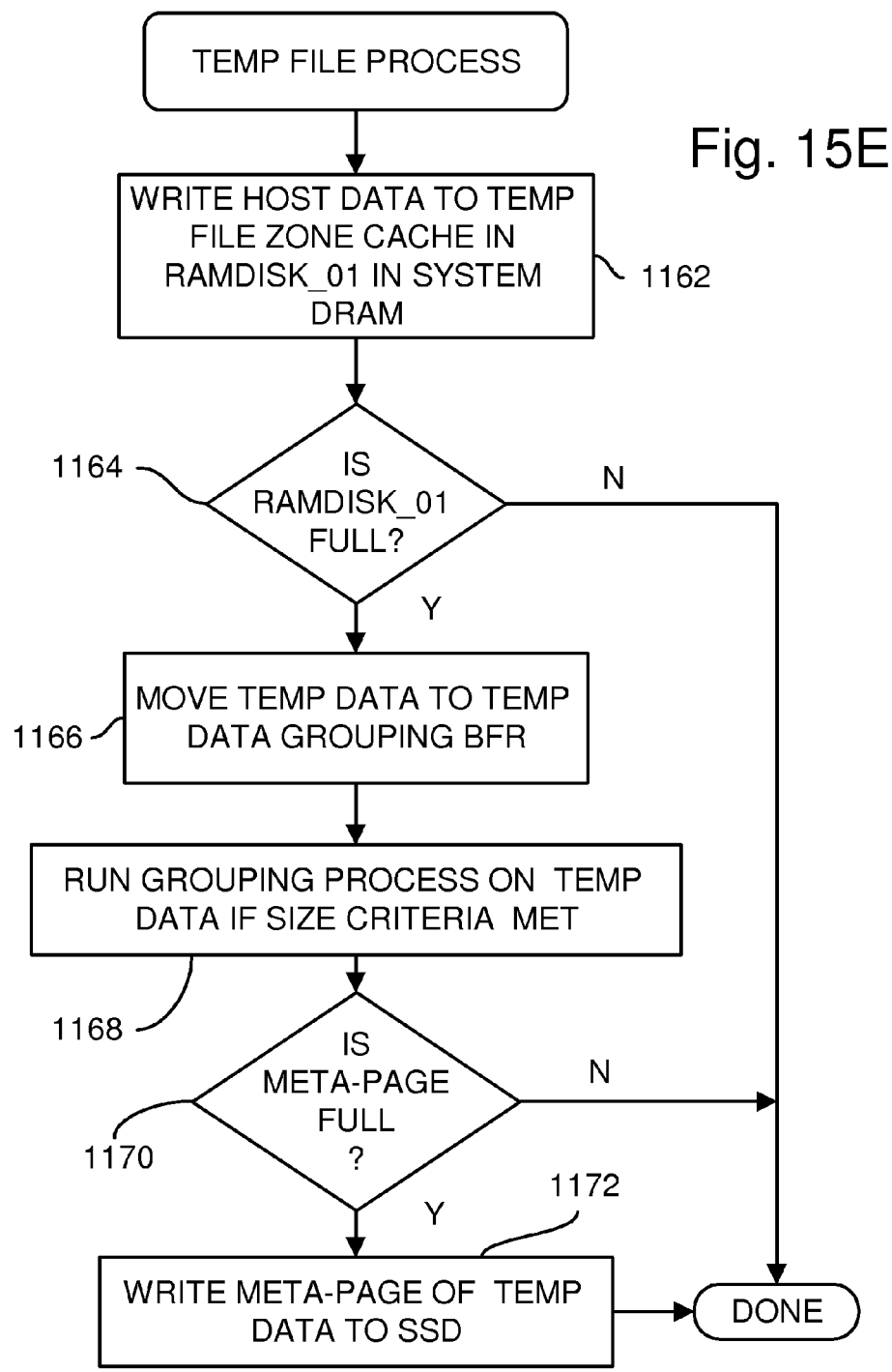

FIG. 15E shows the temp file write process. The host data is written to the temp file zone in ramdisk_01 in the host's DRAM, (288 in FIG. 6), step 1162. When the ramdisk is full, step 1164, the temp files in the ramdisk are moved to the temp-data grouping buffer in DRAM, step 1166. A grouping process is performed on the temp-data in the grouping buffer, step 1168, when size criteria are met.

The grouping process groups temp-data into a meta-page. When the meta-page is full, step 1157, then the full meta-page of temp-data is written to the SEED or SSD, but not to flash memory, step 1172.

FIGS. 16A-E show the VMD driver on the host processing a host read command. The host request includes a logical address such as a LBA that is used as an index into a unified mapping table, step 1012. A matching entry from the unified mapping table is read, or the FAT and FDB entries are parsed for the file to determine the file extension and data type. The first few bits in the matching entry are data-type bits that indicate what kind of data is stored at this logical address. Different read processes are dispatched depending on the data-type bits.

When the data-type bits for the matching entry are 10, step 1014, the data is for FAT or FDB entries. The meta-data read process is called, which is detailed in FIG. 16B.

When the data-type bits are 11, step 1016, the user data file read process is called. The user data read process is detailed in FIG. 16C.

When the data-type bits for the matching entry are 001, step 1018, the data is for paging files. These files do not need to be stored in flash, reducing wear. The paging data read process is called, which is detailed in FIG. 16D.

When the data-type bits for the matching entry are 01 (none of the prior types), step 1018, the data is for temporary files that are not stored in flash memory. The temp data read process is called, which is detailed in FIG. 16E.

Figure 16A:
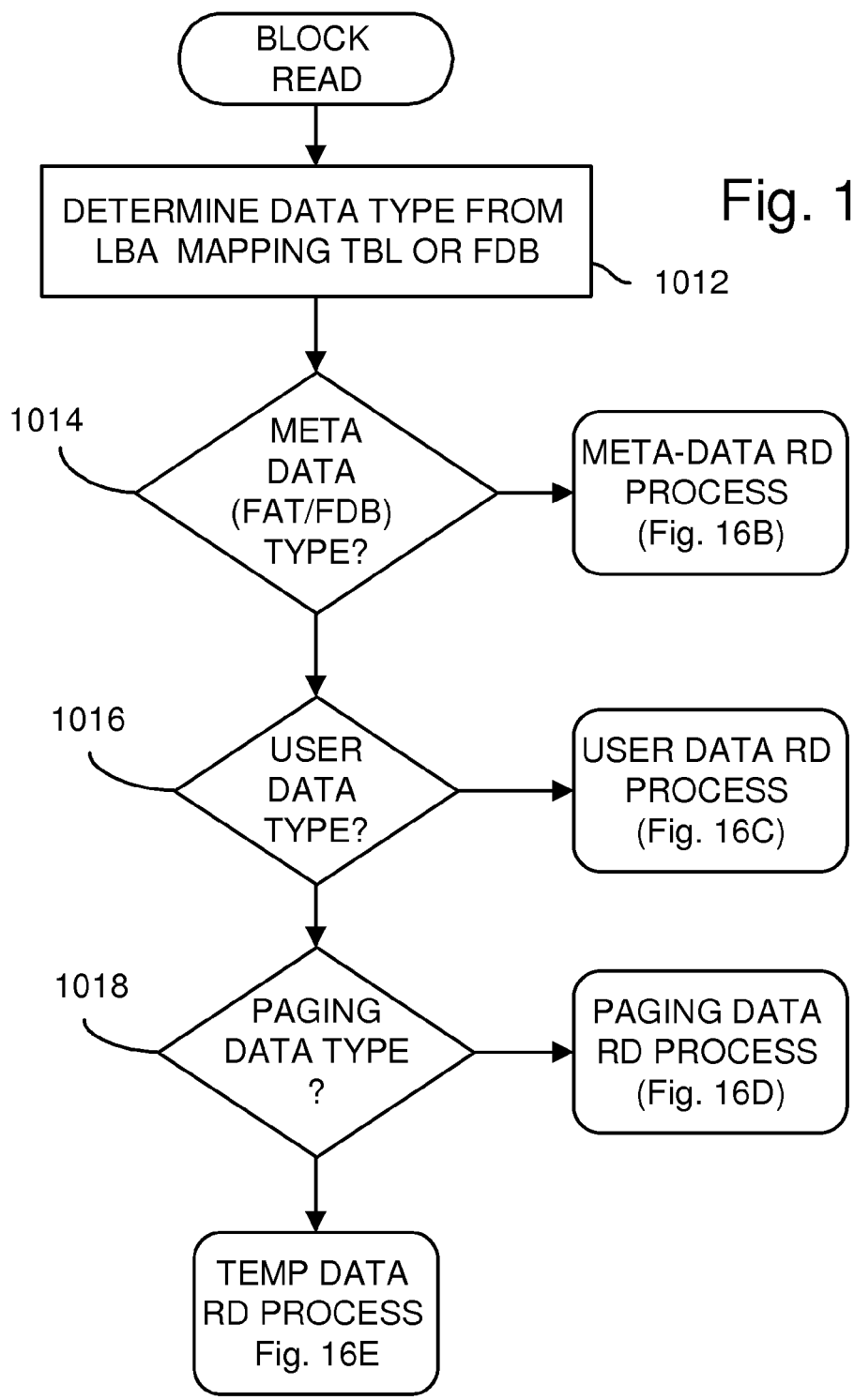
FIGS. 16A-E show the VMD driver on the host processing a host read command.
Figure 16B:
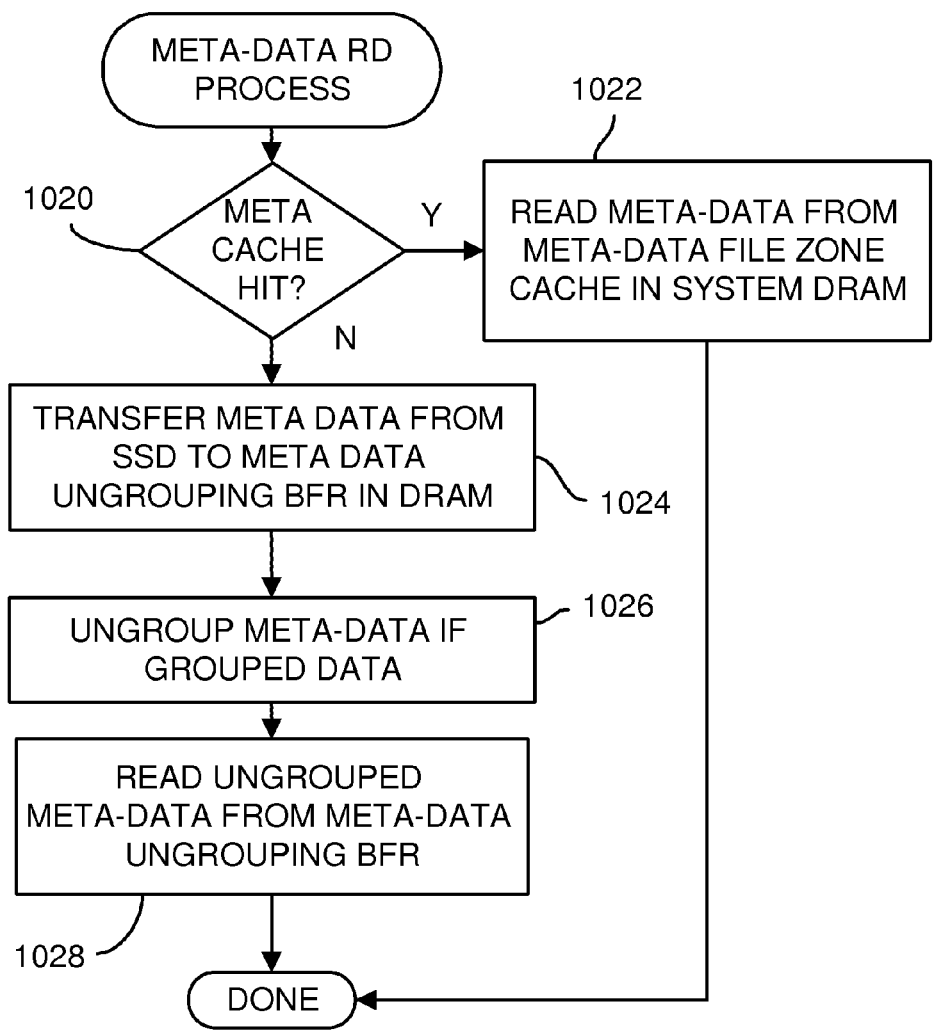

FIG. 16B shows the meta-data read process. When the requested meta-data is found in the meta-data file zone cache in the host's DRAM, (286 in FIG. 6), step 1120, then the requested meta-data can be read from this cache and delivered to the host, step 1022.

When the requested meta-data is not in the cache, step 1120, the meta-data is fetched from the SSD and written to the meta-data ungrouping buffer in the host's DRAM, step 1024. If the meta-data is grouped, an ungrouping process is executed to ungroup the meta-data, step 1026. The ungrouped meta-data can be read from the meta-data ungrouping buffer and delivered to the host, step 1028.

Figure 16C:
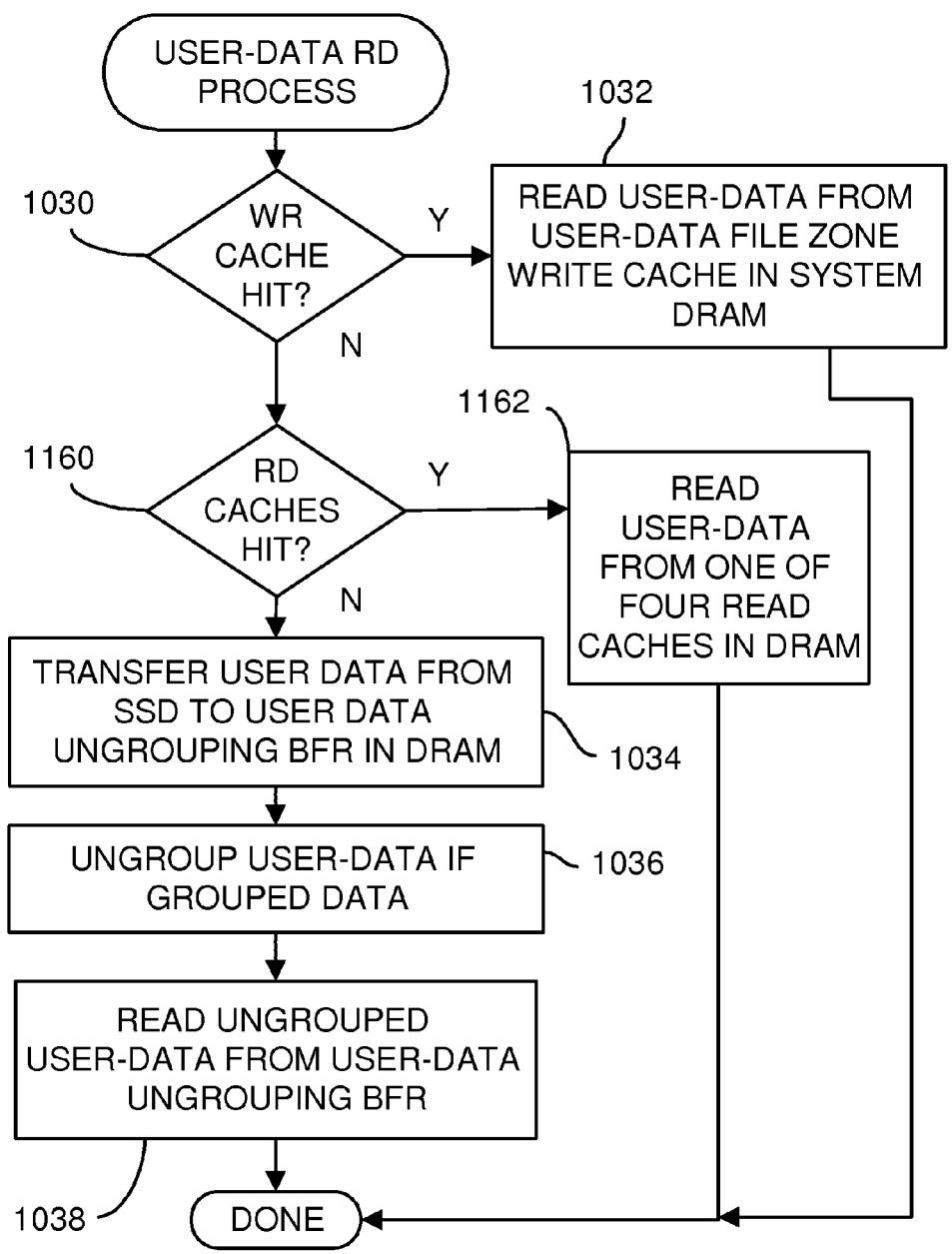

FIG. 16C shows the user-data read process. When the requested user-data is found in the user-data file zone write cache in the host's DRAM, (286 in FIG. 6), step 1130, then the requested user-data can be read from this write cache and delivered to the host, step 1032. The write cache holds data that was recently written by the host. The requested user-data could also be in one of the four read caches for the four combinations of data, RA/FA, RA/NFA, NRA/FA, and NRA/NFA. User data is loaded into these caches based on read access, not necessarily when the host wrote the data.

When the requested user-data is found in one of the four read caches in the host's DRAM, (290, 291, 292, 293 in FIG. 6), step 1160, then the requested user-data can be read from this read cache with the cache hit and delivered to the host, step 1062.

When the requested user-data is not in any of the five caches, steps 1130, 1160, the user-data is fetched from the SSD and written to the user-data ungrouping buffer in the host's DRAM, step 1034. If the user-data is grouped, an ungrouping process is executed to ungroup the user-data, step 1036. The ungrouped user-data can be read from the user-data ungrouping buffer and delivered to the host, step 1038. The ungrouped data is stored to one of the four read caches.

Figure 16D:
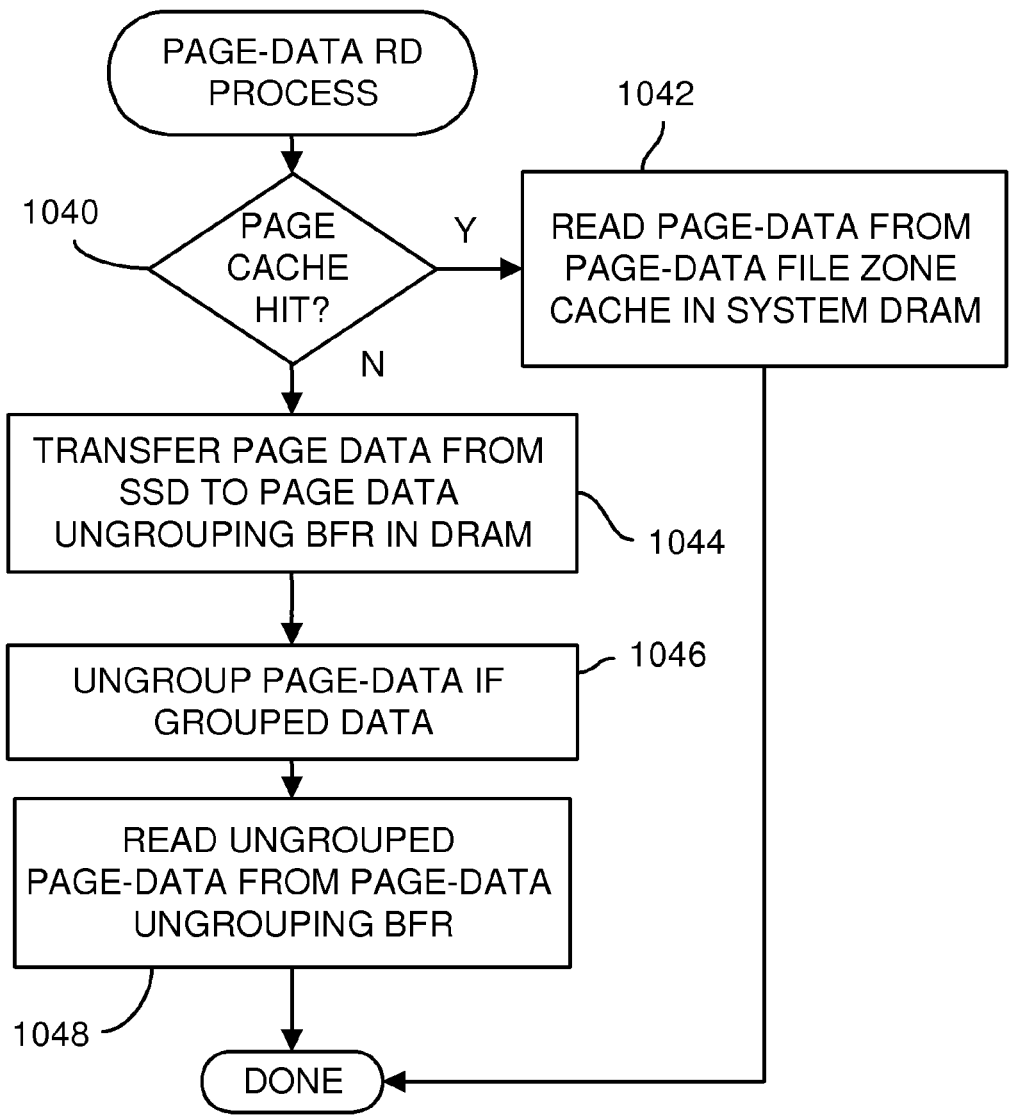

FIG. 16D shows the paging-data read process. When the requested paging-data is found in the paging-data file zone cache in the host's DRAM, (232 in FIG. 6), step 1140, then the requested paging-data can be read from this cache and delivered to the host, step 1042.

When the requested paging-data is not in the cache, step 1140, the paging-data is fetched from the SSD and written to the paging-data ungrouping buffer in the host's DRAM, step 1044. If the paging-data is grouped, an ungrouping process is executed to ungroup the paging-data, step 1046. The ungrouped paging-data can be read from the paging-data ungrouping buffer and delivered to the host, step 1048.

Figure 16E:
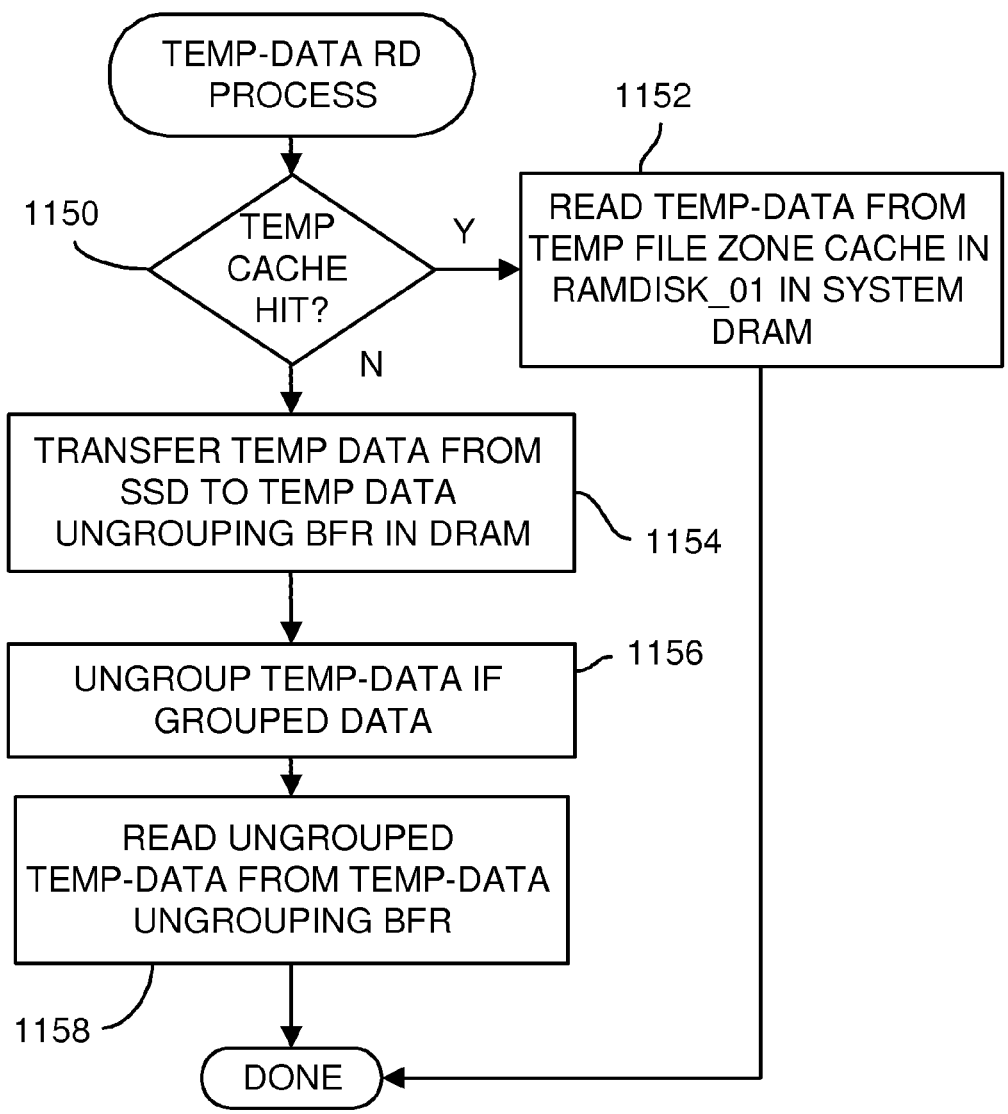

FIG. 16E shows the temp-data read process. When the requested temp-data is found in the temp-data file zone cache in ramdisk_01 in the host's DRAM, (288 in FIG. 6), step 1150, then the requested temp-data can be read from this cache and delivered to the host, step 1052.

When the requested temp-data is not in the cache, step 1150, the temp-data is fetched from the SSD and written to the temp-data ungrouping buffer in the host's DRAM, step 1054. If the temp-data is grouped, an ungrouping process is executed to ungroup the temp-data, step 1056. The ungrouped temp-data can be read from the temp-data ungrouping buffer and delivered to the host, step 1058.

Figure 17A:
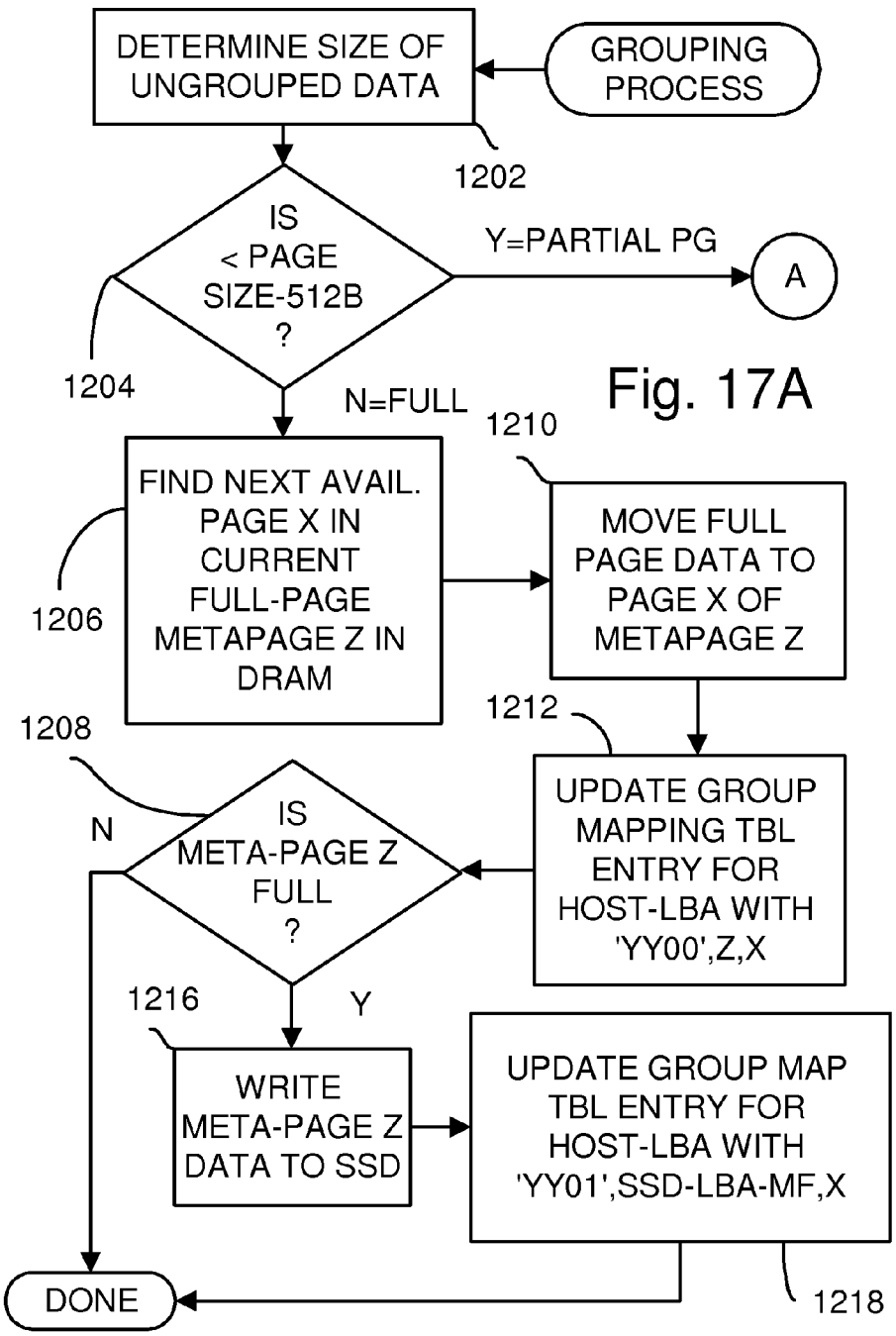

FIGS. 17A-B show a grouping process into meta-pages. A meta-page is a multiple of pages in size. Two separate meta-pages are used for grouping for each data type, one to group full pages and a second to group partial pages.

The total size of the new ungrouped data being added to the grouped data is determined, step 1202. When the size of the new data is within 512 bytes of the full page size, the new data is considered to be a full page, step 1204. If the new data is more than one page in size, each page may be processed separately.

When the new data is a full page, step 1204, the next available page location X in the current meta-page Z that is grouping full pages is found, step 1206. The new full page of data is moved to location X within meta-page Z, step 1210. The corresponding entry in the group mapping table is updated for the newly added data, step 1212. The host's LBA for the data, HOST-LBA, the data type YY00, the meta-page number Z, and the page location X within meta-page Z are recorded in the entry.

When the meta-page Z is full, step 1208, then meta-page Z is written to the SEED or SSD, step 1216. The group mapping table entry for the host LBA is modified to point to the full meta-page (MF) in SSD with the pointer SSD-LBA-MF, step 1218, while still indicating page location X. The last data type bit is changed to one to indicate SSD storage rather than DRAM storage, YY01.

FIG. 17B shows grouping of a new partial page into meta-page M used for grouping partial pages. The next available location A(N) within meta-page M for partial page data is located, step 1226. The new partial page data is moved to meta-page M starting at location A(N), step 1220. Overhead such as a header are also moved with the new data.

The corresponding entry in the group mapping table is updated for the newly added data, step 1222. The host's LBA for the new data, HOST-LBA, the data type YY10, the meta-page number M, and the starting location A(N) within meta-page M, and the length of the data and overhead are recorded in the entry. The third data type bit is set to 1 to indicate a partial page rather than a full page.

When the meta-page M is full, step 1228, then meta-page M is written to the SEED or SSD, step 1236. The group mapping table entry for the host LBA is modified to point to the partial meta-page (MP) in SSD with the pointer SSD-LBA-MP, step 1238, while still indicating starting location A(N), and the length. The last data type bit is changed to one to indicate SSD storage, YY11.

FIG. 18 shows encryption and compression processing by the VMD driver. Compression/decompression engine 242, and encryption/decryption engine 240 in FIGS. 1, 2 may perform these functions. When the host writes data that is intercepted by VMD driver 100, the file extension is checked. Audio, video, graphics, database, and other file extensions may indicate that the data has already been compressed, such as by a user program. Compression is disabled for these file extensions, step 510.

When encryption is enabled, step 512, encryption keys are used to perform encryption on the file, step 514. An encryption flag is set for this file in the file system, step 516. Optionally, temp and paging data types are not encrypted/decrypted.

When compression is enabled, step 518, the file is compressed, step 520. A header is added with an identifier for the compression algorithm used, and the new data size, step 522.

A compression flag is set for this file in the file system, step 524. Optionally, temp and paging data types are not compressed or decompressed.

Figure 19B:
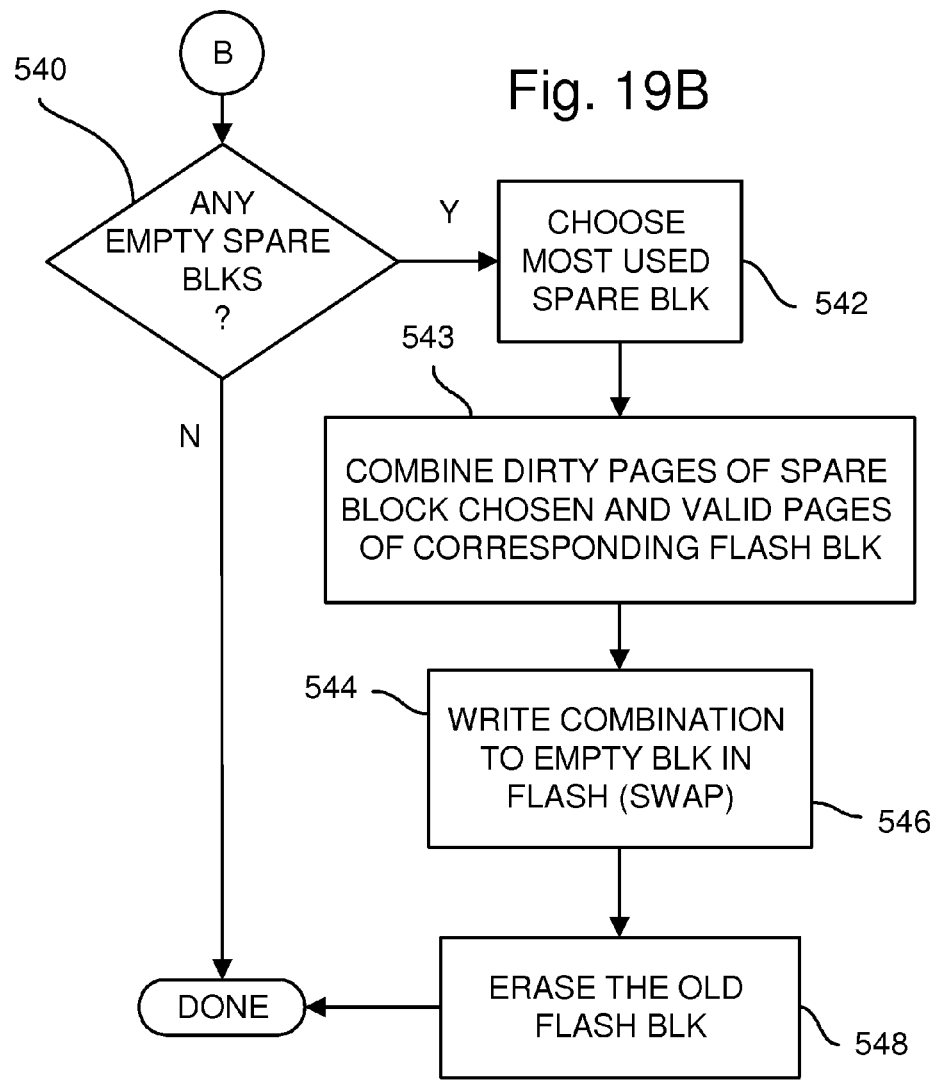

FIGS. 19A-B show spare/swap processing in the SEED. When new data for an existing page of a flash block arrives, step 530, and the flash page can be written, step 532, then the new data is written to the flash page, step 534.

When the flash page cannot be written, such as when the page is before other pages that have already been written in the block, and the flash memory only allows pages to be written in a forward sequence, step 532, but a spare block is available for the block, step 536, then the new data is written to the same page of the spare block in SSD DRAM buffer 194, step 538.

When the flash page cannot be written and no spare is available, the new data is written into and empty spare block in SSD DRAM buffer 194, step 528. The process continues in FIG. 19B. When other empty spare blocks are available, step 540, then the process ends.

When no more spare blocks are available, step 540, then a spare block with the most pages written, or least frequently accessed, is chosen, step 542. Dirty pages from the chosen spare block are combined with valid pages from the old block that are written into the chosen spare block, step 543. The combined pages in the chosen spare block are written to an empty block in flash, the swap block, step 546. The old chosen block is erased, step 548.

Figure 20A:
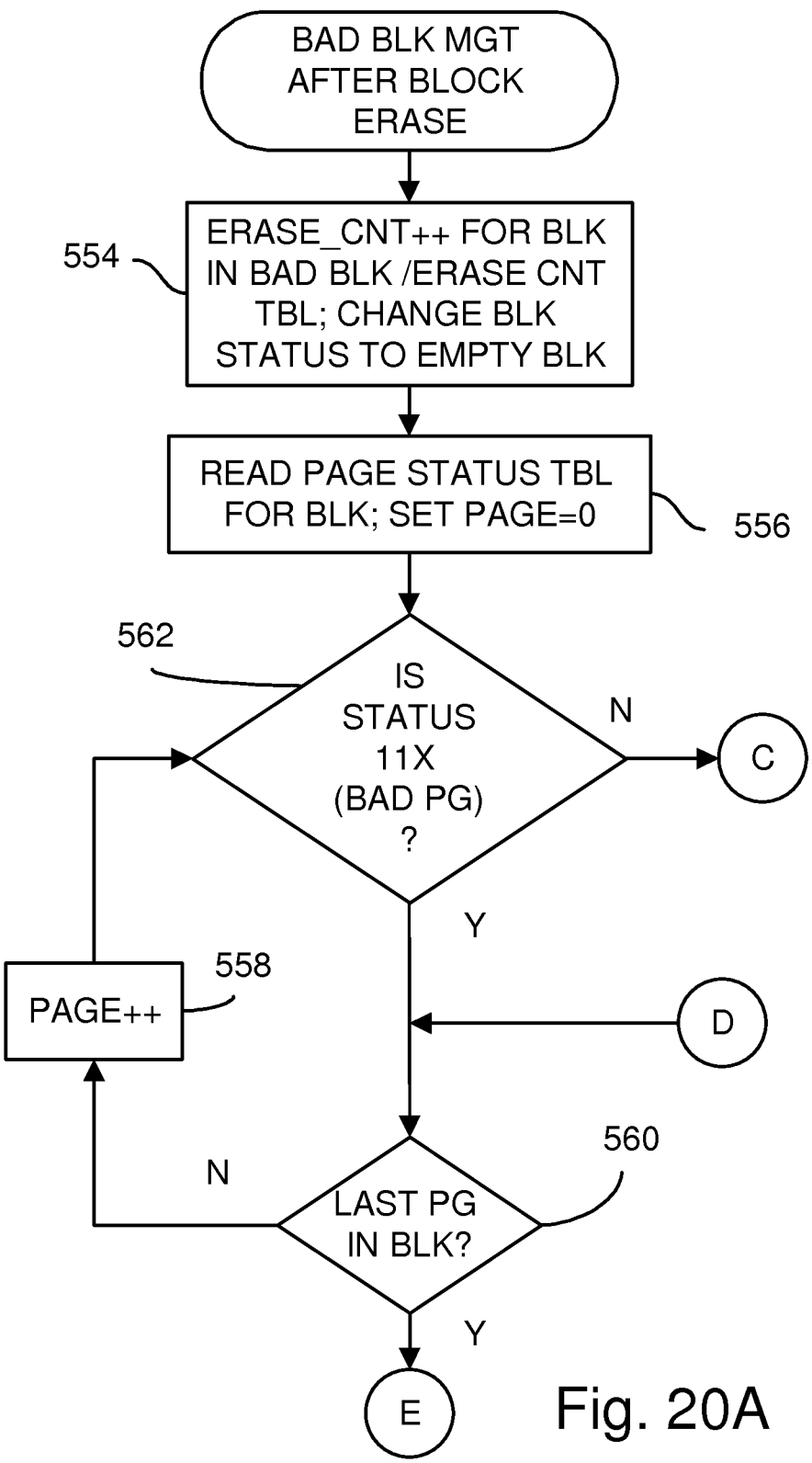
FIG. 20A-D show a process for detection and handling of bad pages and bad blocks.

FIG. 20A-D show a process for detection and handling of bad pages and bad blocks. In FIG. 20A, once a block in flash memory has been erased, the erase counter for that physical block is incremented and the block status is changed to either empty block (000) or empty block with bad pages (100), depending on the previous block status and current page status, step 554. The bad block erase count table is stored in SSD DRAM buffer 194 and backed up to NAND flash memory 196 if there is not sufficient space in DRAM. The bad block erase count table includes an erase counter for each physical block, and a status for that block. The block status can be a three-bit value, with 000 indicating an empty good block, 011 and 111 indicating a bad block, and 100 indicating a partially-bad block that has some bad pages and some good pages.

The bad block erase count table may also include page status tables that track bad pages within a block. A value of 000 for the page status indicates a good page, 001 indicates a protected page that uses a 100-bit second-level ECC rather than a 25-bit first level ECC, 010 indicates the page was used, 110 indicates the page has garbage/trimmed data, and 11X indicates a bad page.

After the block is erased, the status of each page in that block is checked. The page status table for the physical block is read, step 556, and the current page is initialized to page 0. When the status for the current page is 11X, step 562, the current page has already been marked as a bad page. No further processing for this page is needed. When the current page is not beyond the last page in the block, step 560, the current page is incremented to the next page in the block, step 558, and the process repeats for the next current page at step 562.

Figure 20B:
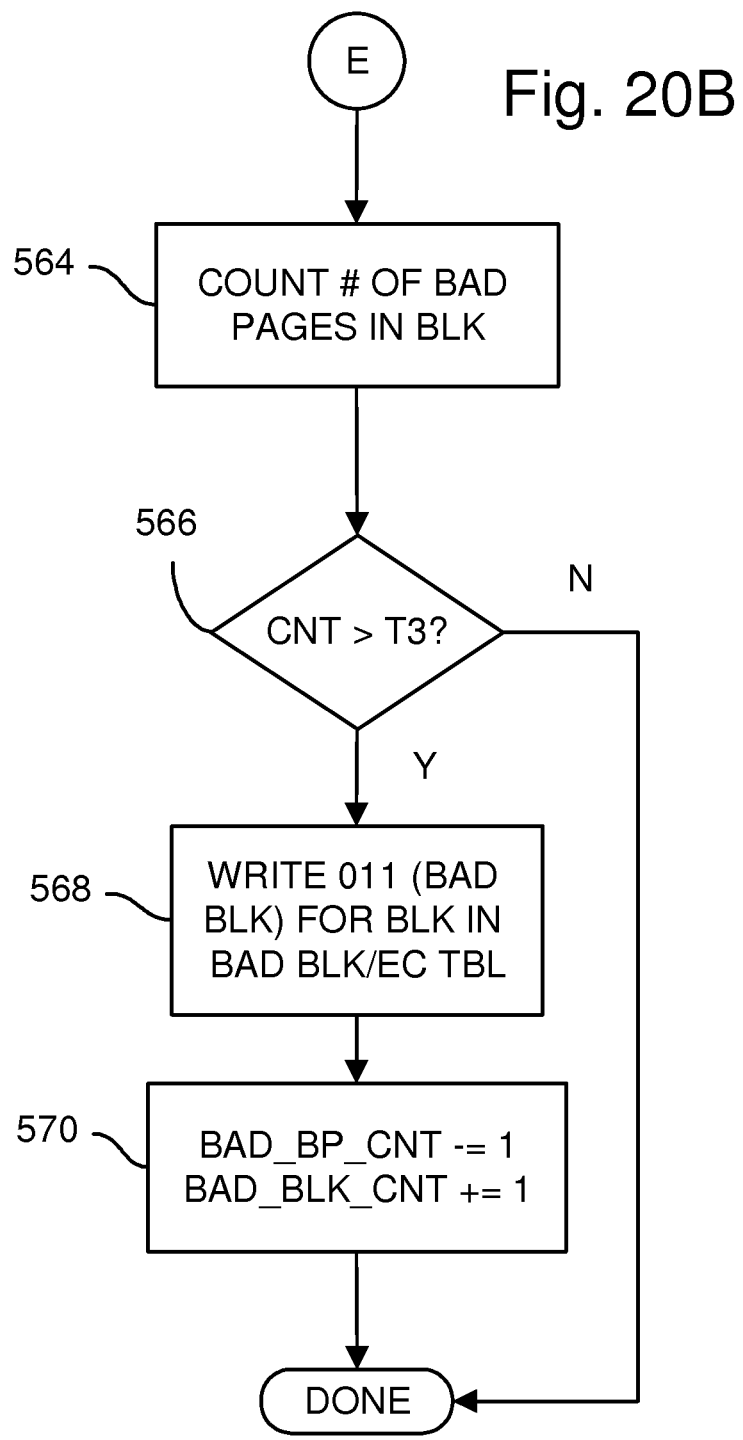

In FIG. 20B, all pages in the physical block have been processed. The number of bad pages in the block is determined, step 564. When the count of bad pages in the block exceeds threshold T3, step 566, the block is declared a bad block. The block status for this physical block is changed to 011 in the bad block erase count table, step 568. The physical block is no longer used. The partially-bad block counter (BAD_BP_CNT) is decremented and the bad block counter is incremented, step 570 for S.M.A.R.T. information.

Figure 20C:
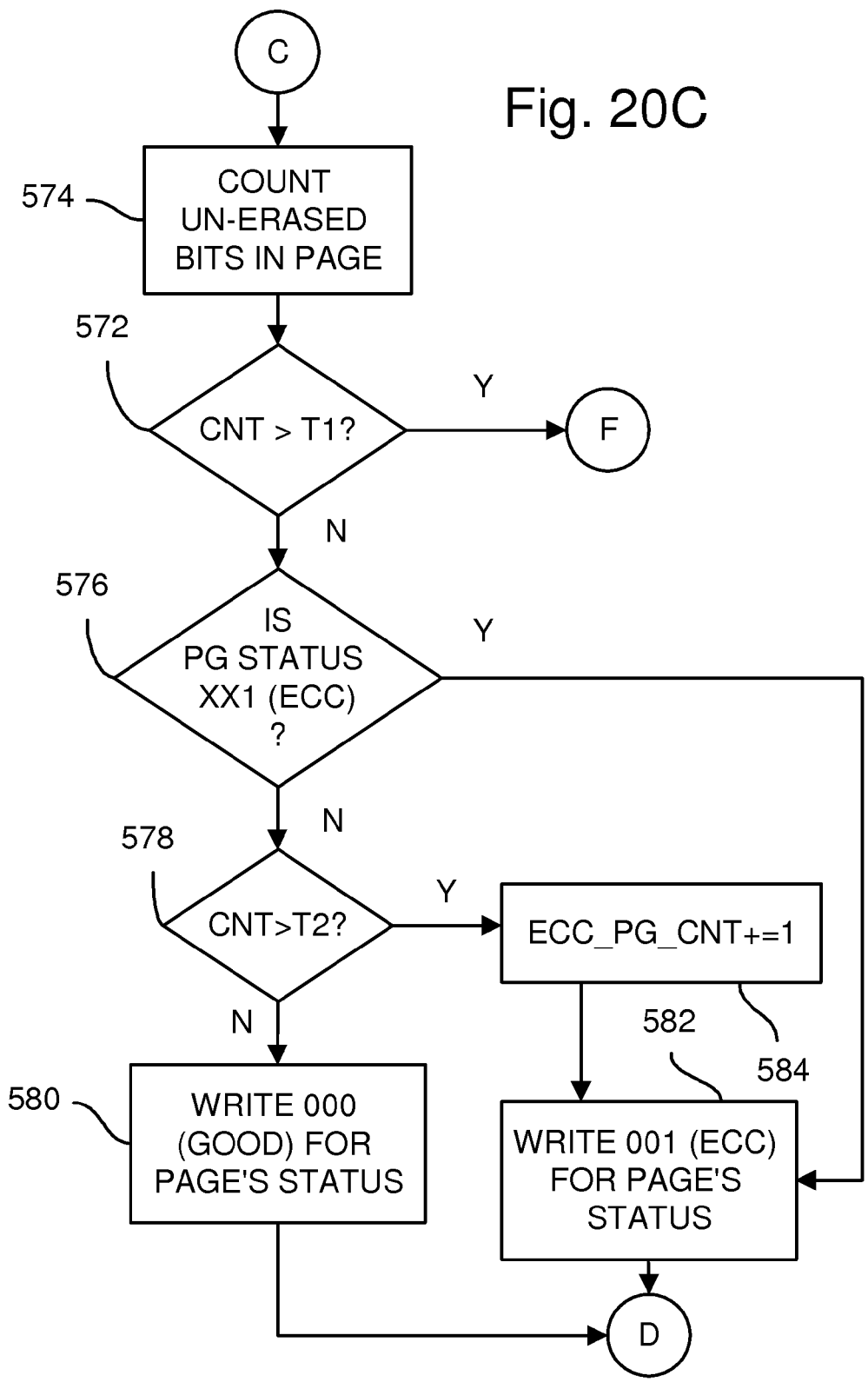

In FIG. 20C, the current page had not previously been marked as a bad page, step 562 (FIG. 20A). The erase operation erases all bits in the page to an erased value, such as 1. The bits in the current page are read to see if all the bits are erased. A count is obtained, step 574, of the number of bits in the page that are in the un-erased state, such as 0 bits. These are faulty bits. However, ECC may be able to correct these errors, so the page may still be usable if the number of bit error is small.

When the un-erased bit count is less than a first threshold T1 (indicating too many error bits, increasing the risk to use this page even with the extra software ECC protection), step 572, and the current page status is page needs protection (XX1), step 576, then the page is already marked as needing protection by second-level ECC. The page status is changed to empty page needing protection (001), step 582. The next current page is processed by returning to FIG. 20A.

When the un-erased bit count is less than the first threshold T1, step 572, and the current page status is not a page needing protection (XX1), step 576, then the page is not yet protected by second-level ECC. When the un-erased bit count is greater than a second threshold T2 (indicating a level of error bits that may result in future fatal errors and needing extra software ECC help to correct the errors), step 578, the second-level ECC page counter is incremented, step 584 and the page status is changed to 001, step 582, and the second-level ECC will be used in the future when host data is stored in this physical page. The next current page is processed by returning to FIG. 20A.

When the page is not yet protected by second-level ECC, step 576, and the un-erased bit count is not greater than the second threshold T2, step 578, the page status is good. The first-level ECC is sufficient to correct the expected errors in this current page. The page's status is changed to 000, step 580, if it is not already marked as a good page. The next current page is processed by returning to FIG. 20A.

Figure 20D:
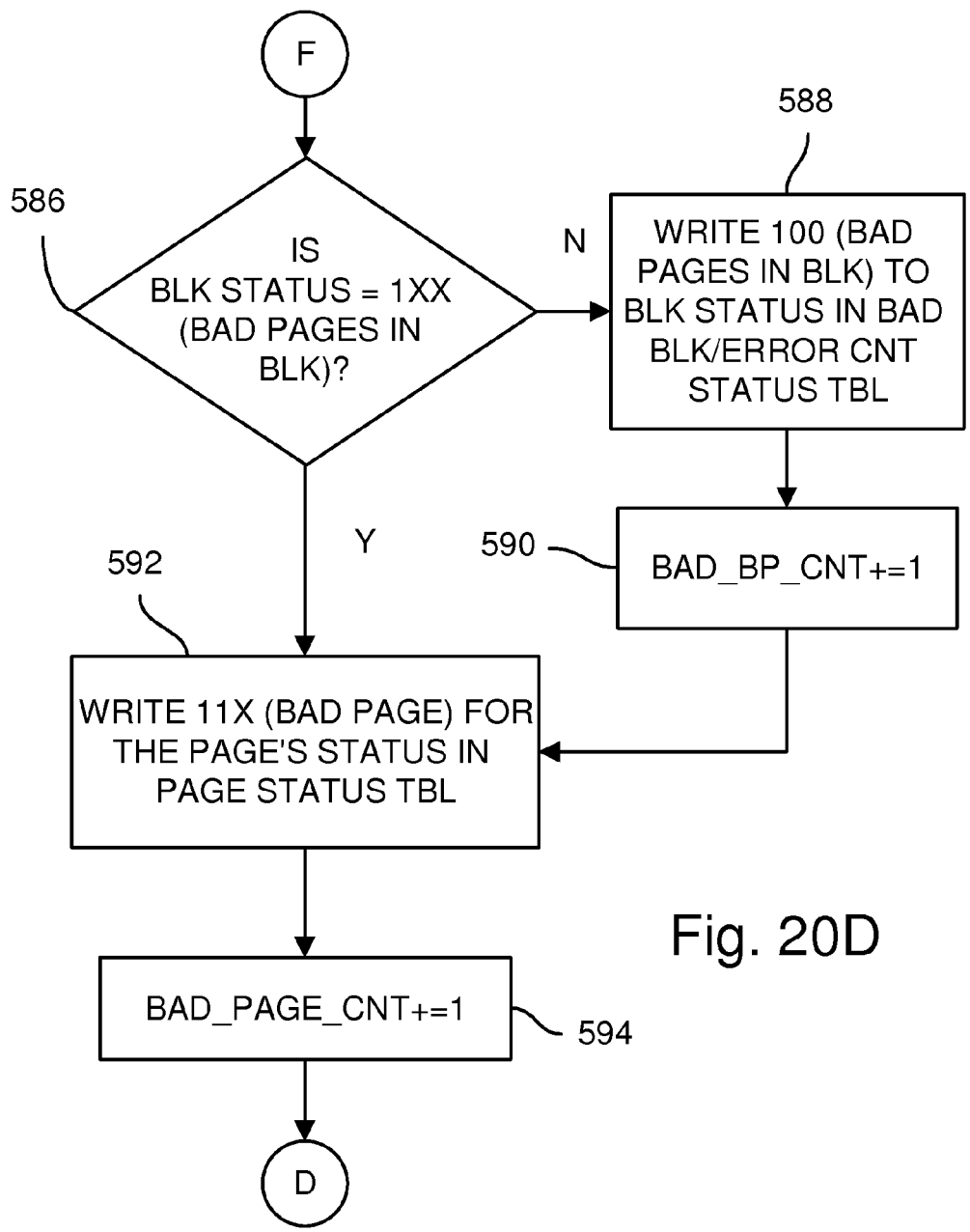

In FIG. 20D, the current page has more than the first threshold T1 of un-erased bits, step 572 (FIG. 20C). Exceeding the T1 threshold indicates that the page has more un-erased bits than can be corrected by the second-level of ECC. The page is bad and cannot be safely used.

When the status for the physical block is bad pages in block (1xx), step 586, the block has already been marked as a bad-page block in the bad block erase count table. There were other bad pages in this block, and no block status change is needed. However, the current page is marked as a bad page by changing the page status to 11X in the page status table, step 592. The bad page counter is incremented, step 594, before the next current page is processed by returning to FIG. 20A.

When the status for the physical block is not 1XX, step 586, the block has not yet been marked as a partially-bad block in the bad block erase count table. There have been no other bad pages in this block. The block's status is changed to empty block with bad pages (100) in block erase count table 164, step 588. The partially-bad block counter (BAD_BP_CNT) is incremented, step 590. Also, the current page is marked as a bad page by changing the page status to 11X in the page status table, step 592. The bad page counter is incremented, step 594, before the next current page is processed by returning to FIG. 20A.

The SSD may contain many flash memory chips (such as 16 flash memory chips). Some special situations may be encountered, such as when one plane of the flash chip is bad or the whole chip is bad. If over provisioned, the flash capacity of the SSD can absorb the loss of capacity of one full plane or the whole flash memory chip. Special algorithms of the device controller can be used to bypass the losses, such as to recover the data and then adjust the meta-page unit size of the flash devices to avoid the faulty plane or chip. Over-provisioning also can be done by using idle chips for the replacement of the failed chip.

Figure 21A:
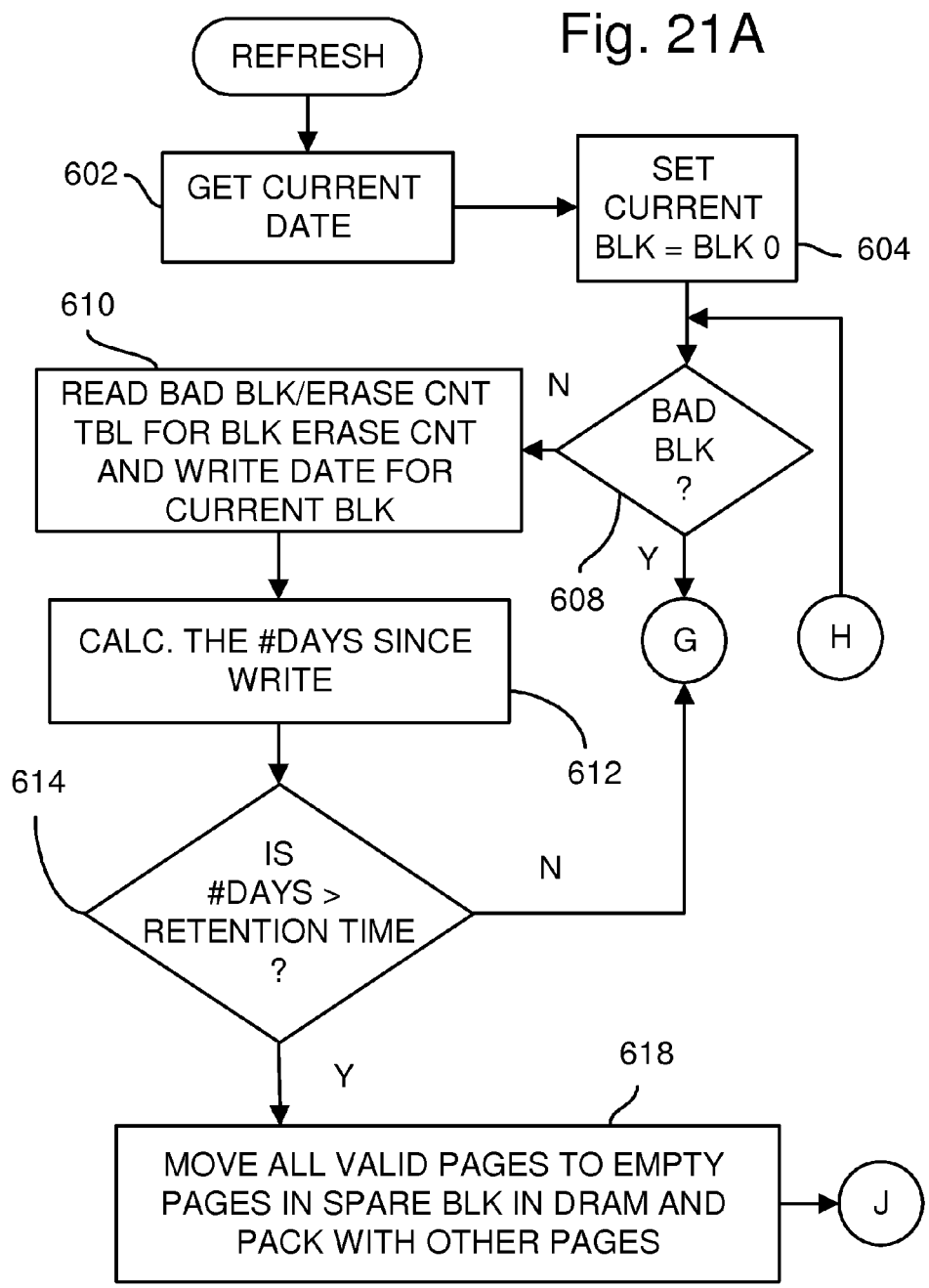
FIGS. 21A-B show a flash block refresh operation using the tables in FIG. 13A.
Figure 21B:
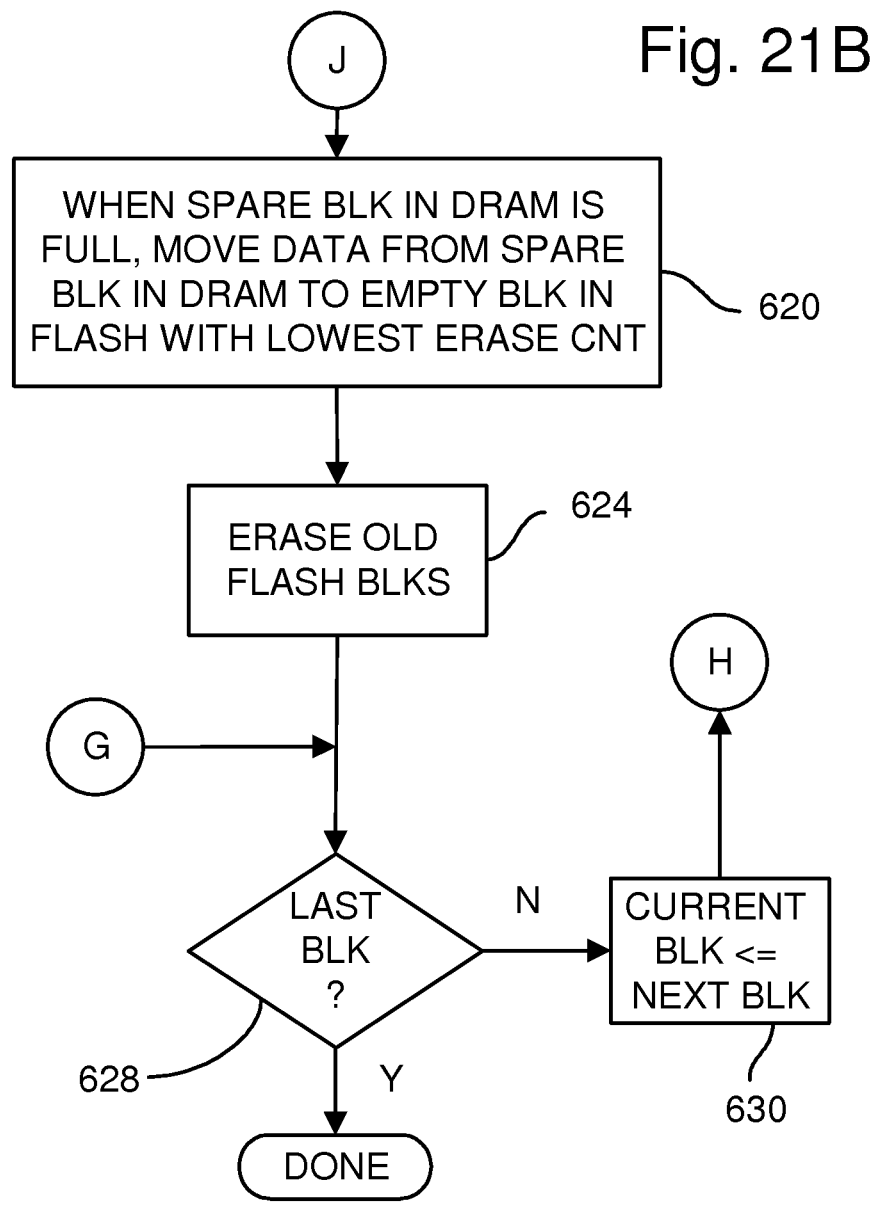

FIGS. 21A-B show a flash block refresh operation using the tables in FIG. 13A. When refresh is initiated, such as periodically (once per week, etc.), the current date is obtained, step 602. The current block is set to the first block, step 604, and if the block is not a bad block, step 608, then the block erase count and the block write date are read from the bad block erase count table, step 610. The number of days since the last write is calculated, such as by subtracting the write date from the current date, step 612. When the number of days since the last write exceeds the retention time, step 614, then all valid pages in the block are moved to empty pages in a spare block, and packed with other pages from previously refreshed blocks at step 618.

In FIG. 21B, when the spare block in the DRAM is full, data from the spare block in DRAM is moved to a spare block in flash with the lowest erase count, step 620. The old flash blocks are erased, step 624. When there are more blocks to process, step 628, the current block is advanced to the next block, step 630.

Figure 22:
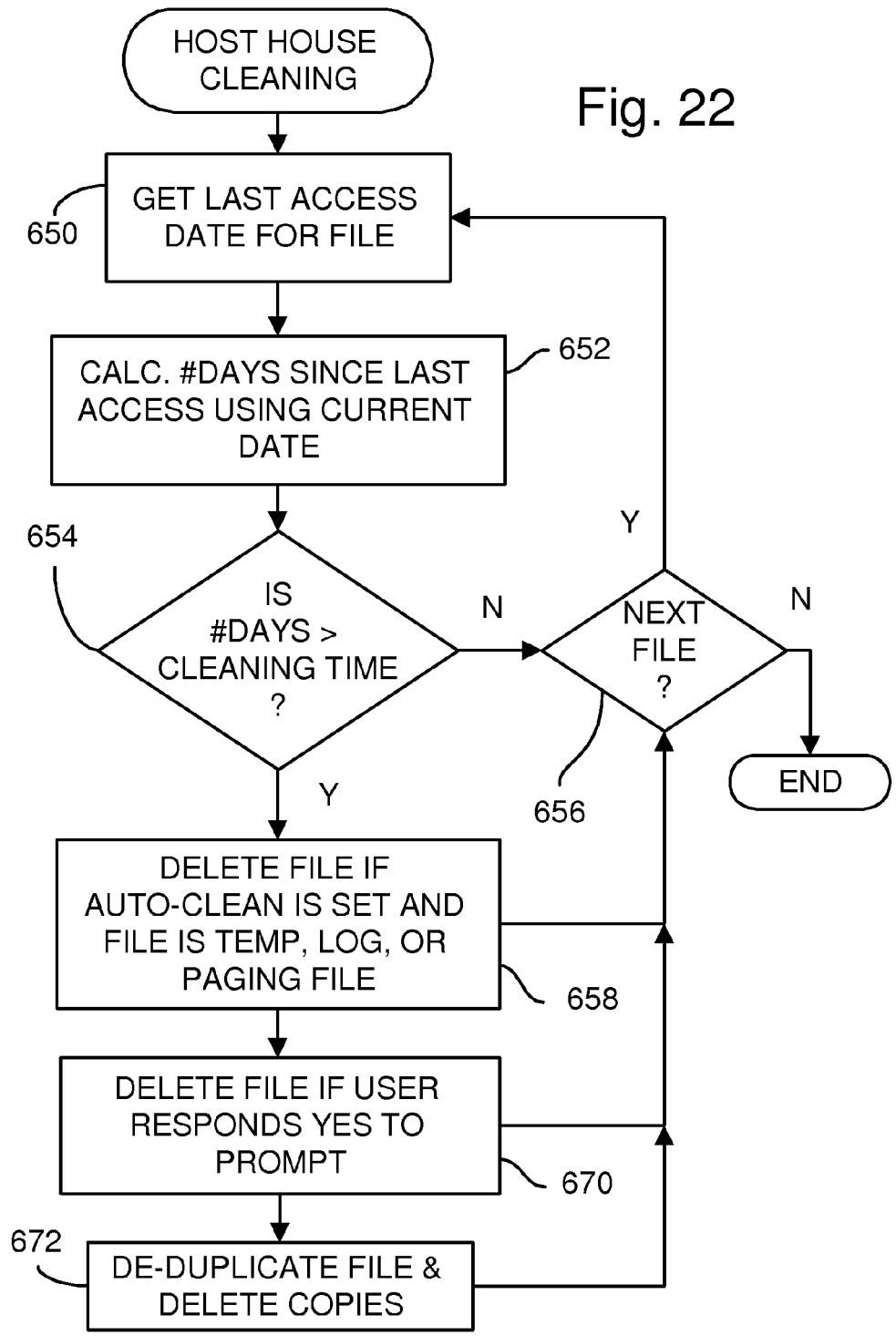
FIG. 22 shows a house cleaning operation executed on the host.

FIG. 22 shows a house cleaning operation executed on the host. The house cleaning operation may operate on some or all files on the host. A file is selected and the last access date for that file is obtained, step 650. The current date is used to calculate the number of days since the last access of that file, step 652. When the number of days is less than the cleaning threshold, step 654, then the file is skipped and the next file selected, step 656. When the number of days since the last access of the file is more than the cleaning threshold, step 654, then the file is deleted if the file type is temp, log, or paging, step 658, and auto-cleaning is configured. The user may be prompted and asked whether to delete the file, step 670, and the file deleted if the user responds yes. If the user selected no to delete the file, duplicates of the file are searched for and the duplicates deleted, step 672, before the next file is selected for house cleaning.

Figure 23:
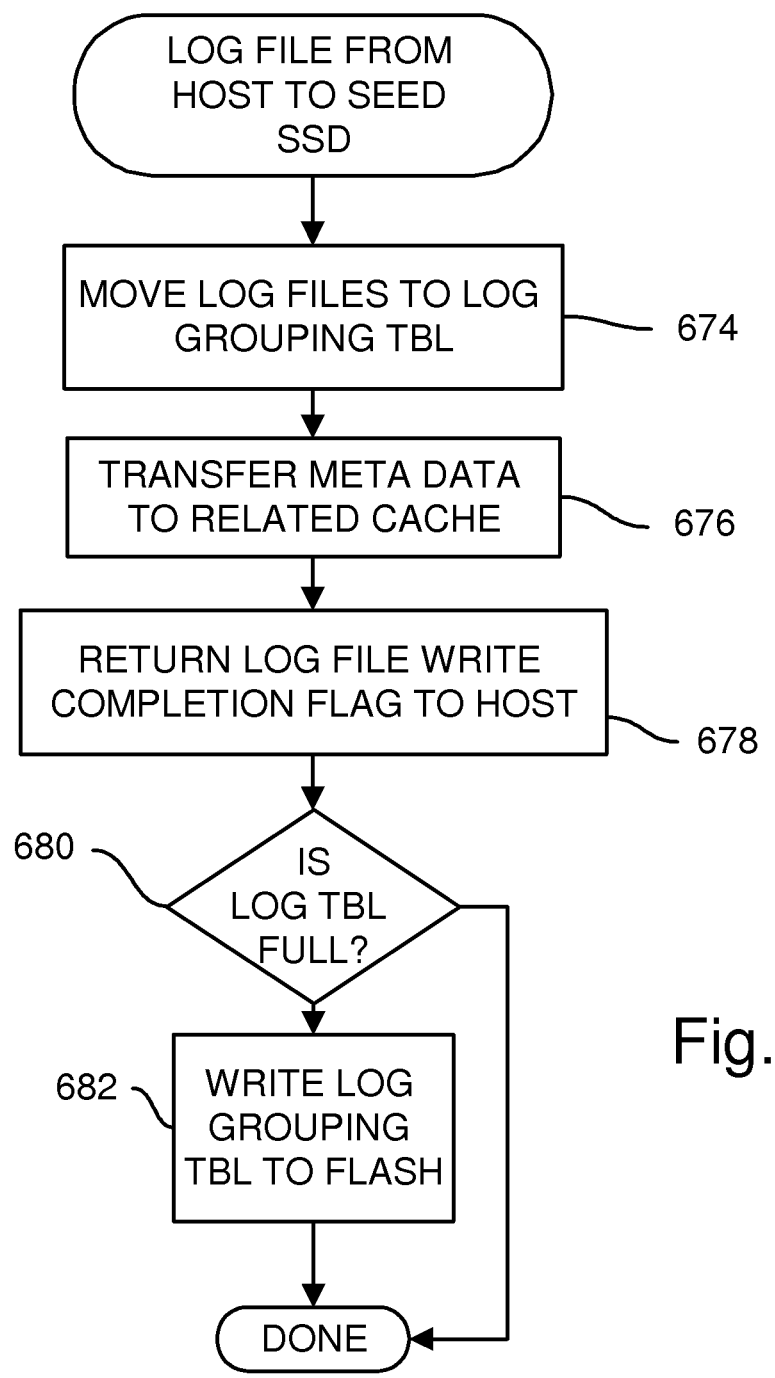
FIG. 23 shows log file reception on the SEED.

FIG. 23 shows log file reception on the SEED SSD from the host. When the SEED receives a log file from the host, the SEED moves the log file to a log grouping table, step 674. Any meta-data related to the log file is transferred to a meta-data cache, step 676. A completion flag is sent back to the host from the SEED to indicate that the log file was successfully written, step 678.

When the log table is full, step 680, then the log grouping table is written to flash memory, step 682.

Figure 24:
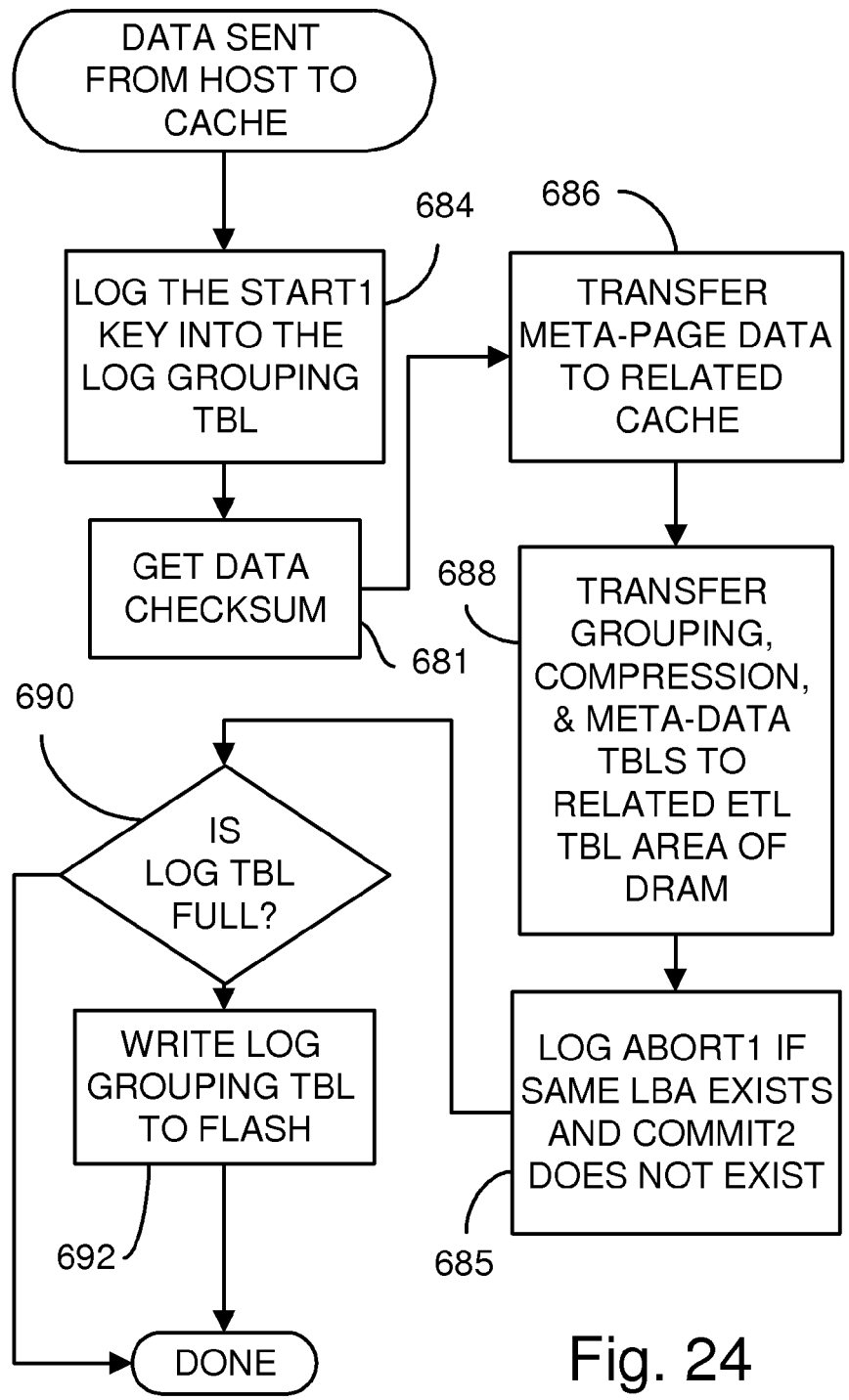
FIG. 24 is a flowchart of logging a host write to a DRAM cache.

FIG. 24 is a flowchart of logging host write data to a SEED SSD DRAM cache. When the host data is written into SSD DRAM buffer 194, the start1 key or flag is written to the log grouping table together with its LBA address, sequence number, and data checksum, step 684. A checksum of the write data is generated, step 681. The log is written first before the actual movement of the write data. The write data from host are in a meta-page form and the meta-page data is transferred to a related cache, step 686. Various meta-data tables, such as for FAT, FDB, grouping, compression, and other meta-data are transferred to related ETL table areas of SSD DRAM buffer 194, step 688. The abort1 flag is logged if the same LBA with an old sequence number is found but no log with commit2 flag is found for that LBA, step 685. The new data will overwrite the old data in the same LBA address. The old data is not written to flash. When the log table is full, step 690, then the log grouping table is written to flash memory, step 692.

Figure 25:
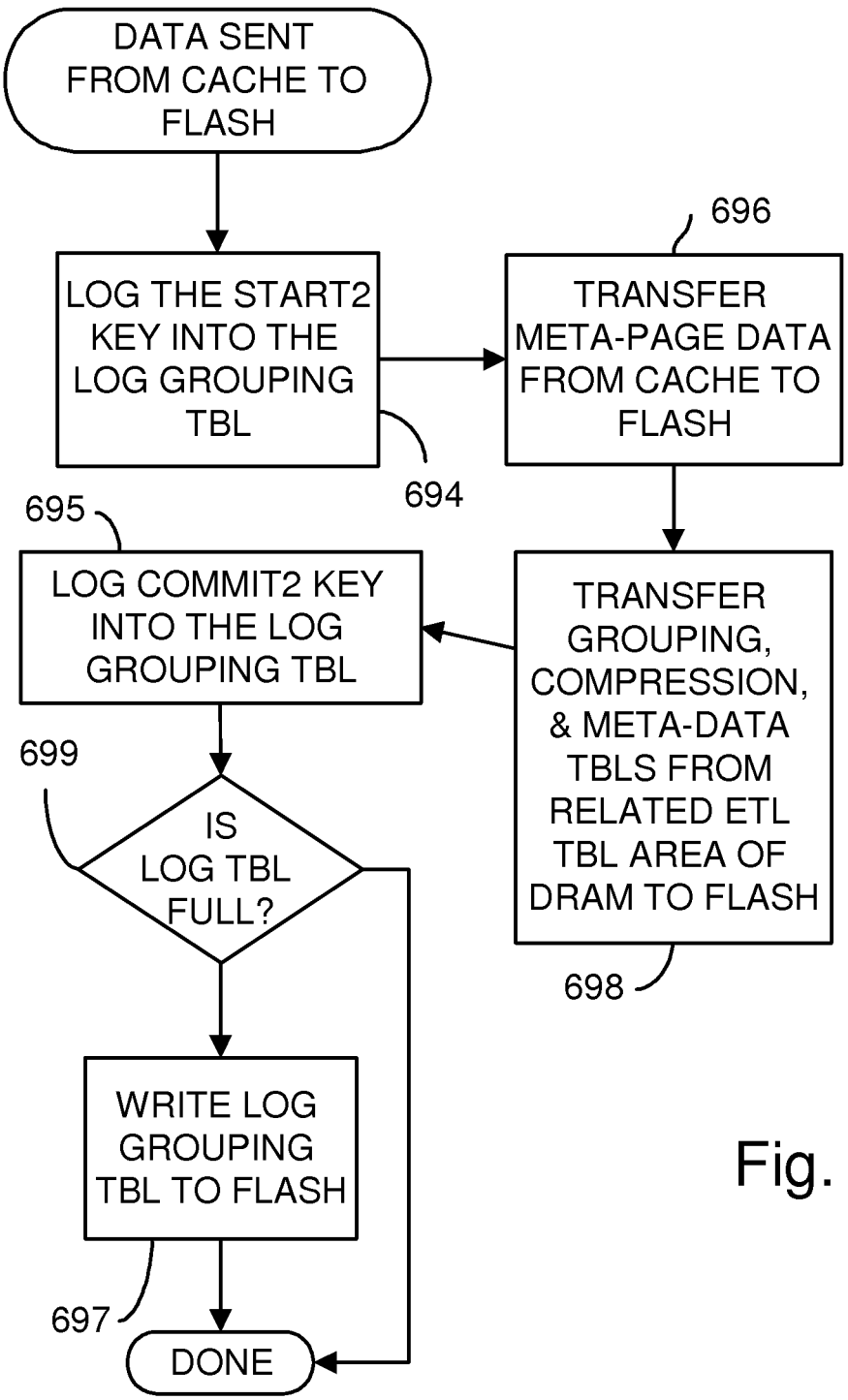
FIG. 25 is a flowchart of logging a write to flash memory from the DRAM cache in the SEED.
Figure 26:
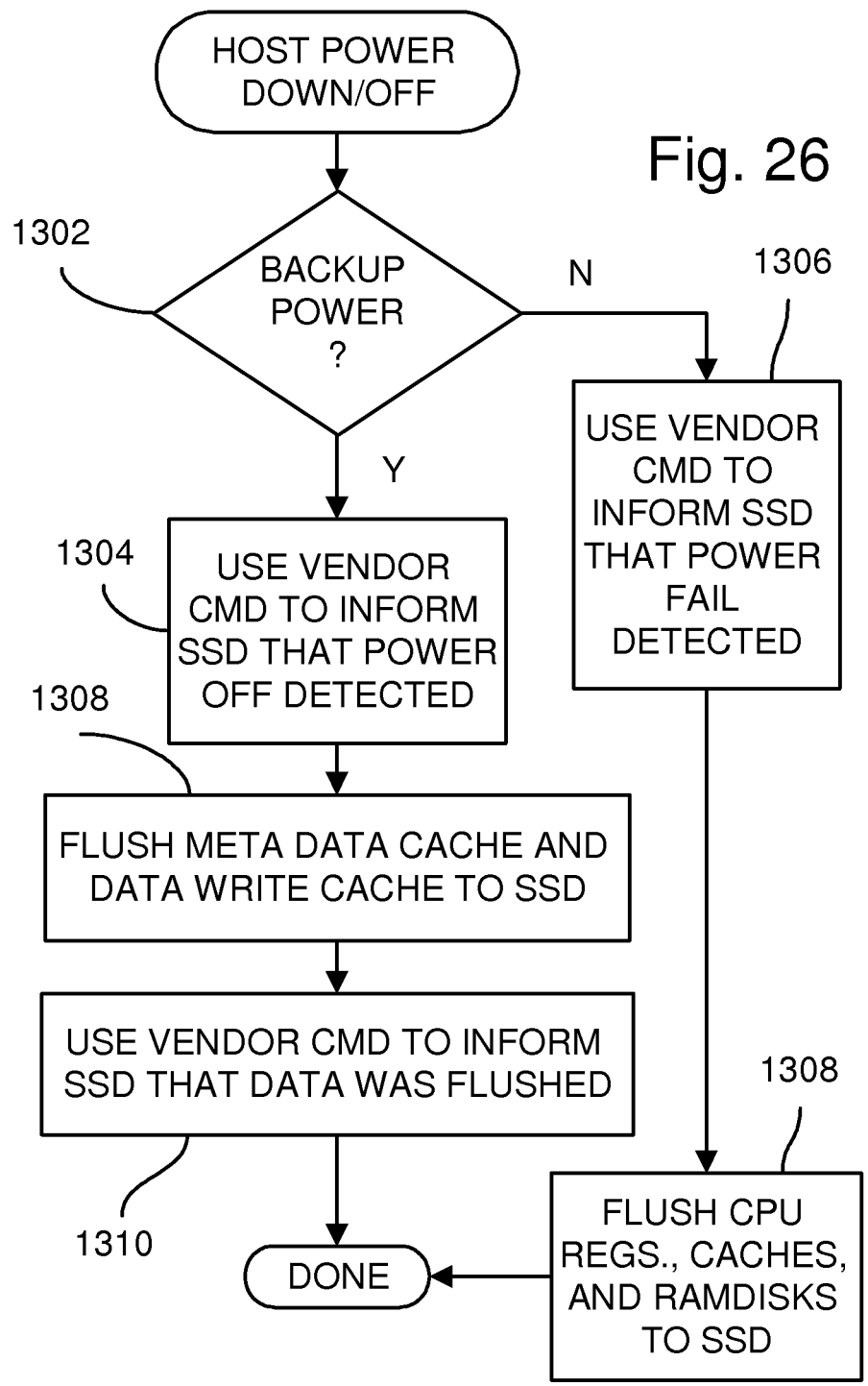
FIG. 26 is a flowchart of a power down sequence on the host.

FIG. 25 is a flowchart of logging a write to flash memory from the DRAM cache in the SEED. When the SEED transfers data from SSD DRAM buffer 194 to NAND flash memory 196, the start2 key or flag is written to the log grouping table, step 694. The write to flash data is in a meta-page form, step 696. Various meta-data tables, such as for grouping, compression, and other meta-data are transferred from the related ETL table areas of SSD DRAM buffer 194 to flash memory, step 698. The commit2 flag is logged into the log grouping table, step 695. When the log table is full, step 699, then the log grouping table is written to flash memory, step 697. The "start1" flag logs the start of data movement to DRAM while "start2" logs the start of write data to flash, "commit2" logs the completion of data moving to flash, 'abort1' logs that the data was overwrite by new data at the same LBA.

Figure 36:
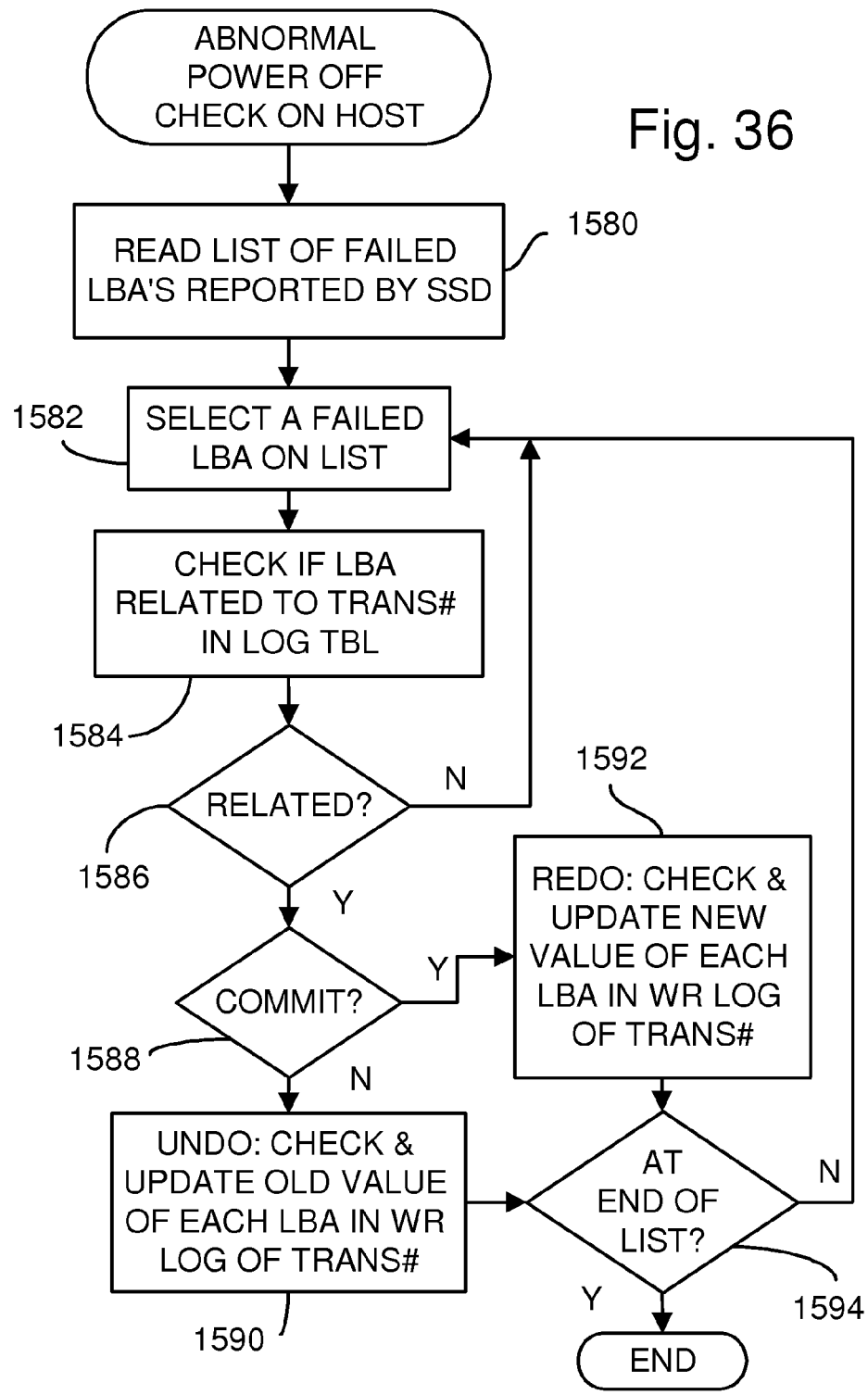
FIG. 36 shows an abnormal power off check performed on the host.

FIG. 36 is a flowchart of a power down sequence on the host. When the host loses power, and no backup power is available for the host, step 1302, then a vendor command is used to inform the SEED or SSD that a power failure is detected, step 1306. The host flushes registers and caches of CPU, caches, and ramdisks to the SEED SSD, step 1308. The system should provide power to help finish the flush of data to the SEED SSD.

When backup power is available, step 1302, then a vendor command is used to inform the SEED or SSD that a normal power down is detected, step 1304. The host flushes meta-data and data write caches to the SSD, step 1308. CPU registers, other caches, and ramdisks are not flushed since a controlled power down occurred and the host would have retained critical data. The host sends a vendor command to the SSD to indicate that the data was flushed, step 1310.

FIG. 27 is a flowchart of power down processing on the SEED. When the host sends the power down vendor command to the SSED, the SEED exits garbage collection, step 1312, and continues receiving data from host, and at the same time starts flushing data in spare/swap DRAM blocks, meta-data caches, and data write caches to flash memory, step 1314. Once host data flushing is done, step 1316, the SEED does not flush any temp file or paging file data in DRAM, marks any FDB entries as obsolete, and clears any FAT entries, and marks the pages in the bad page table as garbage, step 1318. The ETL tables and data are flushed to flash memory, step 1320. S.M.A.R.T. monitoring information is recorded and a normal power down status is recorded, step 1322.

FIG. 28 is a flowchart of power failure processing on the SEED. When the host sends the power failure vendor command to the SSED, the SEED exits garbage collection, step 1332, and receives various flushed data from the host which is written to a predetermined flash area.

Registers and caches of the CPU data flushed from the host are received into the flush data area of SSD DRAM buffer 194 and then written to the predetermined flash area, step 1334. Flushed cache data from the host is received into the flush data area and then written to the predetermined flash area, step 1336. Flushed ramdisk data from the host is received into the flush data area and then written to the predetermined flash area, step 1338.

Data from SSD DRAM buffer 194 for spare/swap DRAM blocks, user data, the bad page status tables, ETL data and ETL tables are written to the predetermined flash area, step 1339. S.M.A.R.T. monitoring information is recorded and an abnormal power off status is recorded, step 1324.

Figure 29A:
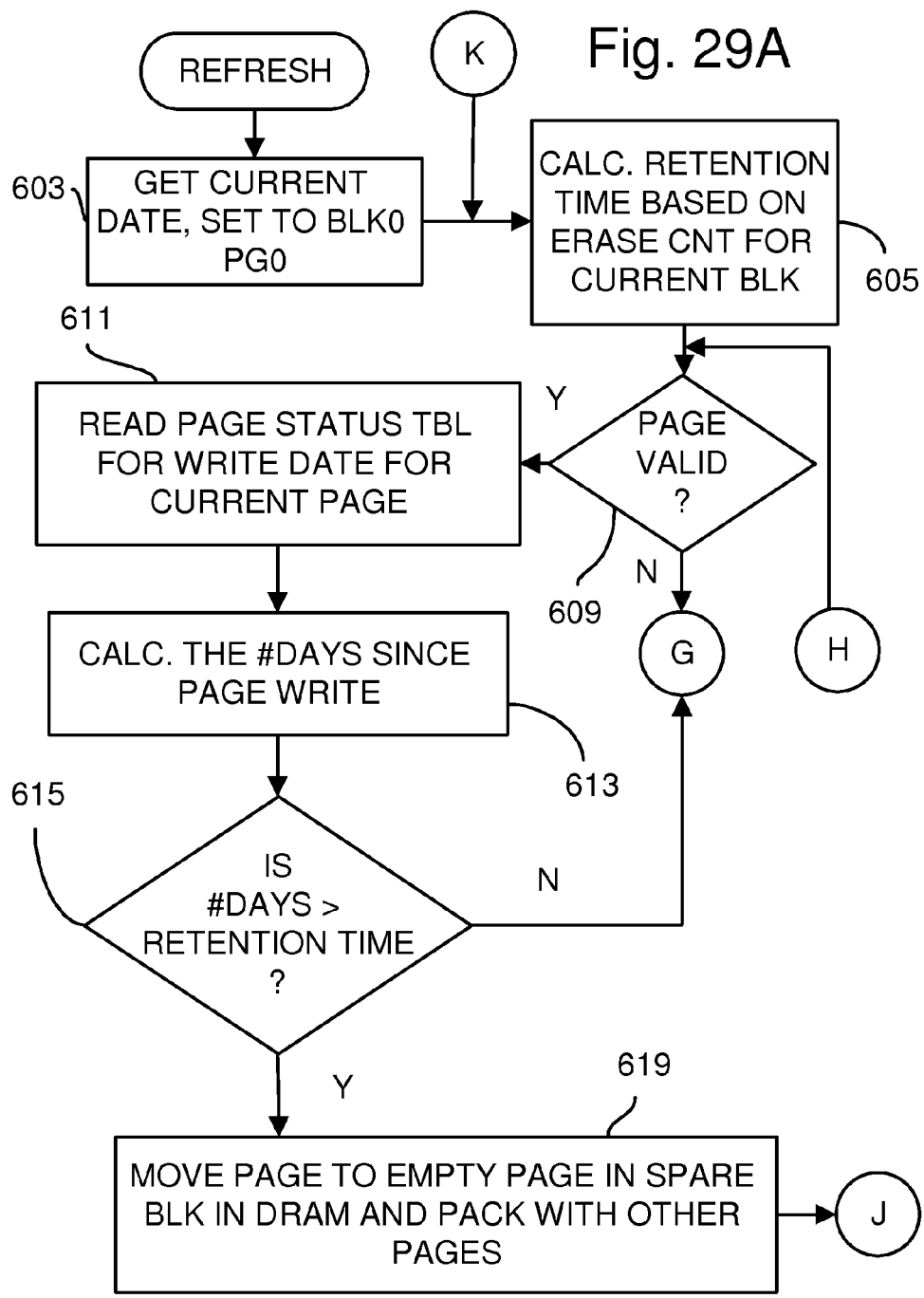
FIGS. 29A-B show a flash page refresh operation using the tables in FIG. 13B.
Figure 29B:
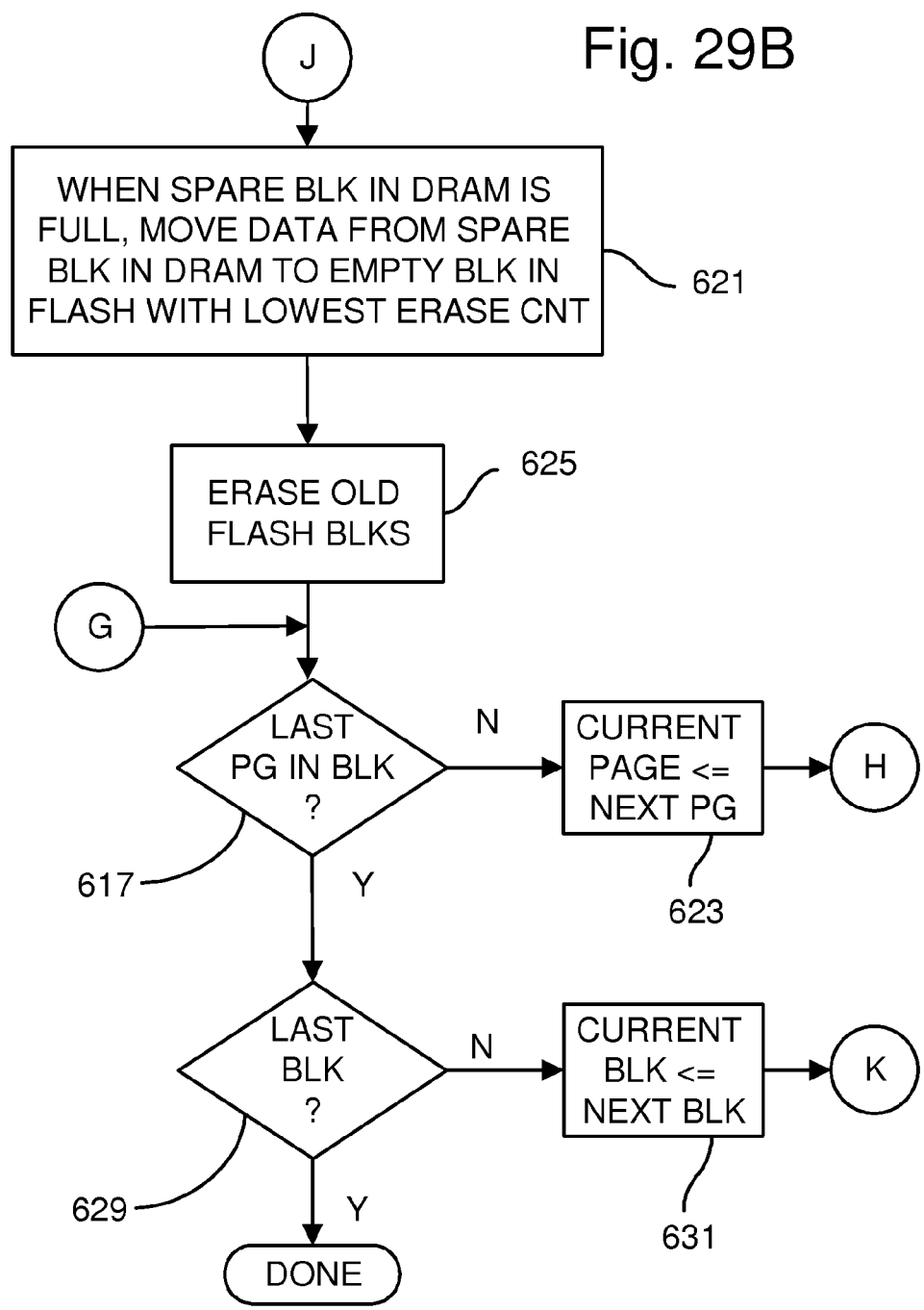

FIGS. 29A-B show a flash page refresh operation using the tables in FIG. 13B. When refresh is initiated, such as periodically (once per week, etc.), the current date is obtained, step 603. The current block and page are set to the first block, first page. The retention time for the current block is calculated as a function of the erase count for the current block, step 605. For example, blocks with low erase counts could have a longer retention time.

When the current page is a valid used page, step 609, then the page status table is read for the page write date, step 611. The number of days since the last write is calculated, such as by subtracting the write date from the current date, step 613. When the number of days since the last write exceeds the retention time, step 615, then the current page is moved to an empty page in a spare block, and packed with other pages needing refresh, step 619.

In FIG. 29B, when the spare block in the DRAM is full, data from the spare block in DRAM is moved to a spare block in flash with the lowest erase count, step 621. Then the old flash blocks are erased, step 625. When there are more pages to process in the current block, step 617, the current page is advanced to the next page, step 623. When there are more blocks to process, step 629, the current block is advanced to the next block, step 631.

Figure 30A:
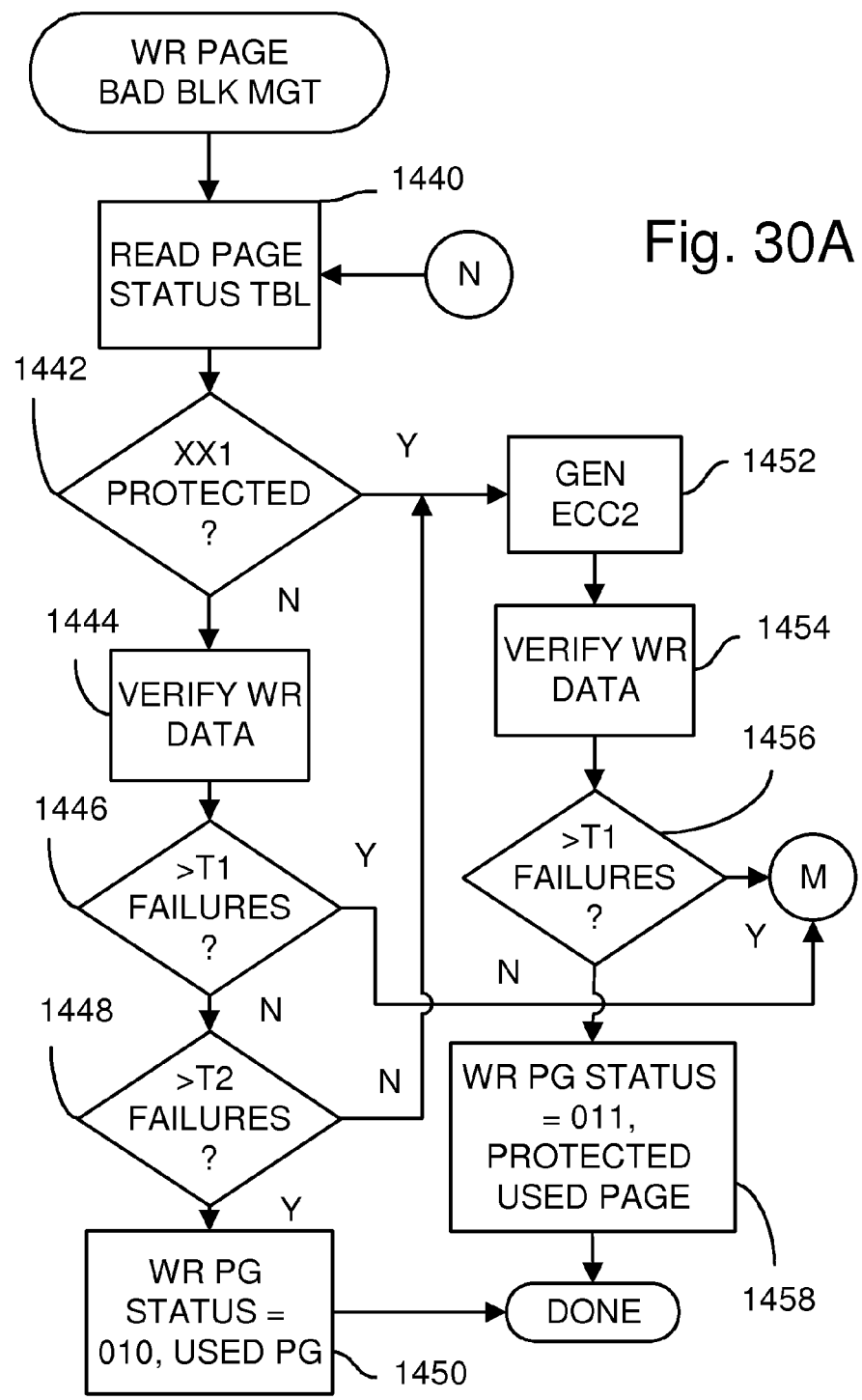
FIG. 30A-B show a process for bad page management during a page write.
Figure 30B:
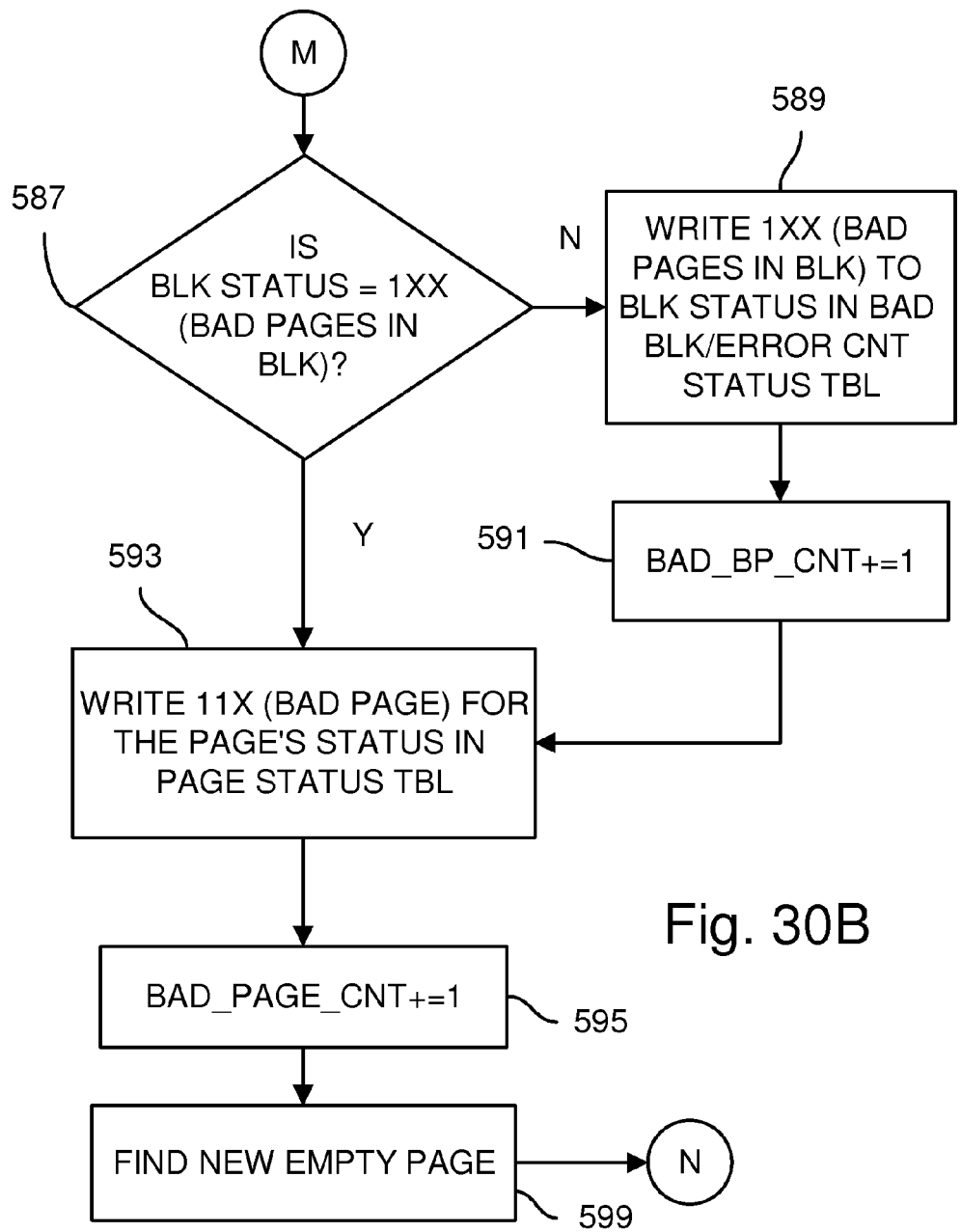

FIG. 30A-B show a process for bad page management during a page write. In FIG. 30A, when a page is to be written to flash memory, the page status table is read, and the page is not a bad page and is an empty page, step 1440. When the page status is protected, XX1, step 1442, then the second level of error code, ECC2, is generated for the page, step 1452. The write data is verified, step 1454, and when less than the T1 threshold of errors occur, step 1456, then the page status is written as 011, a used protected page, step 1458, to the page status table.

When the page status is not protected, XX1, step 1442, then write data is verified, step 1444, and when less than the T1 threshold of errors occur, step 1446, and less than the second threshold T2, step 1448, then the page status is written as 010, a used page, step 1450, to the page status table. In step 1448, when more than T2 errors are detected, the second-level ECC2 is generated, step 1452, and the page becomes a protected page.

When more than T1 errors occur in steps 1446 or 1456, the process continues in FIG. 30B. When the block status read is 1XX, a block with bad pages in the block, step 587, then the page status is written as 11X, bad page, in the page table, step 593. The bad page count is incremented, step 595, and a new empty page is located for receiving the host write data, step 599.

When the block status read is not yet 1XX, step 587, then the block status is changed to 1XX in the bad block erase count table, step 589. The block with bad pages (BP) counter is incremented, step 591, and the page status changed to 11X, step 593.

Figure 31A:
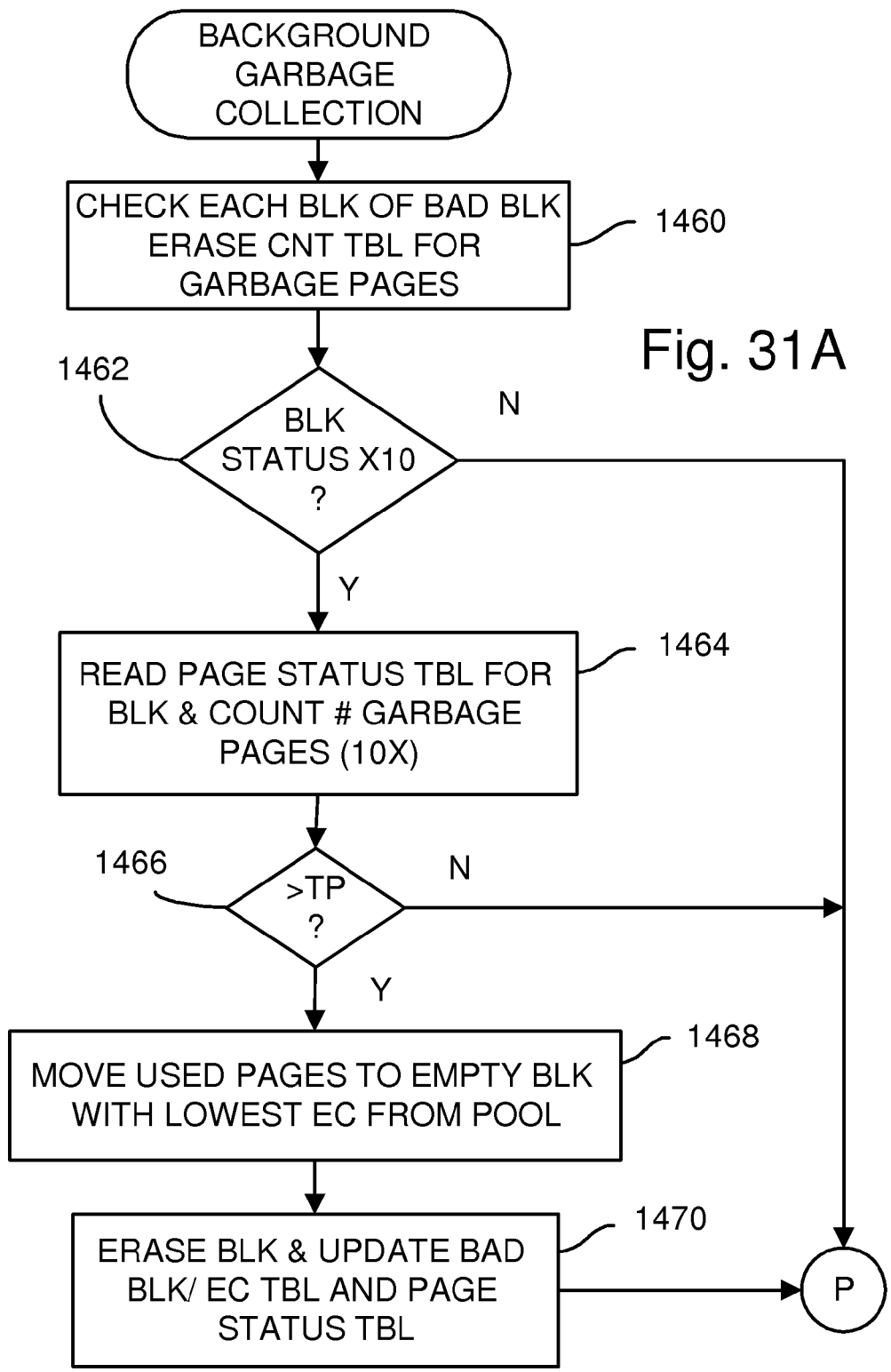

FIGS. 31A-B show a background garbage collection process. When the background garbage collection process is periodically activated, each block entry in the bad block erase count table is examined, step 1460, to locate garbage pages that contain trimmed or stale data that is discardable. When the block status is X10, block with garbage pages, step 1462, then the page status tables are read for that block, and the number of garbage pages are counted, step 1464. When the number of garbage pages exceeds threshold TP, step 1466, then the used (not garbage, 010 and 011) pages in that block are moved to an empty block with a lowest erase count that was selected from an empty block pool, step 1468. The block with garbage pages is erased, step 1470, and the bad block erase count table and the page status tables are updated to show the erased status.

In FIG. 31B, a list of blocks from the empty block pool is created for the lowest-erase count blocks, step 1472. The erase count of each block is read, step 1474, and when the erase count of a non-empty block is less than threshold TE, then data is moved from a low erase-count block to a block with a highest erase count, step 1480. The threshold may be increased, step 1482. This moves old data that has not been updated for a long time to a more worn block, so the more worn block can receive less updating, and freeing up a low-erase-count block for future write/erase cycles.

FIG. 32 is a flowchart of host VMD initialization. When the host OS boot process finishes, the host checks to see if VMD is enabled, step 1500. If enabled, the host loads and executes VMD application 180, step 1502. The VMD application sets up the cache for the meta-data and tables, step 1504, and sets up ramdisk_01 for temp data, step 1506. Caches are set up for paging data, step 1508, and for write data, step 1510.

Ramdisk_02 for browser data is set up step 1518, and ramdisk_03 is set up for user apps, step 1516. These caches and ramdisks are loaded with data that had been flushed to the flushed data area of the SEED DRAM or flash memory, step 1514. The four read data caches for FA, RA combinations are also set up, step 1512.

Figure 33A:
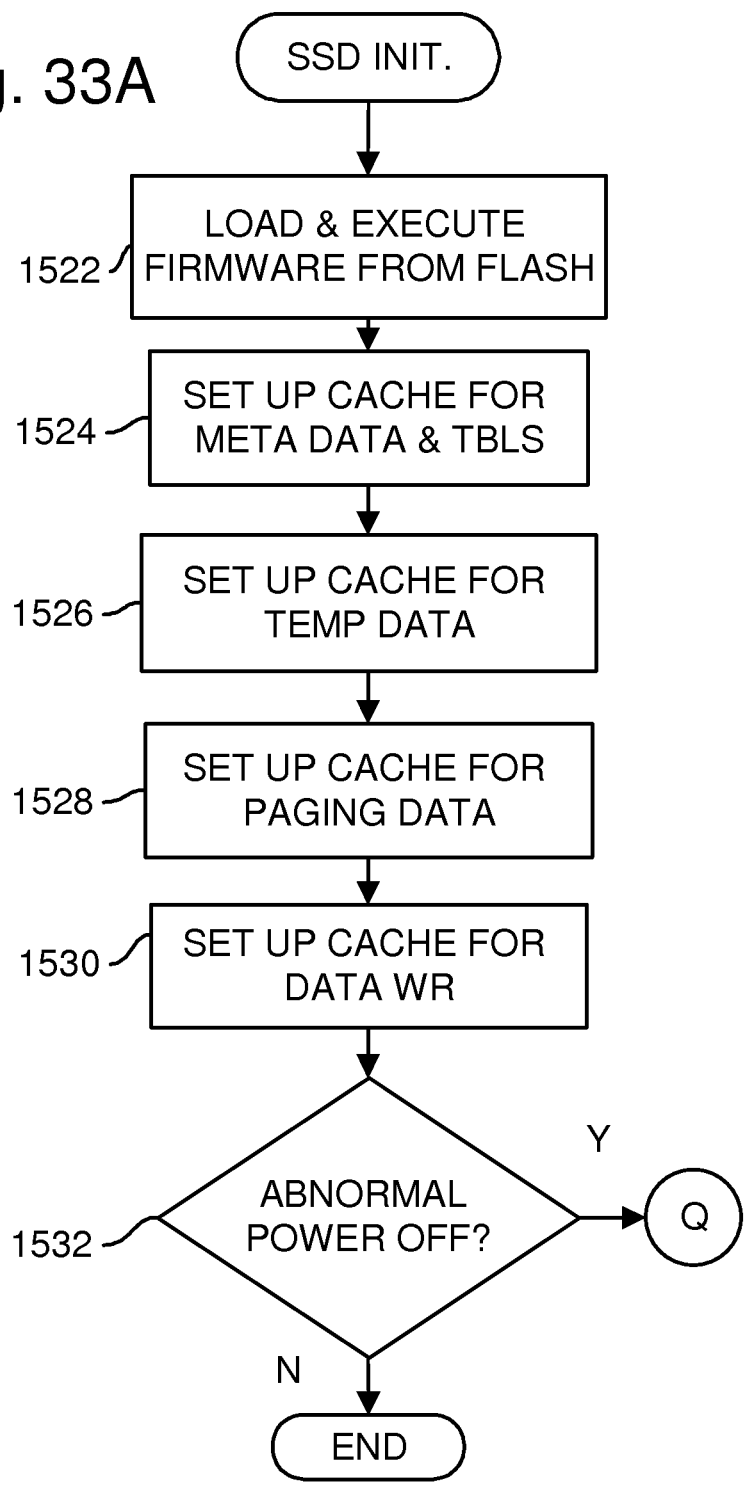
FIG. 33A-B is a flowchart of initialization of the SSD.
Figure 33B:
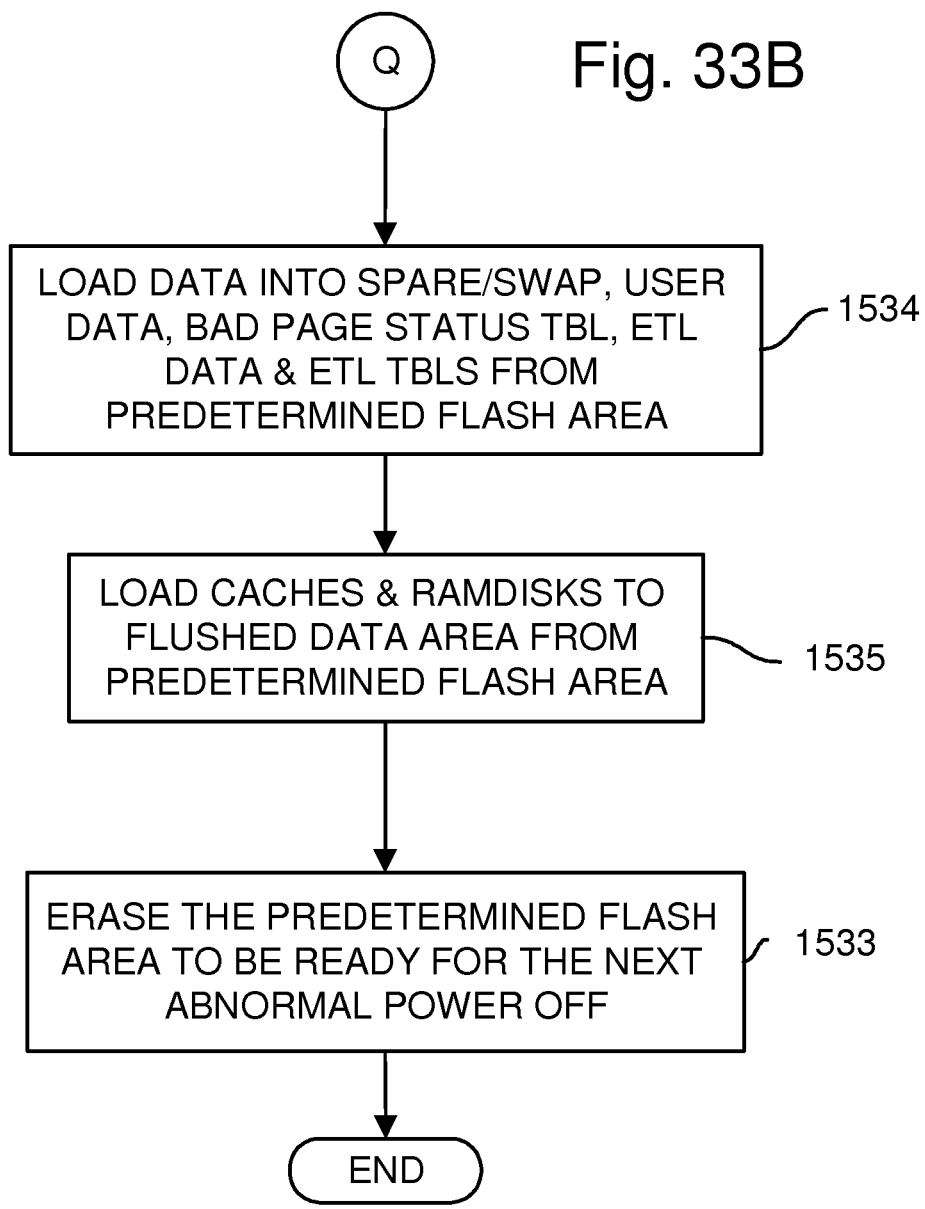

FIG. 33A-B is a flowchart of initialization of the SSD. SSD firmware is loaded from flash and executed, step 1522. The firmware sets up the cache for the meta-data and tables, step 1524, and sets up caches for temp data, step 1526, for paging data, step 1528, and for write data, step 1530. When an abnormal power-off occurred previously, step 1532, then additional step are performed, FIG. 33B.

A predetermined area of flash is read and data are written to the spare/swap, user data, bad page and status tables, ETL data and ETL tables of SSD DRAM buffer 194, step 1534. Caches and ramdisks are loaded with flushed data from a flushed data area of flash memory, step 1535. The predetermined area of flash is then erased, step 1533, so that space is provided should another abnormal power off occur.

Figure 34:
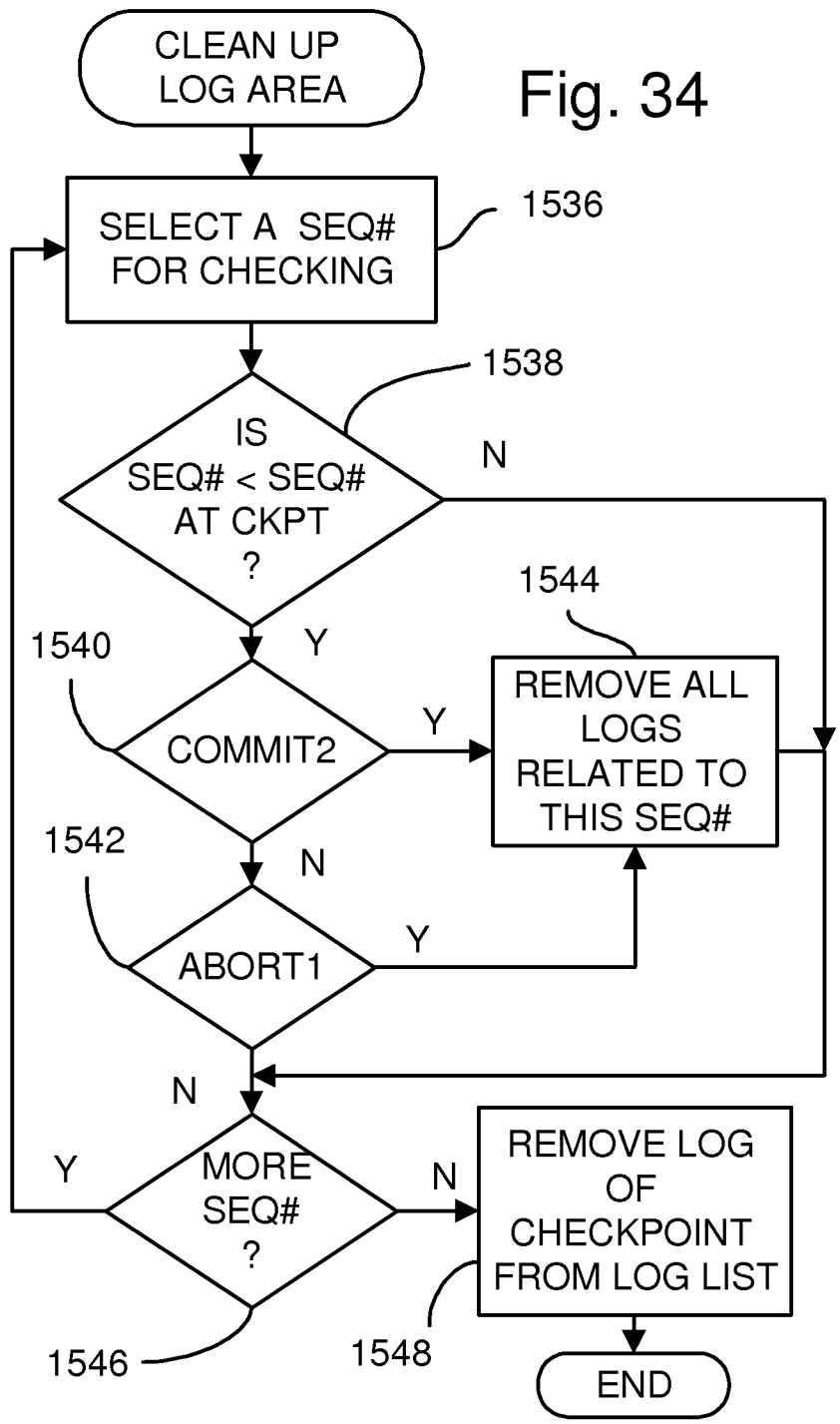
FIG. 34 is a flowchart of cleaning up a log area.

FIG. 34 is a flowchart of cleaning up a log area. It is executed after the checkpoint log insertion. A sequence number is selected for checking, step 1536, and compared to a sequence number of a checkpoint inserted for clean up purposes, step 1538. When the sequence number is before the checkpoint, step 1538, and the Commit2 flag was logged for this sequence, step 1540, then all logs related to this sequence number are removed, step 1544, since the sequence's data was successfully committed to flash memory. When the sequence has the abort1 flag logged, step 1542, then all logs related to this sequence number are removed, since the original LBA data was overwritten by new data with a larger sequence number in DRAM, and no longer needs to move to flash memory, step 1544. When no more sequence numbers remain to be checked before the checkpoint, step 1546, then the log of the checkpoint is removed, step 1548.

Figure 35:
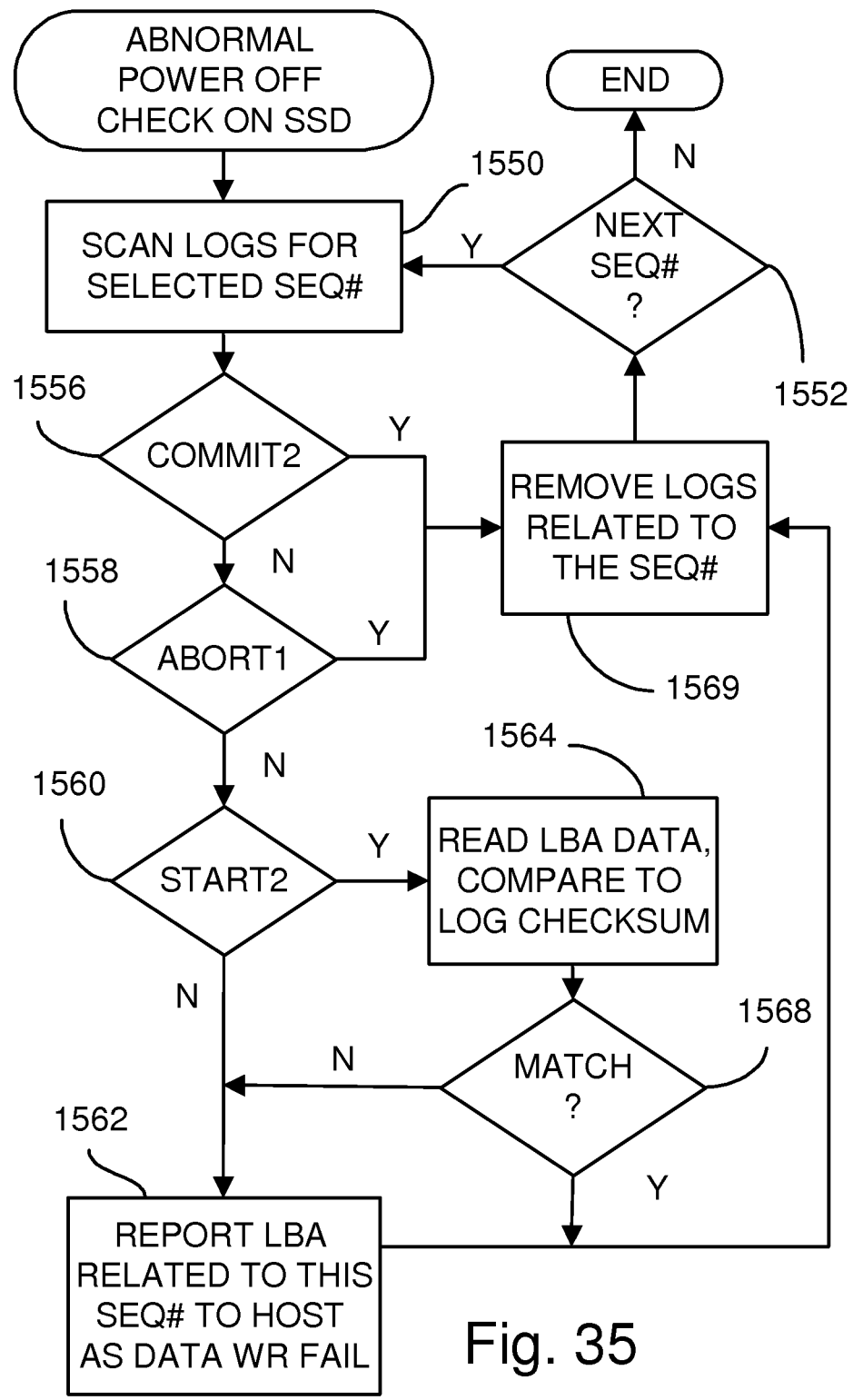
FIG. 35 shows an abnormal power off check performed on the SSD.

FIG. 35 shows an abnormal power off check performed on the SSD at the next power up. The logs are scanned for a selected sequence number, step 1550. When the commit2 flag, step 1556, or the abort1 flag, step 1558, are found, the logs related to this sequence number are removed, step 1569, and if additional sequence numbers remain, then another sequence number is selected, step 1552, and the process repeated.

When neither the commit2 nor the abort1 flags are found, steps 1556, 1558, but the start2 flag is found, step 1560, then the LBA data is read, and a checksum generated and compared to the logged checksum, step 1564. When the checksums match, step 1568, the logs related to this sequence number are removed, step 1569, since the data was been written correctly despite the abnormal power off.

When no checksum match occurs, step 1568, or the start2 flag is not found, step 1560, then the LBA related to this sequence is reported to the host as a failed data write during abnormal power off, step 1562. The logs related to this sequence number are removed, step 1569, and if additional sequence numbers remain, then another sequence number is selected, step 1552, and the process repeated.

FIG. 36 shows an abnormal power off check performed on the host at the next power up. The list of failed data writes and their LBA locations is received from the SSD (step 1562) and read, step 1580, and a failed LBA on the list is selected, step 1582. The transaction numbers in the log table is compared to the LBA to see if they are related, step 1584. When the LBA is not related, step 1586, another LBA on the list may be selected, step 1582. When the LBA is related, step 1586, and the commit flag is found, step 1588, then the transaction is redone. Each LBA in the write transaction logs is checked and updated with the new value recorded in the logs, step 1592. When the commit flag is not found, step 1588, then the transaction is undone. Each LBA in the write transaction logs is checked and updated with the old value recorded in the logs, step 1590. When more failed LBA's remain on the list, step 1594, then another LBA on the list may be selected, step 1582.

Alternate Embodiments

Several other embodiments are contemplated by the inventors. While moving a full meta-page to the SEED, SSD, or to flash has been described, a nearly full meta-page could also be moved before being completely full. Thus full may refer to being within some threshold of full, such as the meta-page size minus 512 bytes.

Many encodings of the data-type bits and other status fields, pointers, etc. are possible. The data-type status bits do not need to be the first bits in an entry. Entries could be linked to entries in other tables, such as having a separate table for tags or valid bits. Temporary files could have a variety of extensions, and new extensions could be added to the list to search for. Temporary files created by well-known programs such as word processors and internet browsers have well-known files extensions, but additional extensions may be added at any time. These additional file extensions could be added through firmware updates to the control software for SEED and SSD controllers, or by software updated to VMD application 180 and VMD driver 100.

The size of DRAM buffer used by each part of ETL may be fixed by the firmware of the SSD controller. The each part of ETL also can be dynamically adjusted by the controller firmware automatically or manually based on the usage or preference of the user. Due to the limited size of DRAM buffers, not all ETL functions may be accommodated in it at the same time. The various ETL functions may be adaptive to the real working environment. The controller may adjust the size used by each ETL to optimize the DRAM buffer. The adaptive adjustment can be done periodically based on the usage patterns of the device.

For a TLC flash device, the DRAM buffer can be substituted with NVRAM such as phase-change memory (PCM), ferroelectric random-access memory (FRAM), Magnetoresistive RAM (MRAM), Memristor, PRAM, Resistive RAM (RRAM), Racetrack memory, and nano RAM (NRAM) etc.

The advantage of NVRAM is that all the ETL supported tables etc. may remain in NVRAM (no need to put in the flash memory) and other flash memory destined data (such as data write cache etc.) is retained even with power off, so the backup power circuit is no longer needed even when power is turned off suddenly. A tmp etc. & mapping table, and read cache & mapping tables can be optionally discarded at the power down or at the next power up initialization. Other than MLC, the disadvantage of NVRAM is the cost. For MLC, the disadvantage is slow speed and limitations on write/erase times. The MLC can be derived from TLC by allocating part of TLC that only has strong pages programmed. Some of the ETL functions may be implemented in an SRAM in SEED 200.

In the TLC flash device, the DRAM buffer also can be substituted with combinations such as DRAM+SRAM, DRAM+MLC, DRAM+PCRAM or DRAM+MRAM. When combinations of DRAM buffering is used such as DRAM+MLC, the ETL supported functions are managed in DRAM but some of them are stored in MLC. Some of the data in the DRAM buffer can be discarded eventually such as temp. data and mapping tables, and read cache and mapping tables, that are not moved to MLC when power is off. Tables and data that need to be kept when power is off such as the block erase count table, the page Status table, S.M.A.R.T. data collector, etc. need to be stored to MLC when power is turned off suddenly. Copying to MLC is faster compared to TLC flash memory. In case of server applications, temp. data and mapping tables, and read cache and mapping tables cannot be discarded; those areas will be stored to MLC using power backup when power is turned off suddenly. Another way is to insure the data of interest in ETL of the DRAM is copied to the MLC. In case of a power off, a valid copy of data in ETL can be kept at MLC. At power up, the data in ETL can be loaded back to DRAM from MLC. The copying method can be modified by recording the minor differences, which will reduce the amount of copying data and therefore reduce the writes to MLC.

DRAM and MLC or DRAM and SLC do not necessary use different types of flash 196, 342 such as SLC, MLC, TLC, QLC, PLC, 3D NAND etc. Instead, the MLC can be derived from the TLC by allocating a part of the TLC that only has strong pages programmed. The SLC can be derived from MLC, TLC, QLC, PLC, etc. by allocating part of the MLC, TLC, QLC, PLC, etc. that only has strong pages programmed. For example, an Enhanced TLC Flash can be realized by a portion of TLC configured as SLC (with strong pages) using such as one quarter of the TLC used as SLC (strong page) and the reminder of TLC as TLC (weak page). Or a portion of TLC configured as MLC (strong page) and the reminder of TLC as TLC (weak page). Additionally, program/erase manager 41 (FIG. 14) may slow down page writing and block erasing time to help prolong the life of the oxide layer of cells of the flash. The slower page write/block erase time can be applied to the Enhanced TLC Flash to increase the endurance at the expense of decreased retention time. By using refresh manager 202, the retention time can be increased. Due to the Enhanced TLC Flash including SLC (strong page) and TLC (weak page) and with differing retention times, refresh manager 202 can track the usage of blocks as SLC (strong page) or TLC (weak page) and then adjust the refresh time accordingly. Alternatively, an enhanced TLC Flash can be realized by a portion of TLC configured as SLC (strong page) usage such as one quarter of TLC used as SLC (strong page). Similarly, MLC can be used as combination of SLC(strong page)/MLC(weak page) and QLC can be used as combinations such as SLC(strong page)/QLC(weak page), MLC(strong page)/QLC(strong page), TLC(strong page)/QLC(strong page), or any combination of SLC/MLC/TLC/QLC. Alternatively, MLC can be used as SLC (strong page), etc. The above functions also can be implemented in SEED 200.

The endurance technologies described herein attempt to solve the endurance issues of NAND flash memory. There are several non-volatile memories, such as MRAM, PCM, RRAM, Memristors, NRAM, etc. which are using competing technologies to replace NAND flash memory.

The super-endurance flash drive can be combined with a Hard Disk Drive (HDD), with a super-endurance flash drive as the cache and HDD as storage. The super-endurance flash drive is of high endurance and is a better fit as a cache. The overall performance may improve for this hybrid device. Another way to insure the data of interest in ETL of DRAM is copying to the HDD. In case of power off, a valid copy of data in ETL can be kept in HDD. At power up, those data in ETL can be loaded back to DRAM from HDD. The copying method can be modified by recording the minor differences which will reduce the amount of copying data and therefore reduce the writes to HDD.

The boot image of the OS can be preloaded to the DRAM buffer to speed up the host boot up. Once the boot up process ends, the DRAM buffer is released for later normal operation.

The dirty DRAM buffer must be written to flash memory when the host is in sleep or stand-by mode. The dirty DRAM buffer can be written to flash memory when the user of the host is logged out.

The grouping of write data is not limited to a page as a unit. Grouping data can be in a larger unit such as multiple-pages (meta-pages) and whole blocks, etc.

While categorization of the data-type of a host access has been described as comparing the logical address from the host to one or more address ranges, this compare may compared only a portion of the logical address to ranges that represent the address ranges. Data types could also be identified by parsing the host write data for certain formats, such as a FAT format or a FDB format. Earlier host writes in a sequence could also be checked for their data formats. The FAT file system has been used as an example. FDB/FAT are the meta data of the FAT file system. Other file systems such as LINUX, Apple OS, and Android etc., have their own meta data with different names but are equivalents.

Each block may be divided into multi-page zones. For example, a block may have 16 pages and 4 zones, with 4 pages per zone. Some of the mapping may be for zones rather than for individual pages or blocks in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid or multi-level mapping tables may also be used. Since the LBA ranges for the FAT1/2 are known, the table contents data type bits "100" can be omitted. The Mapping table can have a granularity of block or page.

Copying of blocks for relocation is less frequent with page mapping since the sequential-writing rules of the non-SLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. In another embodiment such as for data center applications, the paging and temporary files can be treated as normal user data to simplify the controller operation but with the expense of flash endurance. The endurance spare/swap area can provide extended over-provisioning by using a DRAM buffer as endurance spare/swap buffer instead of using flash memory. The compression function can be optionally turned off in situations when the host is already providing a compression function. In other embodiments, the controller can treat the paging file as user data file to simplify the controller function.

Many variations of the block diagrams are possible. A ROM such as an EEPROM could be connected to or part of a controller and be dedicated to storing firmware for a virtual storage processor. This firmware could also be stored in the main flash modules. The Host interface bus can be a Serial AT-Attachment (SATA) bus, a Peripheral Components Interconnect Express (PCIe) bus, a compact flash (CF) bus, or a Universal-Serial-Bus (USB), NVMe, a Firewire 1394 bus, a Fibre Channel (FC) bus, Thunderbolt, etc. Internal buses may use standards such as for a Serial AT-Attachment (SATA) bus, an integrated device electronics (IDE) bus, a Peripheral Components Interconnect Express (PCIe) bus, a compact flash (CF) bus, a Universal-Serial-Bus (USB), a Secure Digital (SD) bus, a Multi-Media Card (MMC) bus, a Firewire 1394 bus, a Fibre Channel (FC) bus, various Ethernet buses, etc. SCFD can include SLC or MLC flash only or can be combined SLC/MLC flash.

The flash memory may be embedded on a motherboard or SSD board or could be on separate modules. Capacitors, buffers, resistors, and other components may be added. The controller may be integrated on the motherboard or on a separate board or module. Flash memory can be integrated with the controller or with raw-NAND flash memory chips as a single-chip device or a plug-in module or board.

Using multiple levels of controllers, such as in a president-governor arrangement of controllers, the controllers in the SEED may be less complex than would be required for a single level of control for wear-leveling, bad-block management, re-mapping, caching, power management, etc. Less expensive hardware may be used in the controller, such as using an 8051 processor for a controller or a virtual storage processor or a transaction manager, rather than a more powerful processor core such as a an Advanced RISC Machine ARM-9 CPU core. For a certain applications, a more powerful processor is considered.

Different numbers and arrangements of flash storage blocks can connect to the SEED. Rather than use a LBA storage bus interface or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

A transaction manager, controllers, processes, and functions can be implemented in a variety of ways. Functions and processes can be programmed and executed by a CPU or other processor, or can be implemented in dedicated hardware, firmware, or in some combination. Many partitionings of the functions can be substituted. The SEED controller may be hardware, or may include firmware or software or combinations thereof.

Overall system reliability is greatly improved by employing Parity/ECC with multiple flash channels, and stripping data segments into a plurality of NVM blocks. For example, a ninth flash chip can be used with the flash memory interface. The Parity of the other eight flash chips is written to this ninth flash chip to provide extra protection of data in case one of the eight flash chips encounters a fatal read error. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the SEED can initiate a "Fault Recovery" or "Auto-Rebuild" process to insert a new flash module, and to recover or to rebuild the "Lost" or "Damaged" data. The overall system fault tolerance is significantly improved.

The flash cell's floating gate is programmed by injection of electrons into it. The flash memory controls the injection of electrons at page write so that it stays within two reference voltage levels. The NAND flash structure's bit-lines are connected to a string of 32 cells and each cell is also connected to 32 different word-lines. After a cell is written with data, any write and read to the adjacent cells will cause interference to the cell. The interference will either inject or remove electrons from the floating gate of the cell. A long period of time will also affect the number of electrons in the floating gate of the cell. Due to the changing of the quantity of electrons in the floating gate, the output voltage level will shift accordingly when read. If the output voltage level shifts across the reference voltage boundary, the read result will be wrong.

Wider or narrower data buses and flash-memory chips could be substituted, such as with 16 or 32-bit data channels. Alternate bus architectures with nested or segmented buses could be used internal or external to the SEED. Two or more internal buses can be used in the SEED to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The SEED can be integrated with other components or can be a stand-alone chip.

Additional pipeline or temporary buffers and FIFO's could be added. Separate page buffers could be provided in each channel. A clock source could be added.

A single package, a single chip, or a multi-chip package may contain one or more of the plurality of channels of flash memory and/or the SEED or SSD. The invention is not limited to the usage of SCFD. SCFD can be replaced with any kind of nonvolatile device with nonvolatile flash memory and a controller.

A MLC-based flash device may have four MLC flash chips with two parallel data channels, but different combinations may be used to form other flash modules, for example, four, eight or more data channels, or eight, sixteen or more MLC chips. The flash devices and channels may be in chains, branches, or arrays. For example, a branch of 4 flash devices could connect as a chain to the SEED. Other size aggregation or partition schemes may be used for different access of the memory.

The host can be a desktop PC motherboard or other PC platform such as a server, a Notebook, a Netbook, a tablet, a smart phone, a mobile communication device, a personal digital assistant (PDA), a digital camera, a production tool or tester, a combination device, or other device. The host bus or host-device interface can be SATA, PCIE, Thunderbolt, SD, USB, NVMe, eMMC, iSSD, or other host bus, while the internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi-Chip-Package (MCP) packages and may include raw-NAND flash memory chips or raw-NAND flash memory chips may be in separate flash chips, or other kinds of NVM flash memory such as toggle, ONFI, eMMC, iSSD, 3D NAND. SEED SSD may use eMMC with a RAID and eMMC may use a SEED structure. The internal bus may be fully or partially shared or may be separate buses. The SSD system may use a circuit board with other components such as LED indicators, capacitors, resistors, etc. Power management may be added at one or more levels. The SEED SSD can work with or without a VMD driver. A PCIe RAID DRAM cache card may incorporate a VMD driver and multiple SEED structured SSD's.

Directional terms such as upper, lower, up, down, top, bottom, etc. are relative and changeable as the system or data is rotated, flipped over, etc. These terms are useful for describing the device but are not intended to be absolutes.

NVM flash memory may be on a flash module that may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use a controller only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The size of data such as sectors, pages, and blocks may vary. A sector may have 512 bytes, a page may have 16 sectors, and a block may have 128 pages as one of many examples.

The write data in the ETL alternatively can be packed and logged one-by-one to the data write cache as a page unit by the flash controller. The packed data size from the host can be either a large size such as more than a meta-page unit or a small size such as less than a sector. A header is added the show the relation of the data to the LBA from host. A separate packed table maps the LBA from the host to the offset location of the data and header in the meta-page unit of the data write cache. The data write cache can have a capacity of more than two meta-page units in size. When the data write cache is full or an elapsed time is reached, a selected meta-page unit will be moved to the flash memory from the data write cache. The packed table maps the LBA from the host to the offset location of the data and header in the meta-page unit of the flash memory. In the case of overwriting old data from host, if the packed data is still in the data write cache, the old data can be discarded by moving the packed data up and appending the new updated data into the data write cache and updating the packed table. Otherwise, if the packed data is in the flash memory, the new and old data will be compared and a delta data will be generated to show the difference. The delta data and its header will be appended to the data write cache. The new header will also include the previous old data location. The packed table will map the LBA to the delta data position.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A Super Enhanced Endurance Device (SEED) Solid-State Drive (SSD) Endurance Translation Layer (ETL) method to increase endurance of a flash memory having a specified erase-cycle lifetime comprising:
    creating an ETL in a dynamic-random-access memory (DRAM) buffer that is controlled by a controller and using the ETL to provide temporary storage to reduce flash wear;
    creating a spare/swap area in the DRAM buffer;
    operating a controller to use the spare/swap area in the DRAM buffer to merge valid data in a flash memory with new data to generate combined data;
    when over-writing a full page or a partial page of an existing block in the flash memory, writing new data to a spare block in the DRAM buffer related to the existing block in the flash memory, and when the spare block is needed by additional new data for a different block in the flash memory, writing a combination of the spare block with the new data and data from the existing block in the flash memory into a swap block in the flash memory and marking a page status as a garbage page for all pages of the existing block in the flash memory; and
    using a backup power supply to power the DRAM buffer and the flash memory and the controller when power is lost, the backup power supply having a sufficient capacity for the controller to copy desired data in the ETL to the flash memory,
    whereby a spare/swap function is performed by the controller using the DRAM buffer rather than the flash memory;
    tracking bad pages of the flash memory by performing a routine comprising:
    when an erased block in the flash memory has been erased, increasing an erase count in an erase count table for the erased block;
    reading a page status table for the erased block, the page status table having a plurality of page entries, each page entry storing a status for a page in the erased block, the status including an indication of a bad page or of a good page;
    for each page in the erased block, reading the page entry for the page from the page status table;
    when the page status from the page status table is bad, processing a next page;
    when the page status from the page status table is good, counting a number of un-erased bits in the page;
    when the number of un-erased bits exceeds a first threshold, changing the page status to indicate a bad page in the page entry and increasing a bad page count;
    when the number of un-erased bits is between a first threshold and a second threshold, and the page status from the page status table indicates that error-correction code (ECC) protection is needed, processing a next page;
    when the number of un-erased bits is between a first threshold and a second threshold, and the page status from the page status table indicates that ECC protection is not needed, changing the page status in the page entry to indicate that ECC protection is needed by marking its page status as protect page and increasing an ECC protection page count;
    when the bad page count for the erased block exceeds a third threshold, indicating that the erased block is a bad block and not writing new data to the erased block by marking its page status as bad page, whereby bad erased blocks are identified by counting bad pages within the erased block and allowing bad pages to exist in a good block to prolong flash endurance.

2. A Super Enhanced Endurance Device (SEED) comprising:
   a host interface for receiving host reads and host writes from a host;
   a SEED dynamic-random-access memory (DRAM) buffer for storing data;
   a flash memory for storing grouped meta pages from the SSD DRAM buffer;
   a controller for controlling access to the flash memory and to the DRAM buffer in response to host reads and host writes received by the host interface, the controller writing host data to the DRAM buffer;
   an SEED Solid-State Drive (SSD) Endurance Translation Layer (ETL) implemented in the DRAM buffer and controlled by the controller that uses the ETL to provide temporary storage to reduce flash wear;
   a data write cache stored in the DRAM buffer and managed by the controller;
   a flash interface for erasing blocks and writing pages in the flash memory, wherein a block is a multiple of pages in size;
   using a backup power supply to power the DRAM buffer and the flash memory and the controller when power is lost, the backup power supply having a sufficient capacity for the controller to copy desired data in the ETL to the flash memory;
   a bad page manager for tracking bad pages of the flash memory,
   the bad page manager for performing a routine comprising:
   when an erased block in the flash memory has been erased, increasing an erase count in an erase count table for the erased block;
   reading a page status table for the erased block, the page status table having a plurality of page entries, each page entry storing a status for a page in the erased block, the status including an indication of a bad page or of a good page;
   for each page in the erased block, reading the page entry for the page from the page status table;
   when the page status from the page status table is bad, processing a next page;
   when the page status from the page status table is good, counting a number of un-erased bits in the page;
   when the number of un-erased bits exceeds a first threshold, changing the page status to indicate a bad page in the page entry and increasing a bad page count;
   when the number of un-erased bits is between a first threshold and a second threshold, and the page status from the page status table indicates that error-correction code (ECC) protection is needed, processing a next page;
   when the number of un-erased bits is between a first threshold and a second threshold, and the page status from the page status table indicates that ECC protection is not needed, changing the page status in the page entry to indicate that ECC protection is needed by marking its page status as protect page and increasing an ECC protection page count;
   when the bad page count for the erased block exceeds a third threshold, indicating that the erased block is a bad block and not writing new data to the erased block by marking its page status as bad page,
   whereby bad erased blocks are identified by counting bad pages within the erased block and allowing bad pages to exist in a good block to prolong flash endurance.

3. The SEED of claim 2 further comprising:
   a spare/swap area in the DRAM buffer;
   a controller that uses the spare/swap area in the DRAM buffer to merge valid data in the flash memory with new data to generate combined data when over-writing a full page or a partial page of an existing block in the flash memory by writing new data to a spare block in the DRAM buffer related to the existing block in the flash memory, and when the spare block is needed by additional new data for a different block in the flash memory, writing a combination of the spare block with the new data and data from the existing block in the flash memory into a swap block in the flash memory and marking a page status for pages of the existing block in the flash memory as a garbage page.

4. The SEED of claim 2 further comprising:
   an ECC generator that generates an ECC code having more bits per unit of data stored in the flash memory for pages having a lower reliability; and
   a LDPC generator, activated by an ECC manager, for generating a Low-Density parity Check (LDPC) code for data having a high reliability in the flash memory;
   whereby ECC code is dynamic.

* * * * *